(12) United States Patent
Bier

(10) Patent No.: US 12,167,559 B2
(45) Date of Patent: *Dec. 10, 2024

(54) SPLIT DOOR SUBMERSIBLE NETWORK PROTECTOR HOUSINGS FOR ELECTRICAL DISTRIBUTION SYSTEMS

(71) Applicant: Richards Mfg. Co., Irvington, NJ (US)

(72) Inventor: Bruce Bier, Warren, NJ (US)

(73) Assignee: Richards Mfg. Co., Irvington, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/364,307

(22) Filed: Aug. 2, 2023

(65) Prior Publication Data

US 2023/0380092 A1    Nov. 23, 2023

Related U.S. Application Data

(63) Continuation of application No. 17/508,823, filed on Oct. 22, 2021, now Pat. No. 11,723,166, which is a continuation of application No. 16/006,431, filed on Jun. 12, 2018, now Pat. No. 11,160,182, which is a continuation of application No. 15/813,797, filed on Nov. 15, 2017, now Pat. No. 10,004,155.

(60) Provisional application No. 62/462,710, filed on Feb. 23, 2017, provisional application No. 62/452,752, filed on Jan. 31, 2017.

(51) Int. Cl.
| | |
|---|---|
| *H05K 5/06* | (2006.01) |
| *H02B 1/28* | (2006.01) |
| *H02B 1/32* | (2006.01) |
| *H02B 1/38* | (2006.01) |
| *H02B 1/56* | (2006.01) |
| *H02B 7/06* | (2006.01) |

(52) U.S. Cl.
CPC .............. *H05K 5/061* (2013.01); *H02B 1/28* (2013.01); *H02B 1/32* (2013.01); *H02B 1/38* (2013.01); *H02B 1/565* (2013.01); *H02B 7/06* (2013.01); *H05K 5/069* (2013.01)

(58) Field of Classification Search
None
See application file for complete search history.

(56) References Cited

U.S. PATENT DOCUMENTS

| | | |
|---|---|---|
| 2,774,621 A | 12/1956 | Kilbourne, Jr. |
| RE24,478 E | 5/1958 | Kilbourne, Jr. |

(Continued)

*Primary Examiner* — Krystal Robinson
(74) *Attorney, Agent, or Firm* — Nixon Peabody LLP

(57) ABSTRACT

A split door submersible housing for an electrical distribution system includes a cabinet body defining an interior region configured to accept a component of the electrical distribution system, and a first door and a second door positioned side by side to cover an open front portion of the cabinet body. The cabinet body includes at least one opening configured to accept an electrode sealed with and electrically isolated from the cabinet body and extending through the cabinet body to establish electrical connection between a corresponding terminal of the component and an electrical distribution network. A gasket system is provided, which comprises a first gasket configured to fit on the first door and a second gasket configured to fit on the second door. The gasket system seals the first door and the second door against each other and against a corresponding surface on the cabinet body, when the first and second doors are closed and locked, so that the housing is water tight.

20 Claims, 47 Drawing Sheets

(56) References Cited

U.S. PATENT DOCUMENTS

| | | |
|---|---|---|
| 3,054,975 A | 9/1962 | Barr |
| 4,944,876 A | 7/1990 | Miller |
| 5,216,840 A | 6/1993 | Andrews |
| 5,465,528 A | 11/1995 | Schinzel |
| 6,396,990 B1 | 5/2002 | Ehn |
| 6,603,660 B1 | 8/2003 | Ehn |
| 6,979,775 B2 | 12/2005 | Ritter |
| 7,978,463 B1 * | 7/2011 | Haun .................. E04H 5/02 361/679.01 |
| 8,083,320 B2 | 12/2011 | Yoshida |
| 9,255,712 B2 | 2/2016 | Yantis |
| 9,379,526 B2 | 6/2016 | Bier |
| 10,004,155 B1 | 6/2018 | Bier |
| 2015/0282363 A1 * | 10/2015 | Bier .................. H02B 1/38 174/541 |
| 2016/0234953 A1 | 8/2016 | Ellingson |

\* cited by examiner

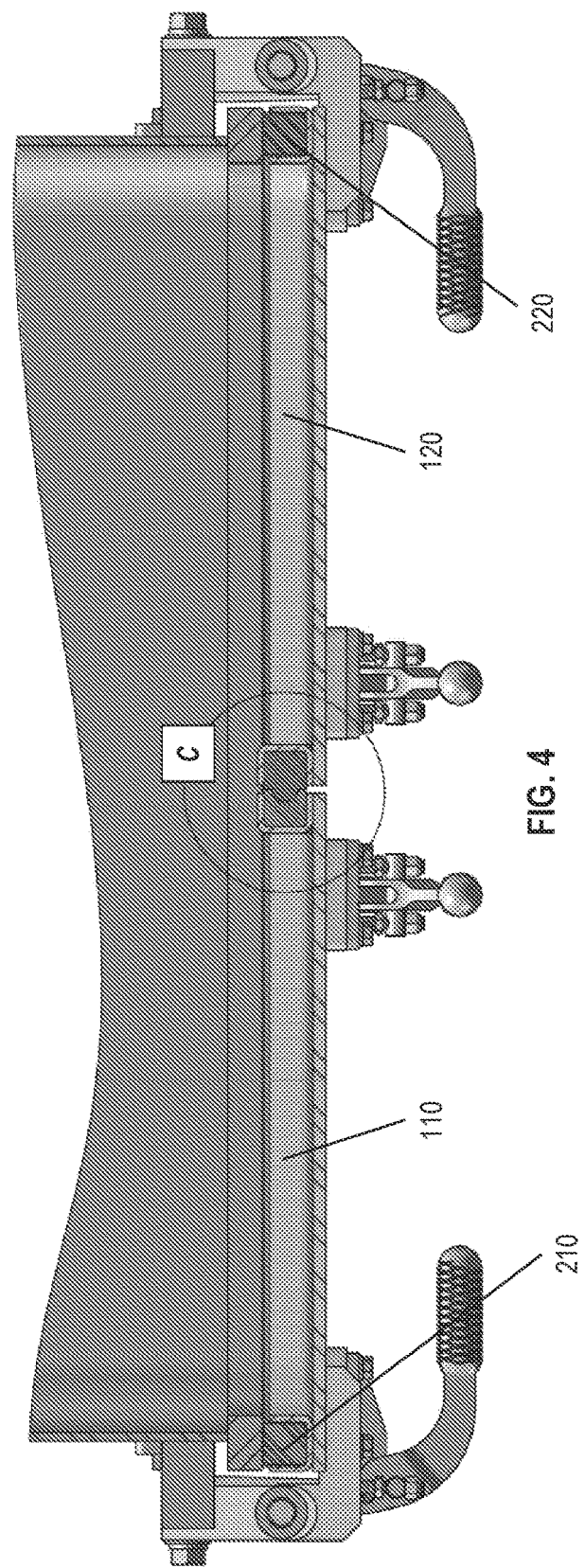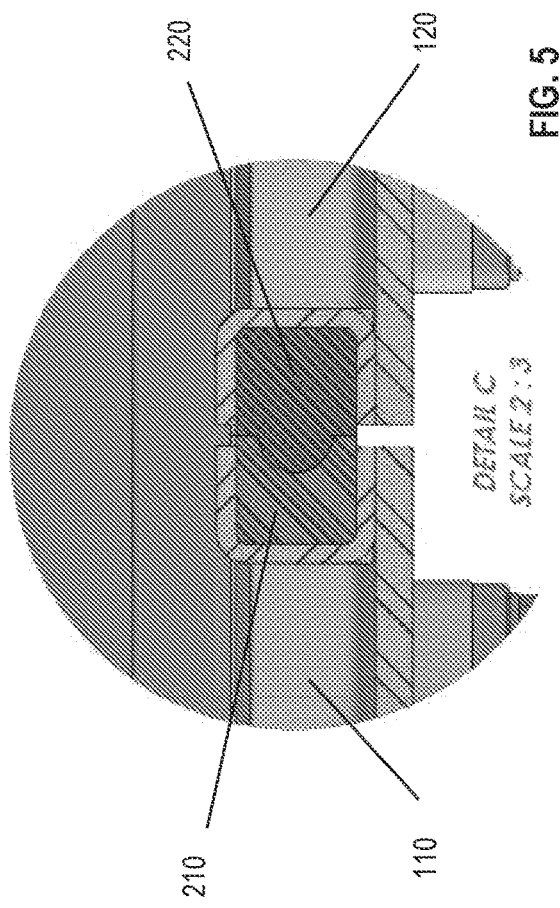

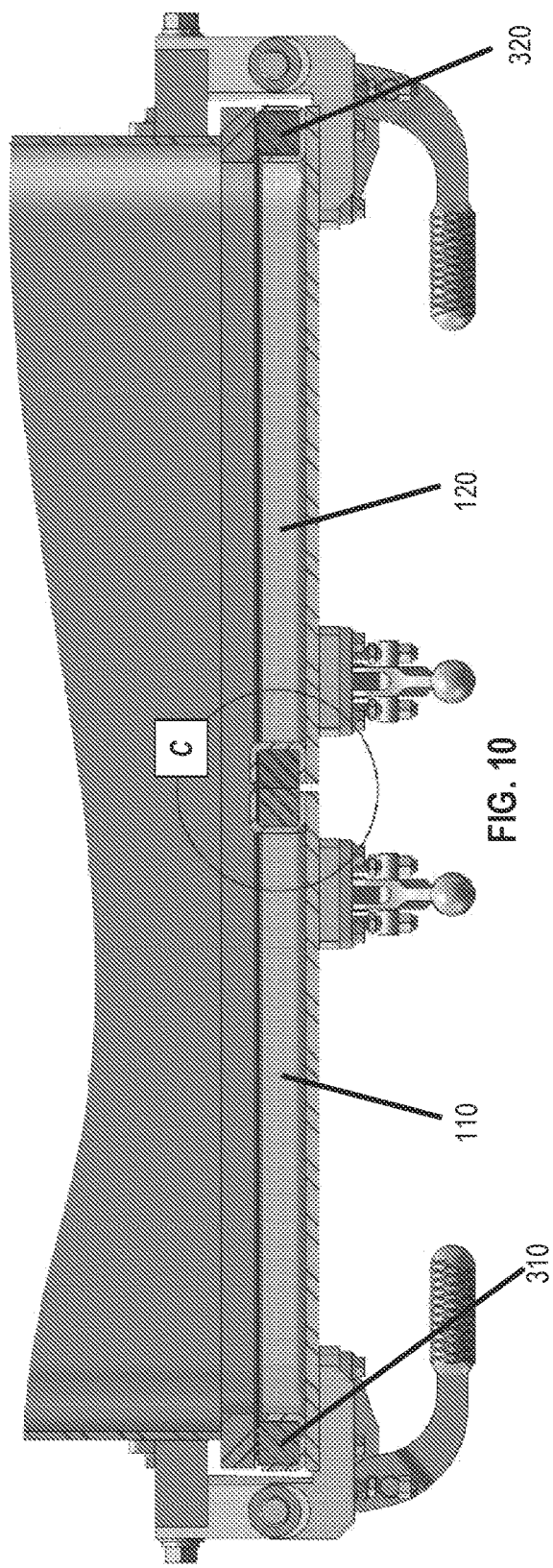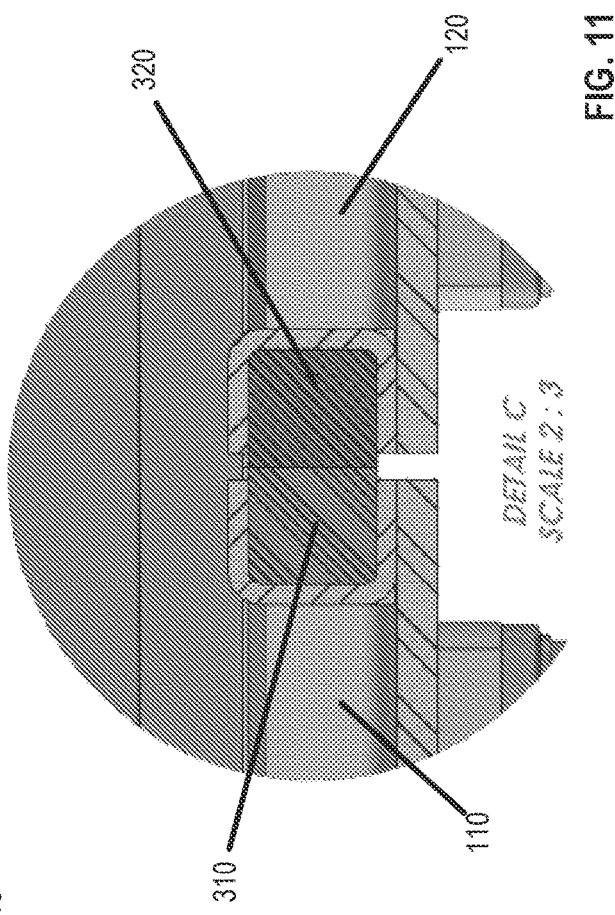

DETAIL C
SCALE 2 : 3

DETAIL C
SCALE 2:3

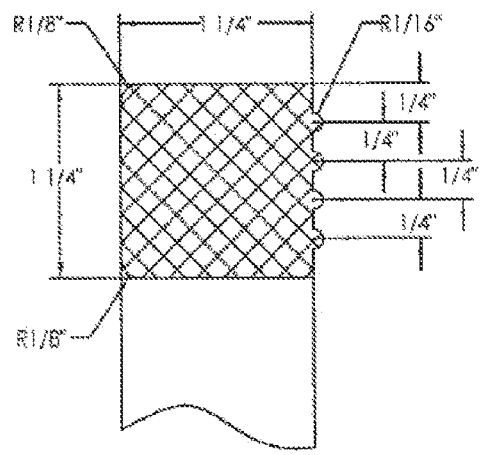
SECTION A-A
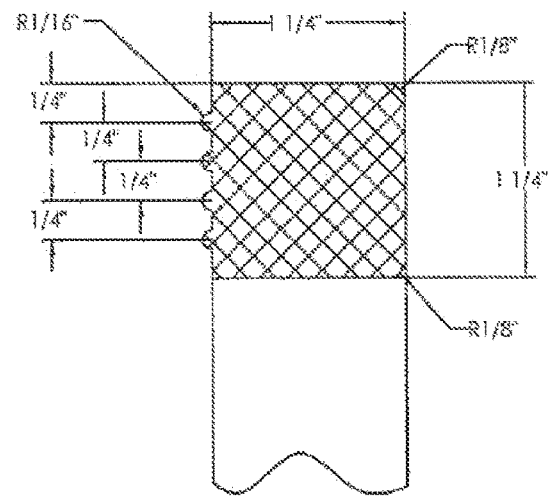
SECTION F-F
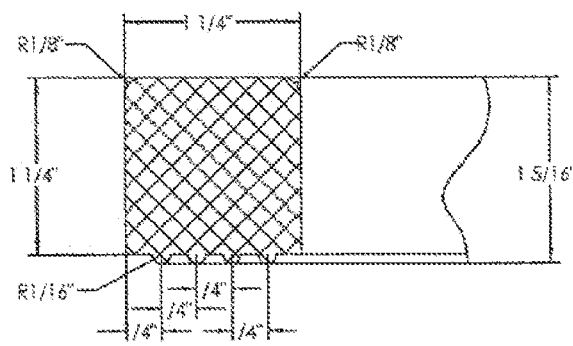
SECTION B-B
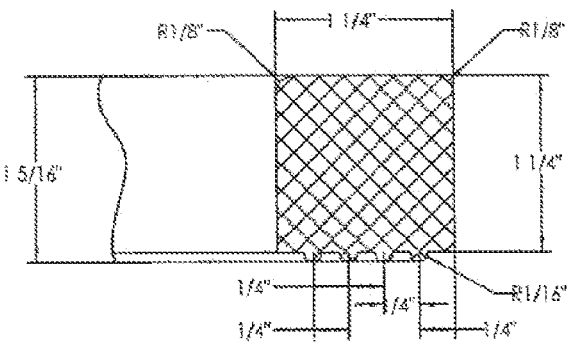
SECTION E-E
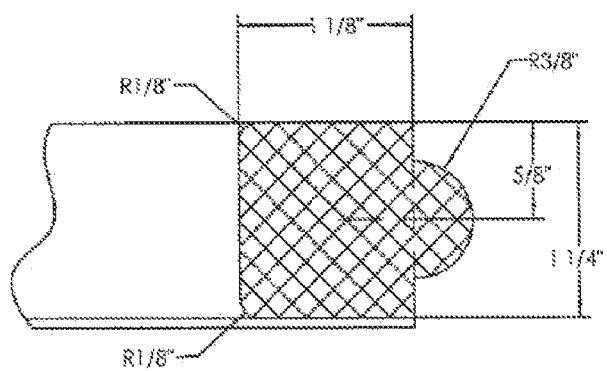
SECTION C-C
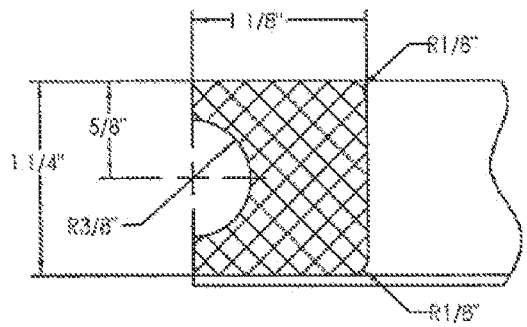
SECTION D-D
FIG. 57

SPLIT DOOR SUBMERSIBLE NETWORK PROTECTOR HOUSINGS FOR ELECTRICAL DISTRIBUTION SYSTEMS

RELATED APPLICATIONS

This application is a continuation of U.S. application Ser. No. 17/508,823, filed on Oct. 22, 2021, now allowed, which is a continuation of U.S. application Ser. No. 16/006,431, filed on Jun. 12, 2018, now issued as U.S. Pat. No. 11,160, 182, which is a continuation of U.S. application Ser. No. 15/813,797, filed on Nov. 15, 2017, now issued as U.S. Pat. No. 10,004,155, which claims priority to and the benefit of U.S. Provisional Application No. 62/462,710, filed Feb. 23, 2017, and U.S. Provisional Application No. 62/452,752, filed Jan. 31, 2017, each of which is incorporated herein by reference in its entirety.

STATEMENT REGARDING PRIOR DISCLOSURES BY THE INVENTOR OR A JOINT INVENTOR UNDER 37 C.F.R. 1.77(b)(6)

A prior enclosure for a network protector in an electrical distribution system was disclosed in U.S. application Ser. No. 14/667,050, filed Mar. 24, 2015, which was published as U.S. Publication No. US 2015/0282363 on Oct. 1, 2015, and issued as U.S. Pat. No. 9,379,526 on Jun. 28, 2016. Bruce Bier, the sole inventor of the subject matter disclosed and claimed in the present application, also invented the subject matter disclosed and claimed in U.S. Pat. No. 9,379,526. Mantas Jarasunas and Joseph Bier were working under Bruce Bier's direction and were not involved in the conception of the subject matter disclosed and claimed in U.S. Pat. No. 9,379,526.

BACKGROUND

A network protector is a heavy duty switch designed to open and close under specific conditions within an electrical distribution system. These conditions are defined by industry standards. The operating voltage for a network protector is generally up to 600 Volts and is connected to the secondary (low voltage) side of a distribution transformer.

The overwhelming majority of network protectors are installed in underground (sub-surface) structures. A typical underground structure has interior dimensions of about eight feet (96 inches) by about ten feet (120 inches). In most cases, the network protectors are installed in sealed metal enclosures designed to be submerged. As such, these enclosures are referred to as "submersible network protector housings."

SUMMARY

The present invention generally relates to electrical distribution systems. In particular, the present invention relates to an enclosure for use within an electrical distribution system. The enclosure is configured to contain a component of the electrical distribution system, such as a network protector, and to prevent ingress of water into the enclosure.

In preferred embodiments, the invention provides split door submersible network protector housings comprising a cabinet body with a split door configuration covering a front portion thereof. A gasket system is provided, which comprises a first gasket configured to fit on the first door and a second gasket configured to fit on the second door. The gasket system seals the first door and the second door against each other and against a corresponding surface on the cabinet body, when the first and second doors are closed and locked, so that the housing is water tight.

In some embodiments, the invention provides split door submersible housing for an electrical distribution system, the housing comprising: a cabinet body defining an interior region configured to accept a component of the electrical distribution system, the cabinet body including at least one opening configured to accept an electrode sealed with and electrically isolated from the cabinet body and extending through the cabinet body to establish electrical connection between a corresponding terminal of the component and an electrical distribution network; a first door and a second door positioned side by side to cover an open front portion of the cabinet body, at least one of the first door and the second door pivotably and electrically connected to a side of the cabinet body; and a gasket system comprising a first gasket on the first door and a second gasket on the second door, wherein the gasket system is configured to seal the first door and the second door against each other and against a corresponding surface on the cabinet body, when the first and second doors are in a closed position, wherein when the first and second doors are in the closed position, the housing is capable of preventing ingress of water into the interior region when submersed.

In some embodiments, the housing further comprises a locking mechanism to lock the first and second doors in the closed position.

In some embodiments, the locking mechanism comprises a plurality of quick-release latching mechanisms disposed between the first door and the cabinet body and disposed between the second door and the cabinet body.

In some embodiments, the locking mechanism comprises at least one quick-release latching mechanism disposed between the first door and the second door.

In some embodiments, an exterior surface of the cabinet body comprises a plurality of radiating fins.

In some embodiments, an interior surface of the cabinet body comprises a plurality of fins thermally coupled to the radiating tins.

In some embodiments, the component is a network protector.

In some embodiments, the cabinet body includes at least three openings configured to accept at least three electrodes sealed with and electrically isolated from both the cabinet body and each other and extending through the cabinet body to establish electrical connections between corresponding terminals of the network protector and the electrical distribution network.

In some embodiments, when the first and second doors are in the closed position, the housing is capable of preventing ingress of water into the interior region at a water depth of twenty-five feet.

In some embodiments, the first door and the second door are pivotably and electrically connected to opposite sides of the cabinet body.

In some embodiments, the first door is pivotably and electrically connected to a side of the cabinet body and the second door is pivotably and electrically connected to the first door.

In some embodiments, the first gasket and the second gasket are made from a nitrile rubber.

In some embodiments, the first gasket and the second gasket include raised ridges on the portions that seal against the cabinet body.

In some embodiments, the first gasket and the second gasket extend around the perimeter of the first and second doors and have conformal shapes on their distal edge surfaces.

In some embodiments, the first gasket and the second gasket extend around the perimeter of the first and second doors and have substantially flat distal edge surfaces.

In some embodiments, the first gasket and the second gasket extend around the perimeter of the first and second doors and have rounded distal edge surfaces with extended upper and lower ends having substantially flat surfaces.

In some embodiments, the first gasket extends around the perimeter of the first door and has a substantially flat distal edge surface, and the second gasket is a three-sided gasket extending around the top, proximal side, and bottom of the second door and having indented upper and lower distal edges having substantially flat surfaces.

In some embodiments, the first gasket extends around the perimeter of the first door and has a rounded distal edge surface with extended upper and lower ends having substantially flat surfaces, and the second gasket is a three-sided gasket extending around the top, proximal side, and bottom of the second door and having indented upper and lower distal edges having substantially flat surfaces.

In some embodiments, a top exterior surface of the cabinet body comprises a plurality of steel stiffeners.

In some embodiments, exterior and/or interior surfaces of the first and second doors comprise a plurality of steel stiffeners.

In some embodiments, the first door includes a tab to guide the first door and the second door together into the closed position.

In some embodiments, when the first and second doors with the first and second gaskets positioned thereon are in the closed position, the housing is capable of preventing ingress of water into the interior region at a water depth of twenty-five feet.

In some embodiments, the invention provides a gasket system configured for use with a split door submersible housing for an electrical distribution system, the housing comprising a cabinet body defining an interior region configured to accept a component of the electrical distribution system, and a first door and a second door positioned side by side to cover an open front portion of the cabinet body, the gasket system comprising: a first gasket configured to fit on the first door; and a second gasket configured to fit on the second door, wherein the gasket system is configured to seal the first door and the second door against each other and against a corresponding surface on the cabinet body, when the first and second doors are in a closed position, and wherein when the first and second doors with the first and second gaskets positioned thereon are in the closed position, the housing is capable of preventing ingress of water into the interior region when submersed.

In some embodiments, the first gasket and the second gasket are made from a nitrile rubber.

In some embodiments, the first gasket and the second gasket include raised ridges on the portions that seal against the cabinet body.

In some embodiments, the first gasket and the second gasket extend around the perimeter of the first and second doors and have conformal shapes on their distal edge surfaces.

In some embodiments, the first gasket and the second gasket extend around the perimeter of the first and second doors and have substantially flat distal edge surfaces.

In some embodiments, the first gasket and the second gasket extend around the perimeter of the first and second doors and have rounded distal edge surfaces with extended upper and lower ends having substantially flat surfaces.

In some embodiments, the first gasket extends around the perimeter of the first door and has a substantially flat distal edge surface, and the second gasket is a three-sided gasket extending around the top, proximal side, and bottom of the second door and having indented upper and lower distal edges having substantially flat surfaces.

In some embodiments, the first gasket extends around the perimeter of the first door and has a rounded distal edge surface with extended upper and lower ends having substantially flat surfaces, and the second gasket is a three-sided gasket extending around the top, proximal side, and bottom of the second door and having indented upper and lower distal edges having substantially flat surfaces.

Additional features and advantages of the present invention are described further below. This summary section is meant merely to illustrate certain features of the invention, and is not meant to limit the scope of the invention in any way. The failure to discuss a specific feature or embodiment of the invention, or the inclusion of one or more features in this summary section, should not be construed to limit the invention as claimed.

BRIEF DESCRIPTION OF THE DI WINGS

The foregoing summary, as well as the following detailed description of the preferred embodiments of the application, will be better understood when read in conjunction with the appended drawings. For the purposes of illustrating the systems and methods of the present application, there are shown in the drawings preferred embodiments. It should be understood, however, that the application is not limited to the precise arrangements and instrumentalities shown. In the drawings:

FIG. 4 is a sectional view along A-A of FIG. 3 showing a first embodiment gasket system for the housing of FIG. 1;

FIG. 5 is a detail view of area C of FIG. 4;

FIG. 10 is a sectional view along A-A of FIG. 3 showing a second embodiment gasket system for the housing of FIG. 1;

FIG. 11 is a detail view of area C of FIG. 10;

FIG. 57 shows sectional views along A-A through F-F of FIG. 56;

DETAILED DESCRIPTION

Figure 1:
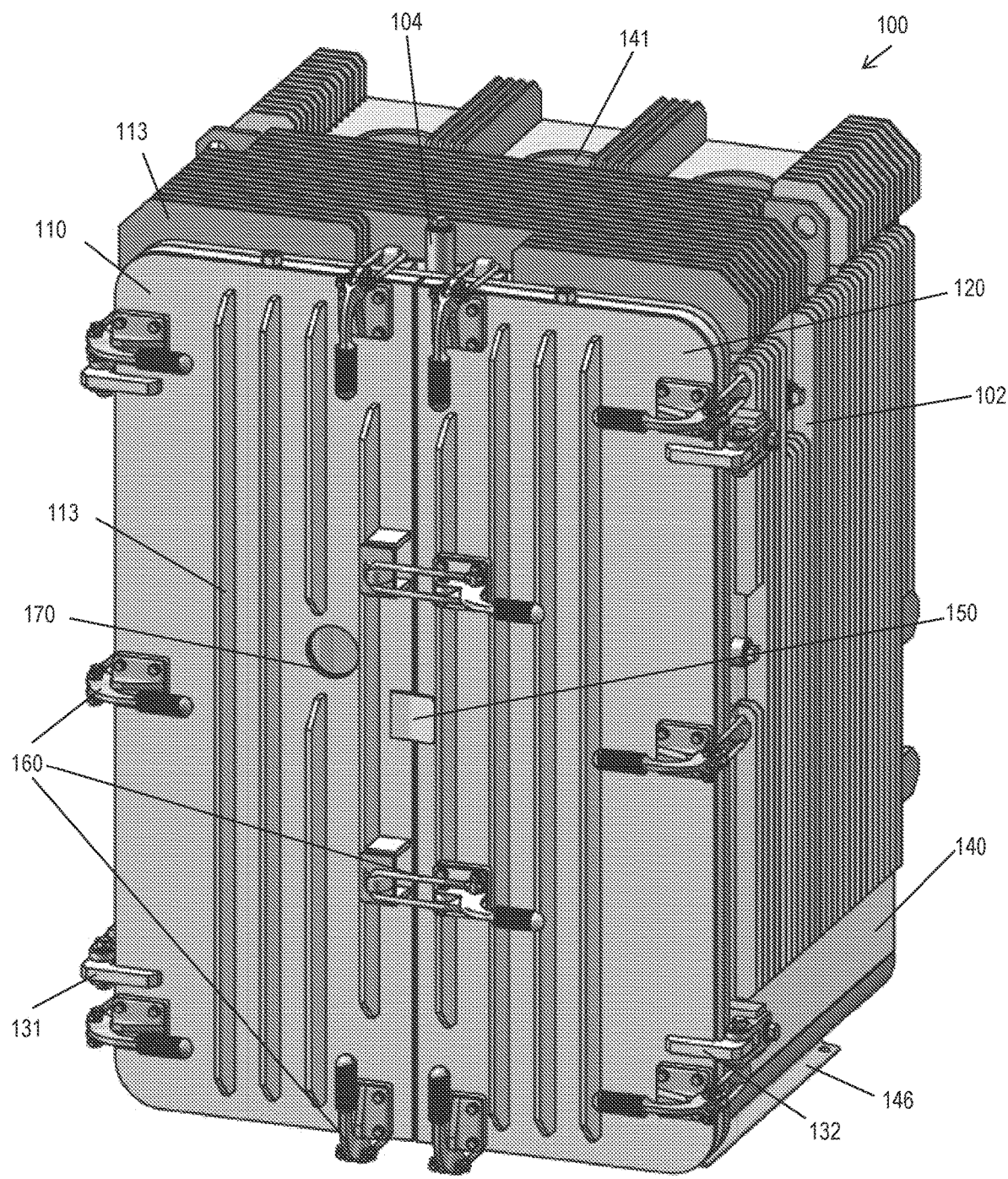
FIG. 1 is perspective view of a first exemplary split door submersible housing with the doors closed, according to some embodiments of the invention.
Figure 2:
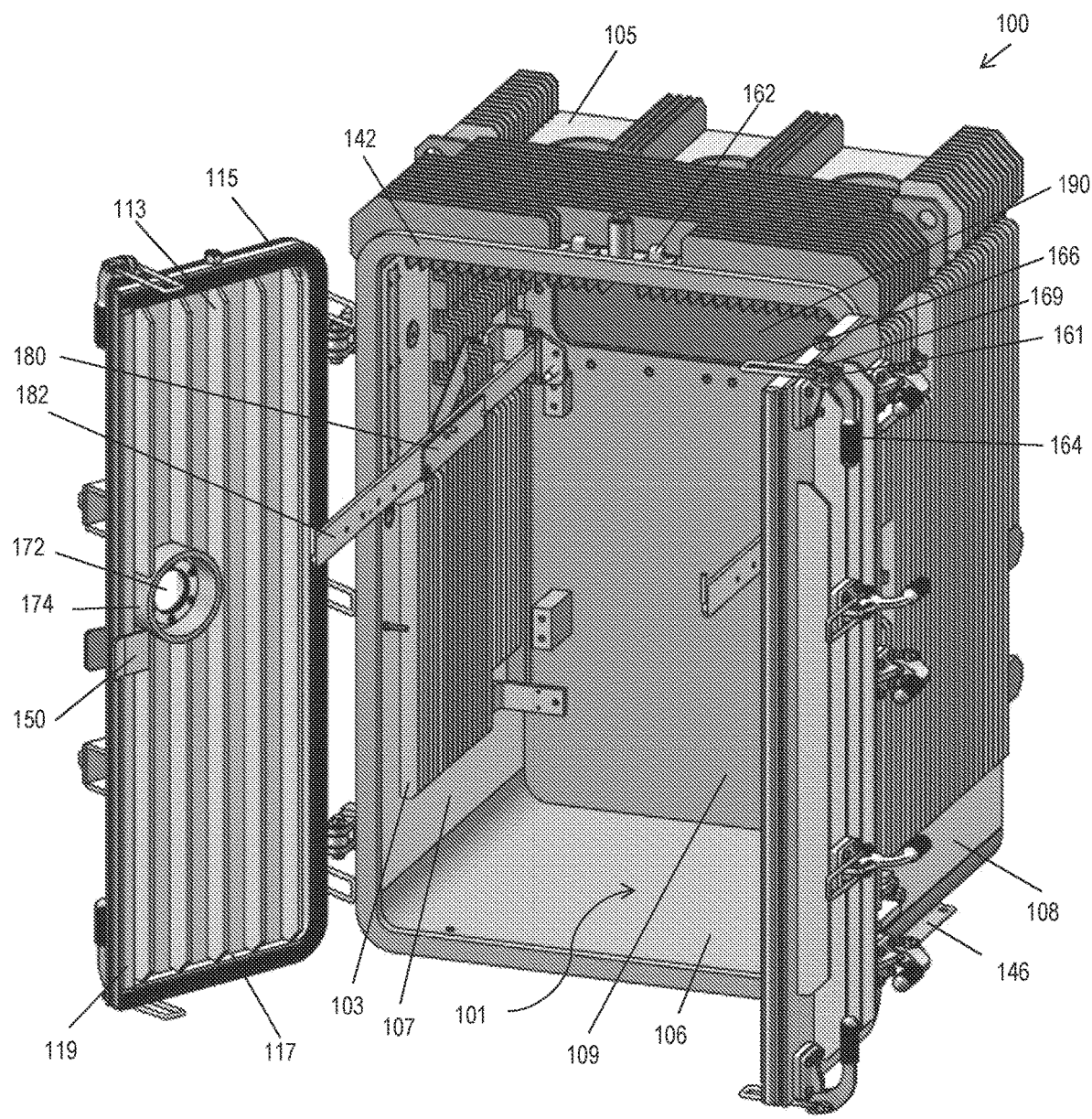
FIG. 2 is perspective view of the housing of FIG. 1 with the doors open, according to some embodiments of the invention.
Figure 3:
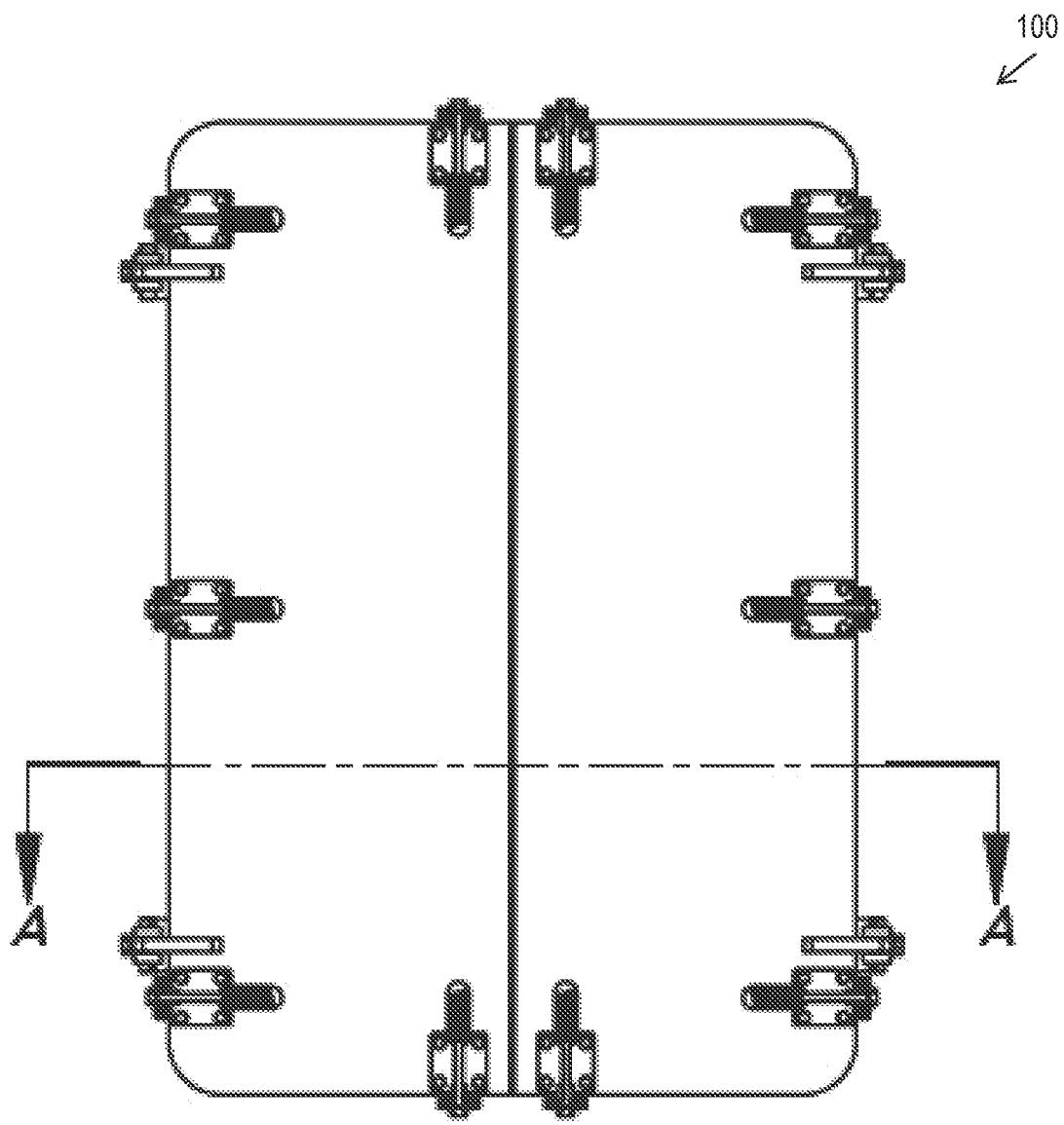
FIG. 3 is a schematic front view of the housing of FIG. 1.
Figure 6:
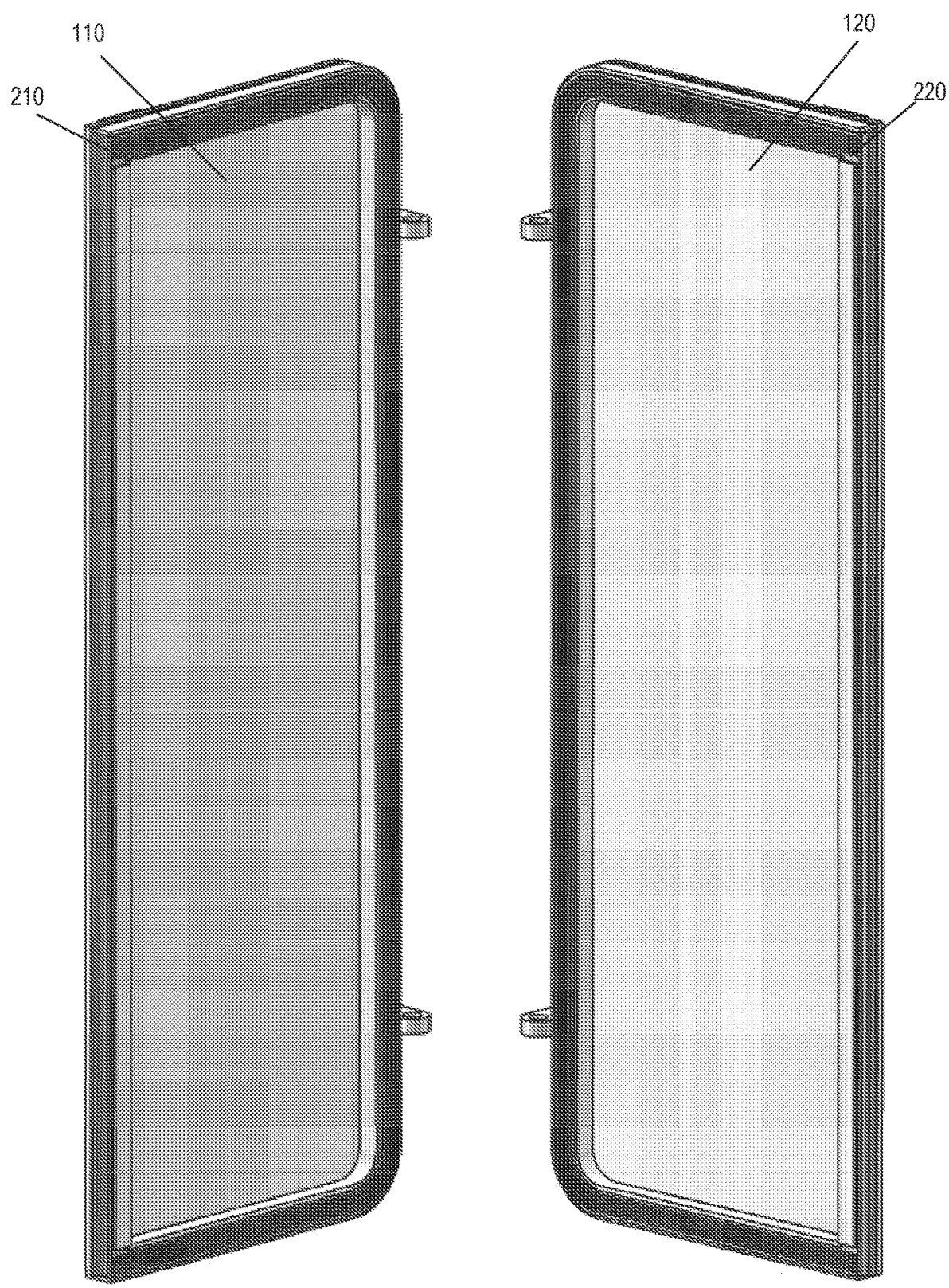
FIG. 6 is a perspective view of the insides of the first and second doors with the first embodiment gasket system installed thereon, showing the doors open and detached from the cabinet body.
Figure 7:
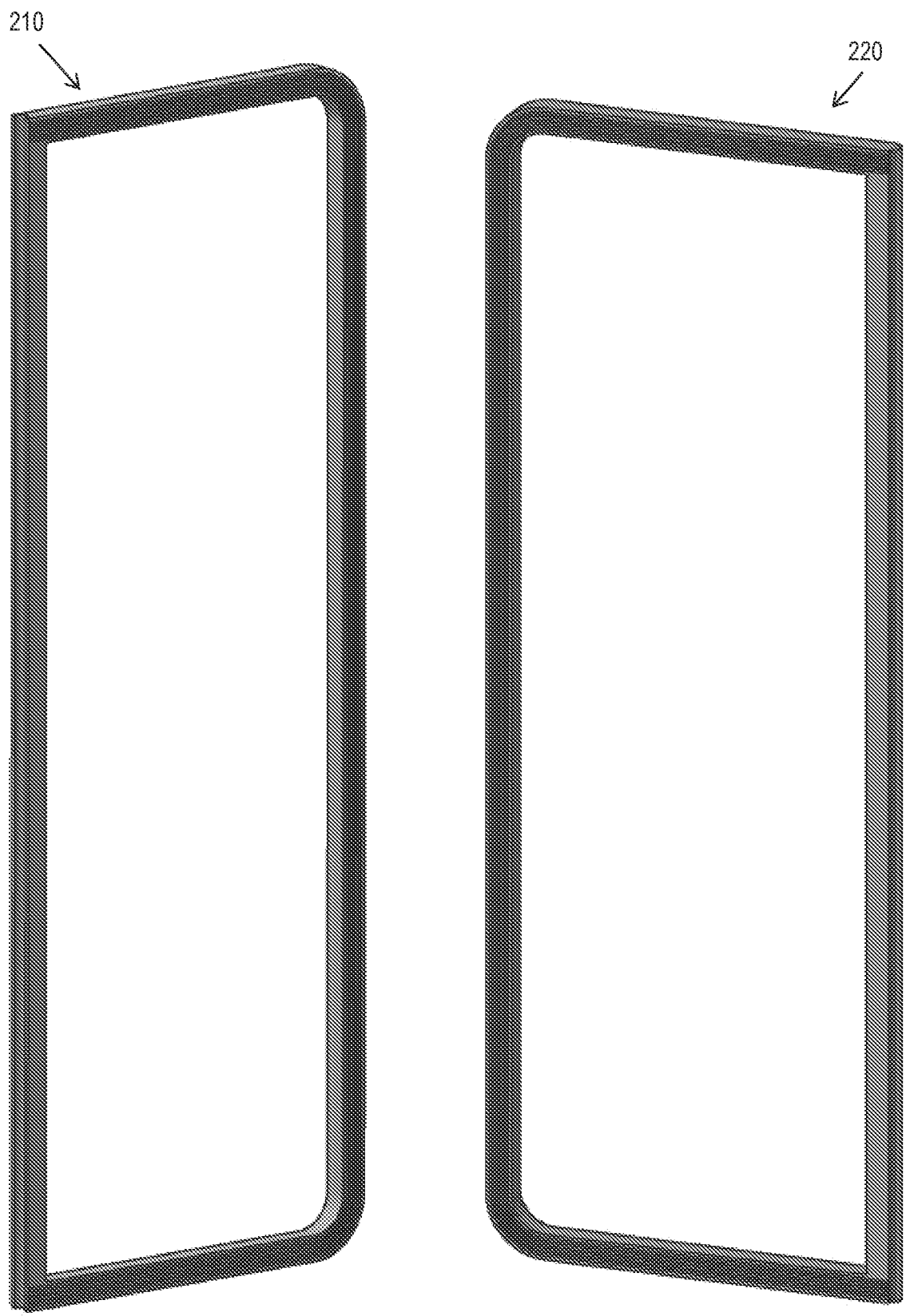
FIG. 7 is a perspective view of the first embodiment gasket system, without the doors.
Figure 8:
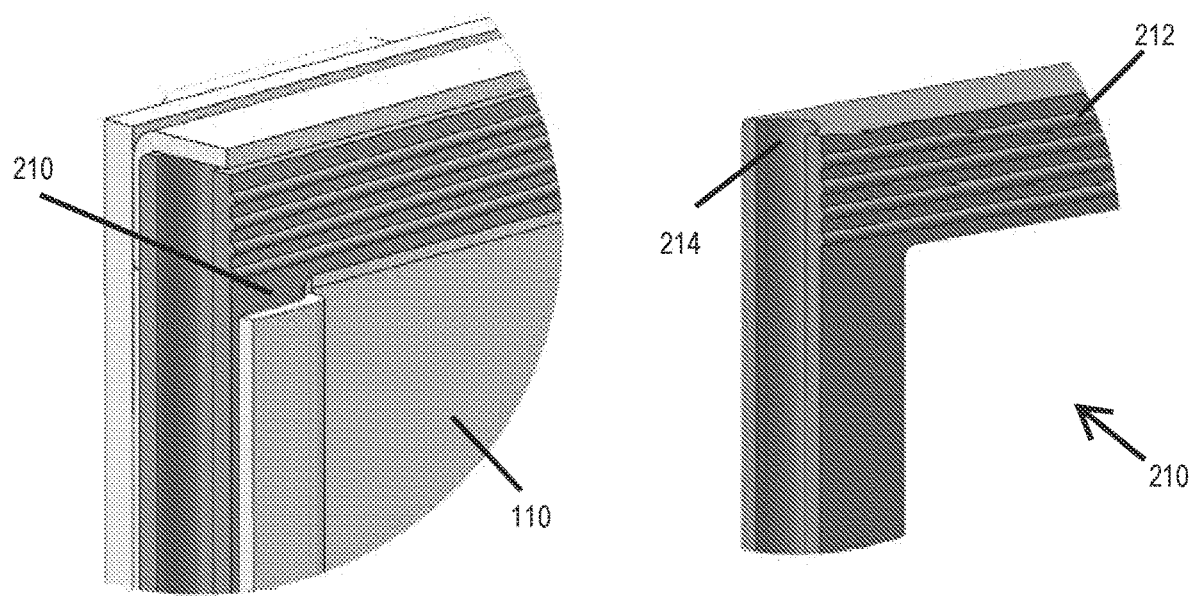
FIG. 8 is a detailed perspective view of the first embodiment gasket system with and without the first door, showing the upper corner distal from the hinge.
Figure 9:
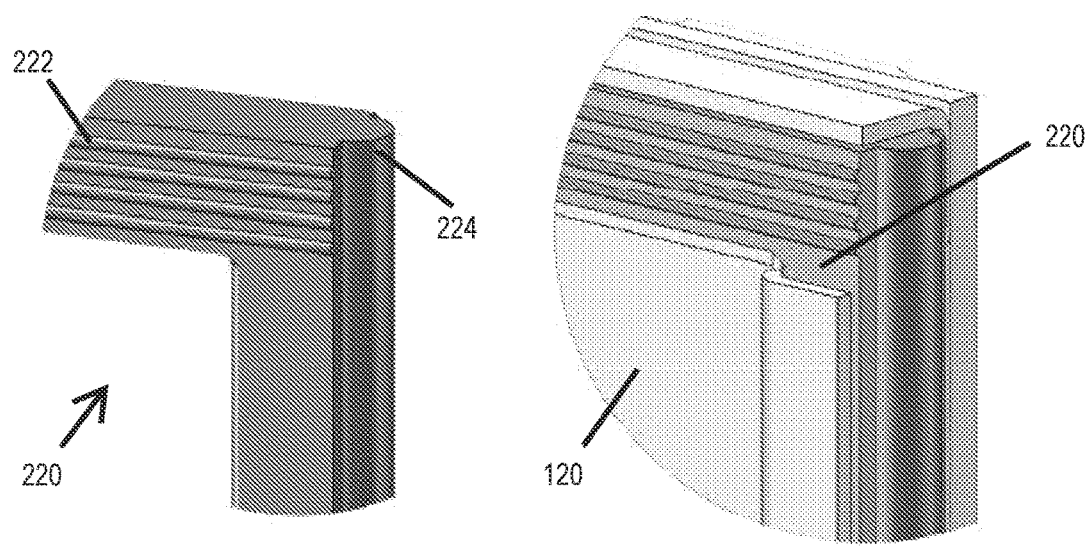
FIG. 9 is a detailed perspective view of the first embodiment gasket system with and without the second door, showing the upper corner distal from the hinge.
Figure 12:
FIG. 12 is a perspective view of the insides of the first and second doors with the second embodiment gasket system installed thereon, showing the doors open and detached from the cabinet body.
Figure 13:
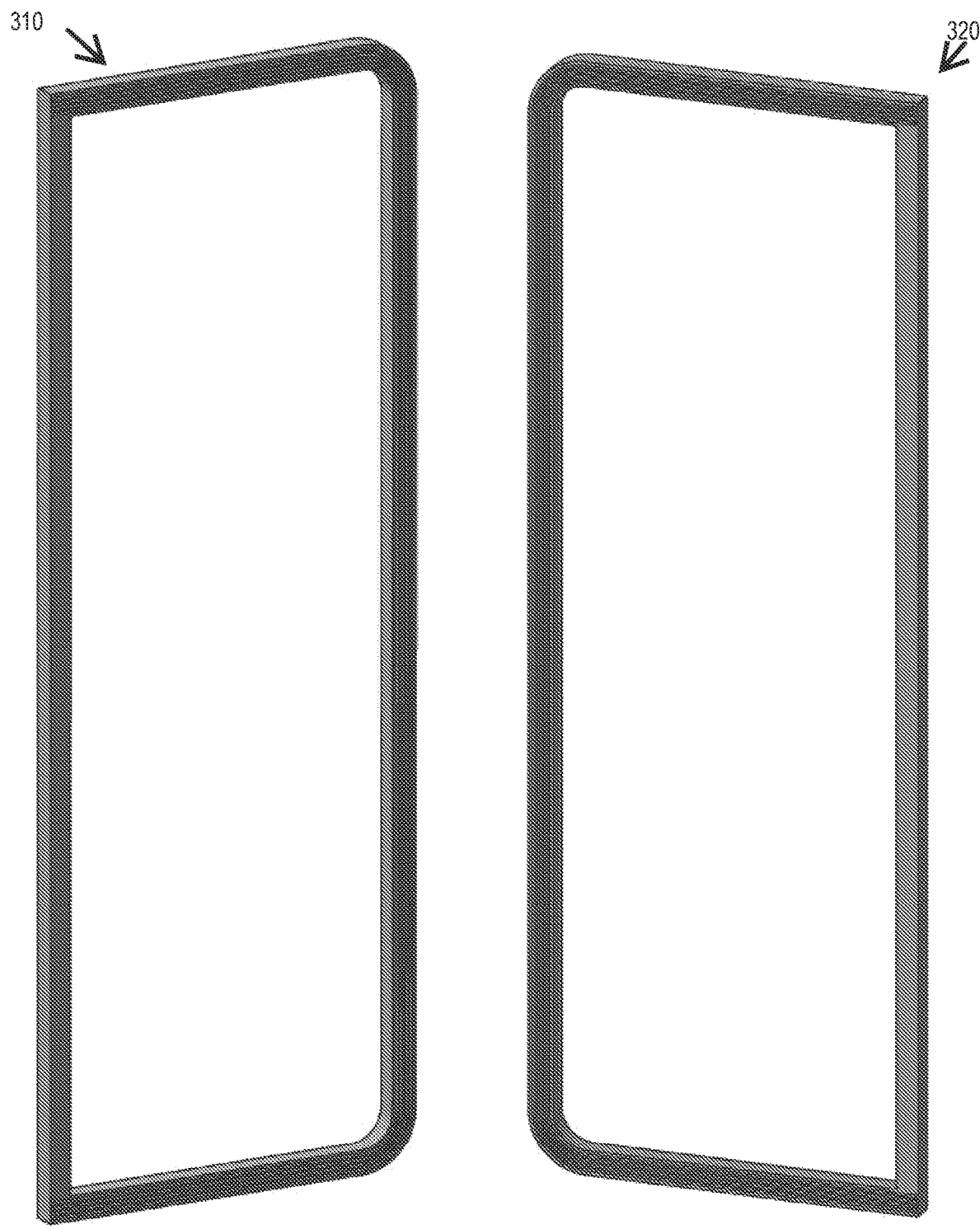
FIG. 13 is a perspective view of the second embodiment gasket system, without the doors.
Figure 14:
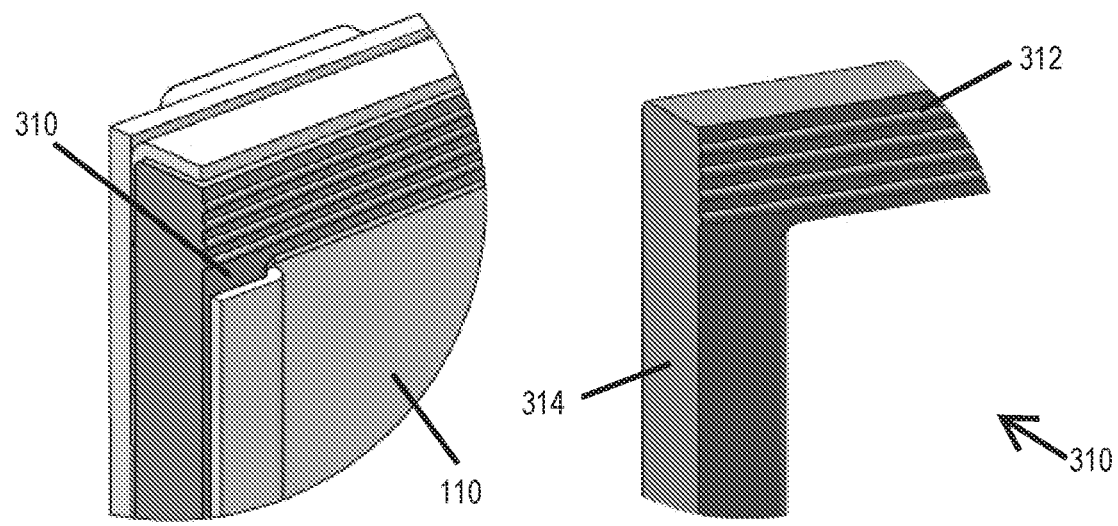
FIG. 14 is a detailed perspective view of the second embodiment gasket system with and without the first door, showing the upper corner distal from the hinge.
Figure 15:
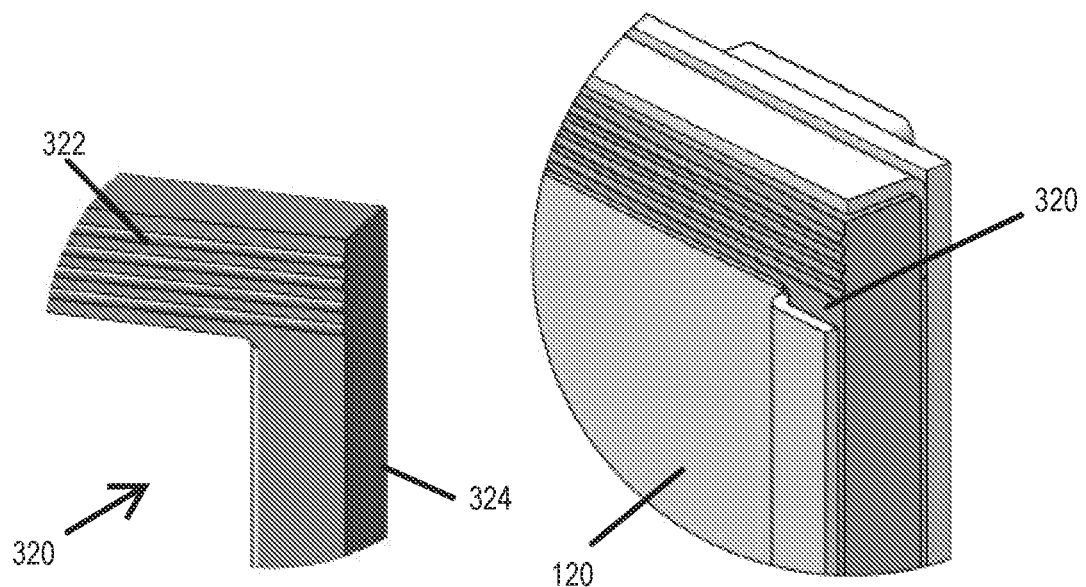
FIG. 15 is a detailed perspective view of the second embodiment gasket system with and without the second door, showing the upper corner distal from the hinge.
Figure 16:
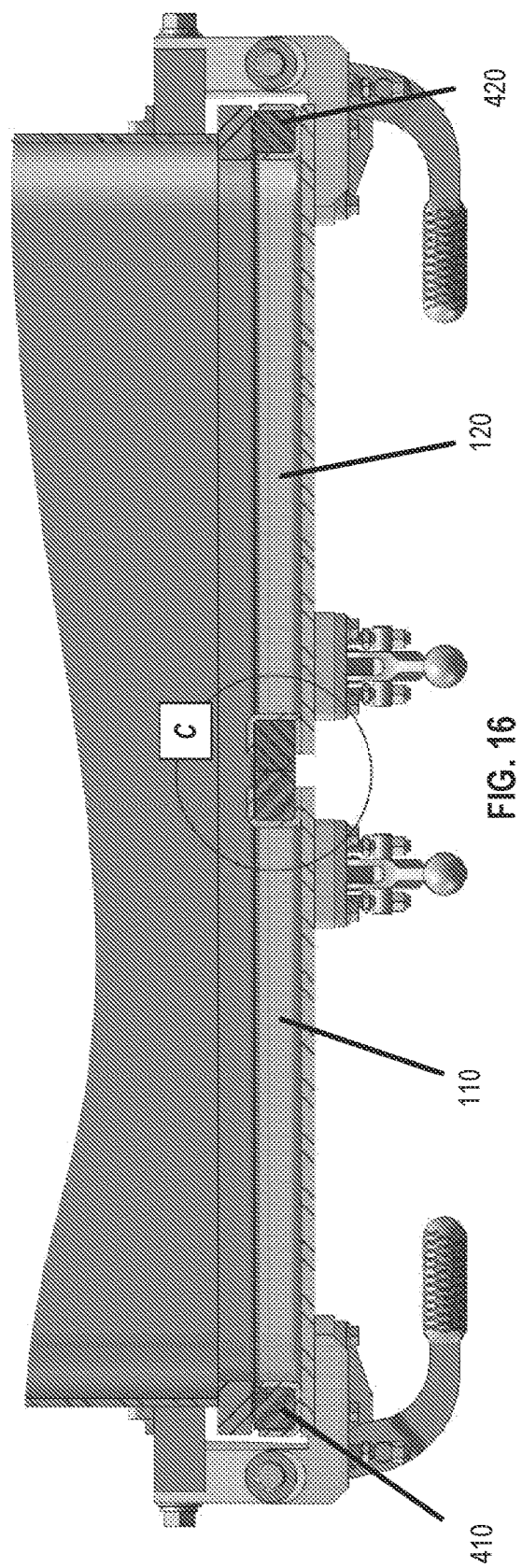
FIG. 16 is a sectional view along A-A of FIG. 3 showing a third embodiment gasket system for the housing of FIG. 1.
Figure 17:
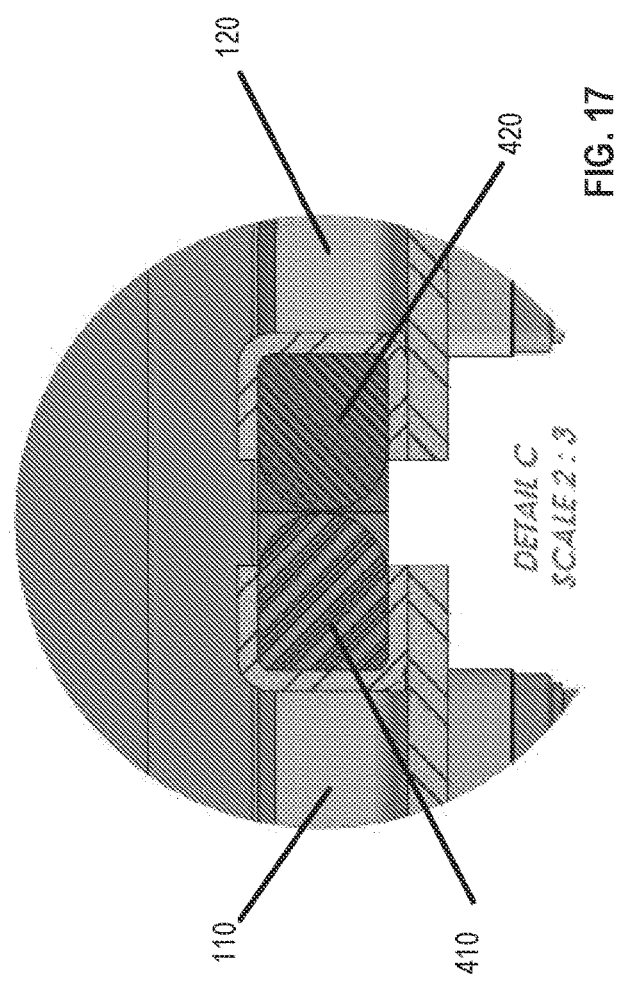
FIG. 17 is a detail view of area C of FIG. 16.
Figure 18:
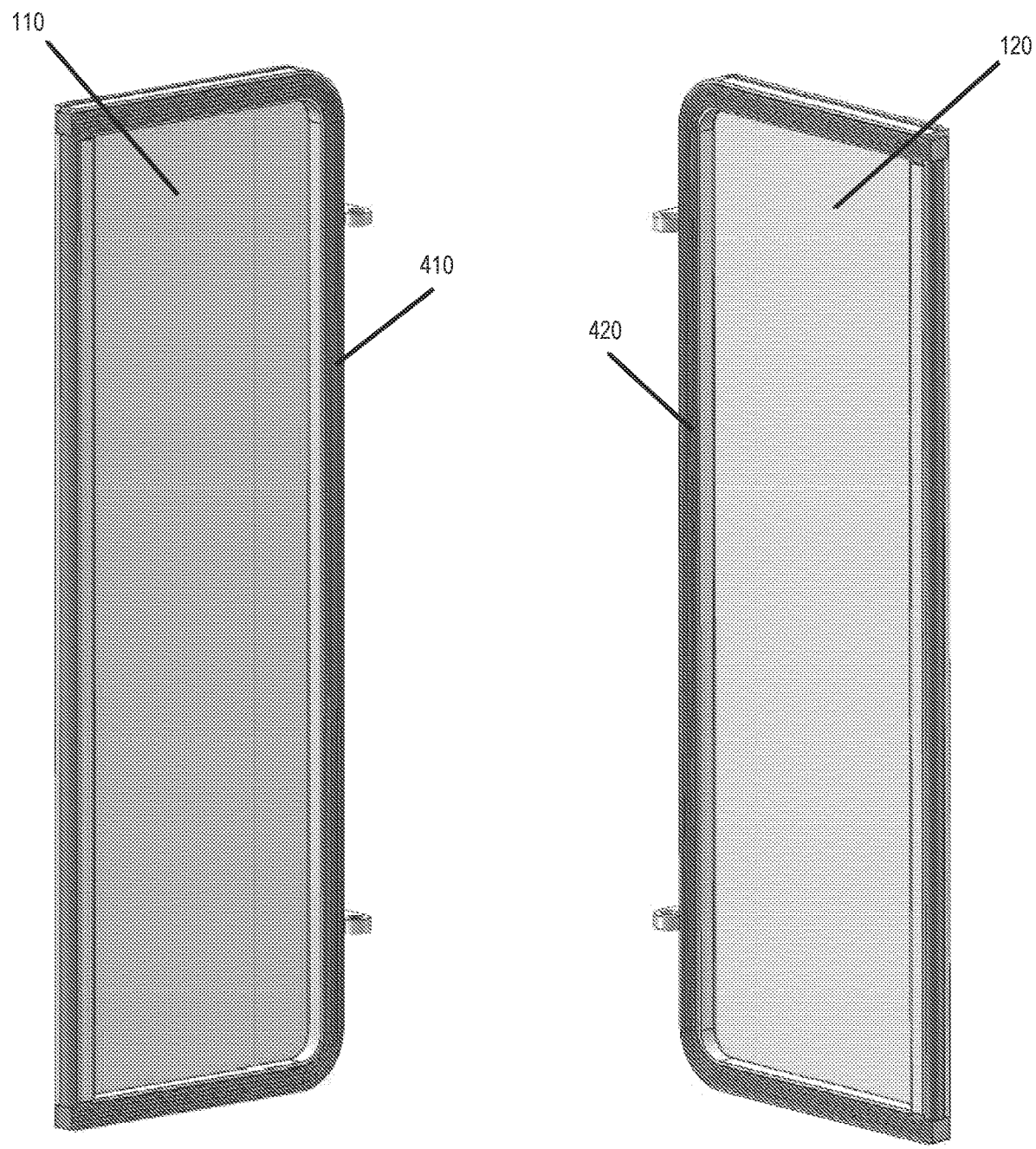
FIG. 18 is a perspective view of the insides of the first and second doors with the third embodiment gasket system installed thereon, showing the doors open and detached from the cabinet body.
Figure 19:
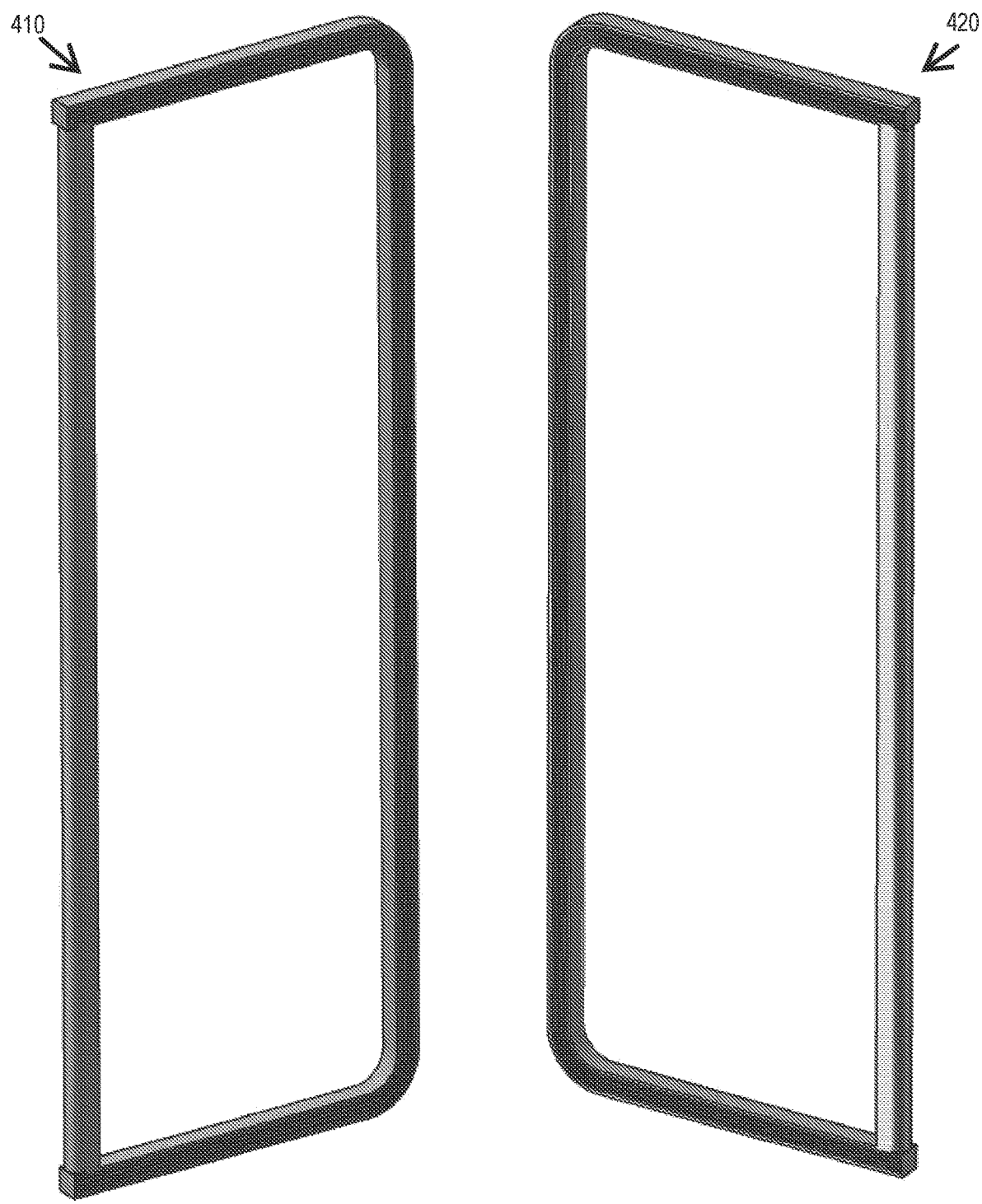
FIG. 19 is a perspective view of the third embodiment gasket system, without the doors.
Figure 20:
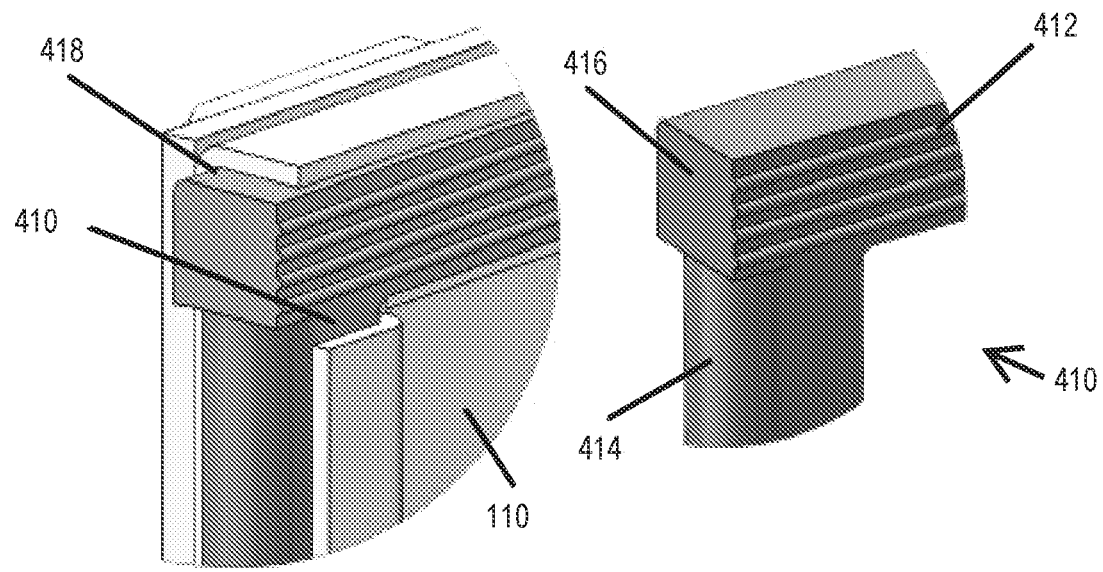
FIG. 20 is a detailed perspective view of the third embodiment gasket system with and without the first door, showing the upper corner distal from the hinge.
Figure 21:
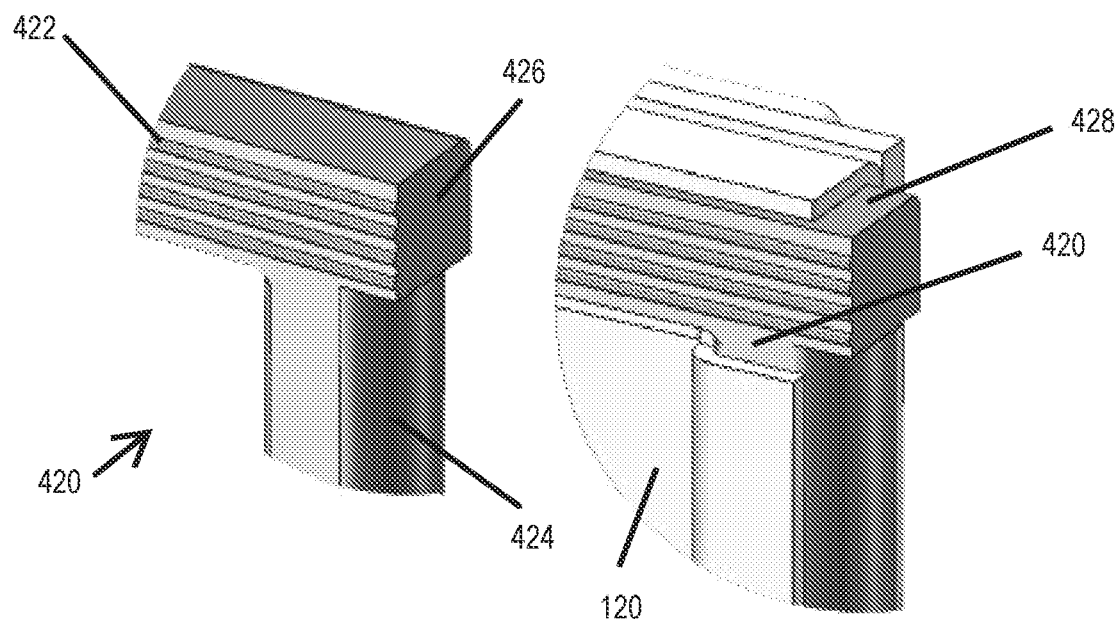
FIG. 21 is a detailed perspective view of the third embodiment gasket system with and without the second door, showing the upper corner distal from the hinge.
Figure 22:
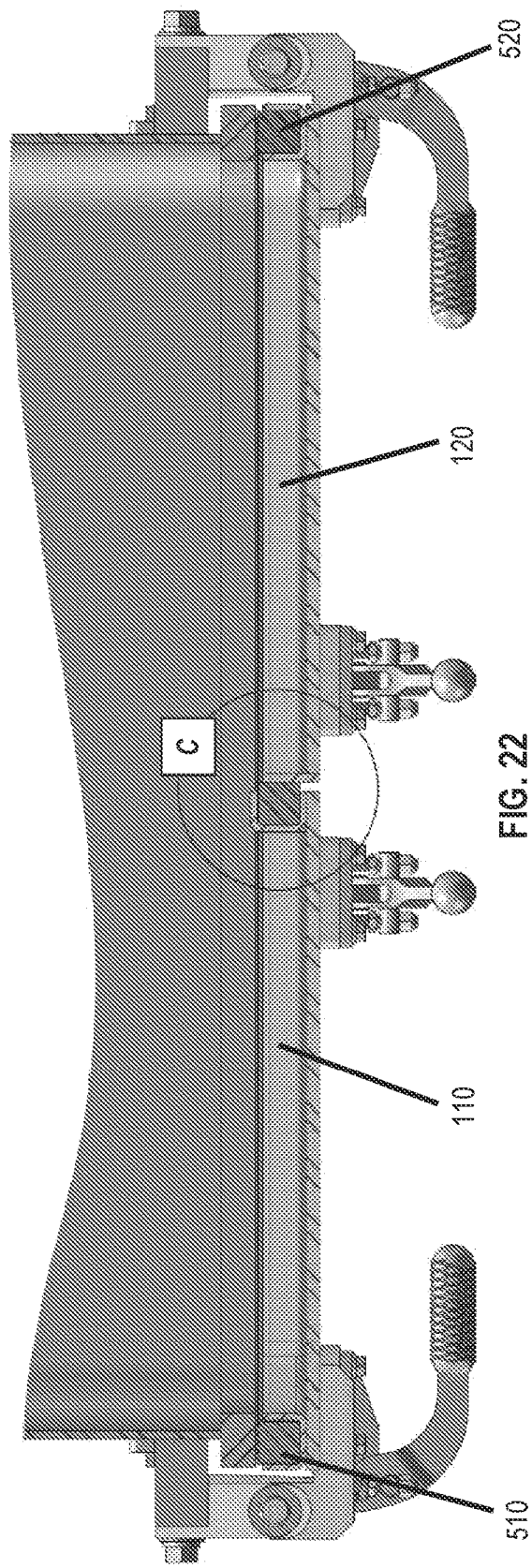
FIG. 22 is a sectional view along A-A of FIG. 3 showing a fourth embodiment gasket system for the housing of FIG. 1.
Figure 23:
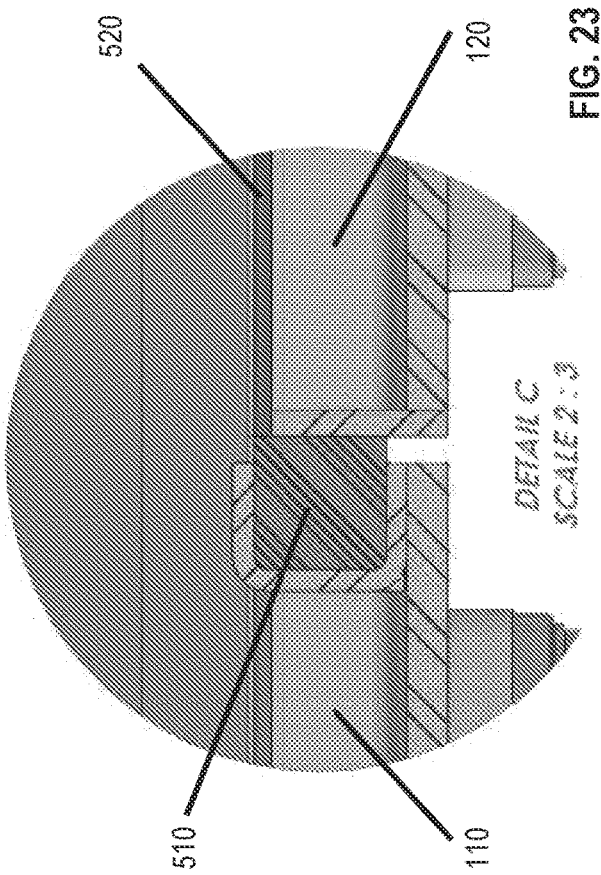
FIG. 23 is a detail view of area C of FIG. 22.
Figure 24:
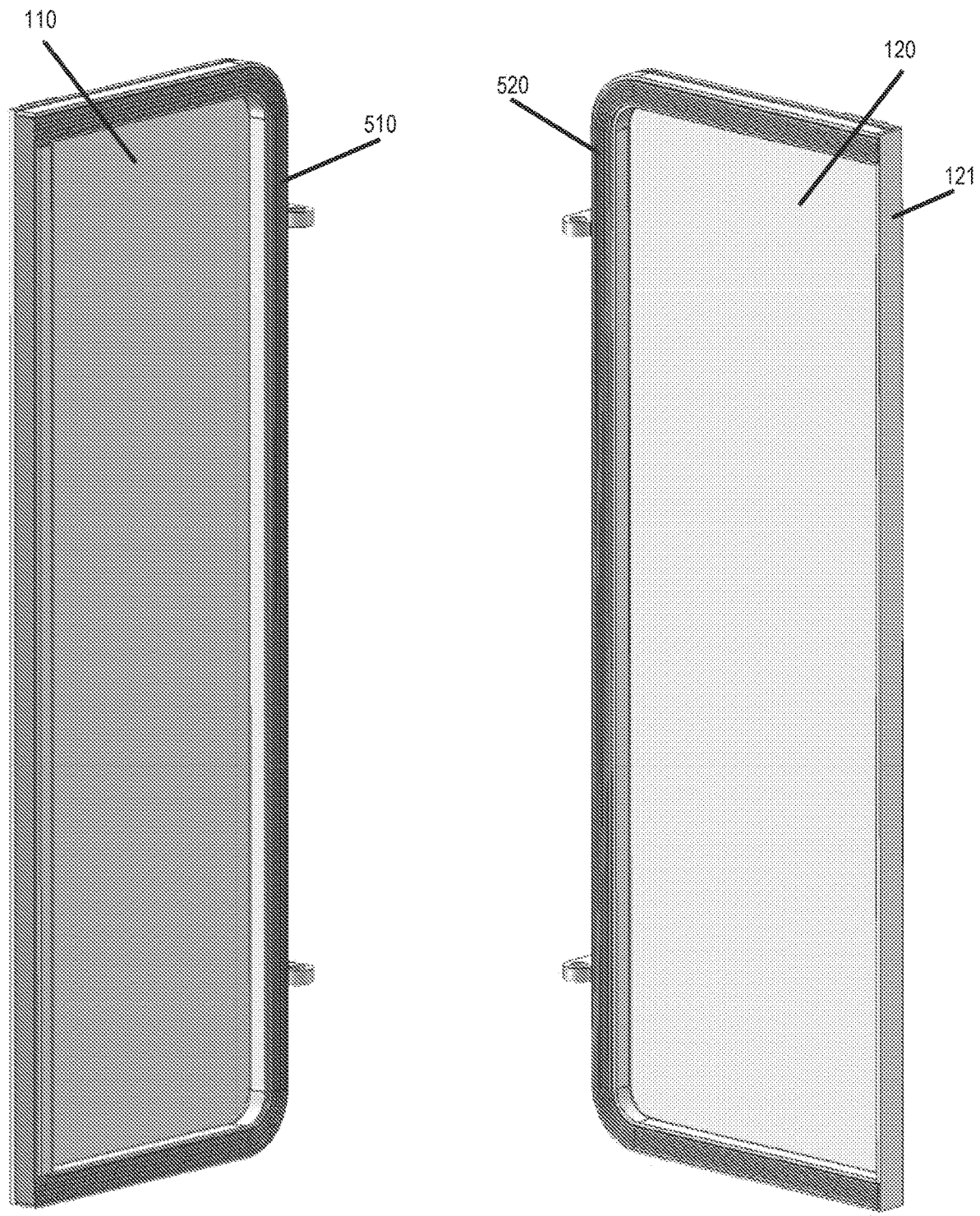
FIG. 24 is a perspective view of the insides of the first and second doors with the fourth embodiment gasket system installed thereon, showing the doors open and detached from the cabinet body.
Figure 25:
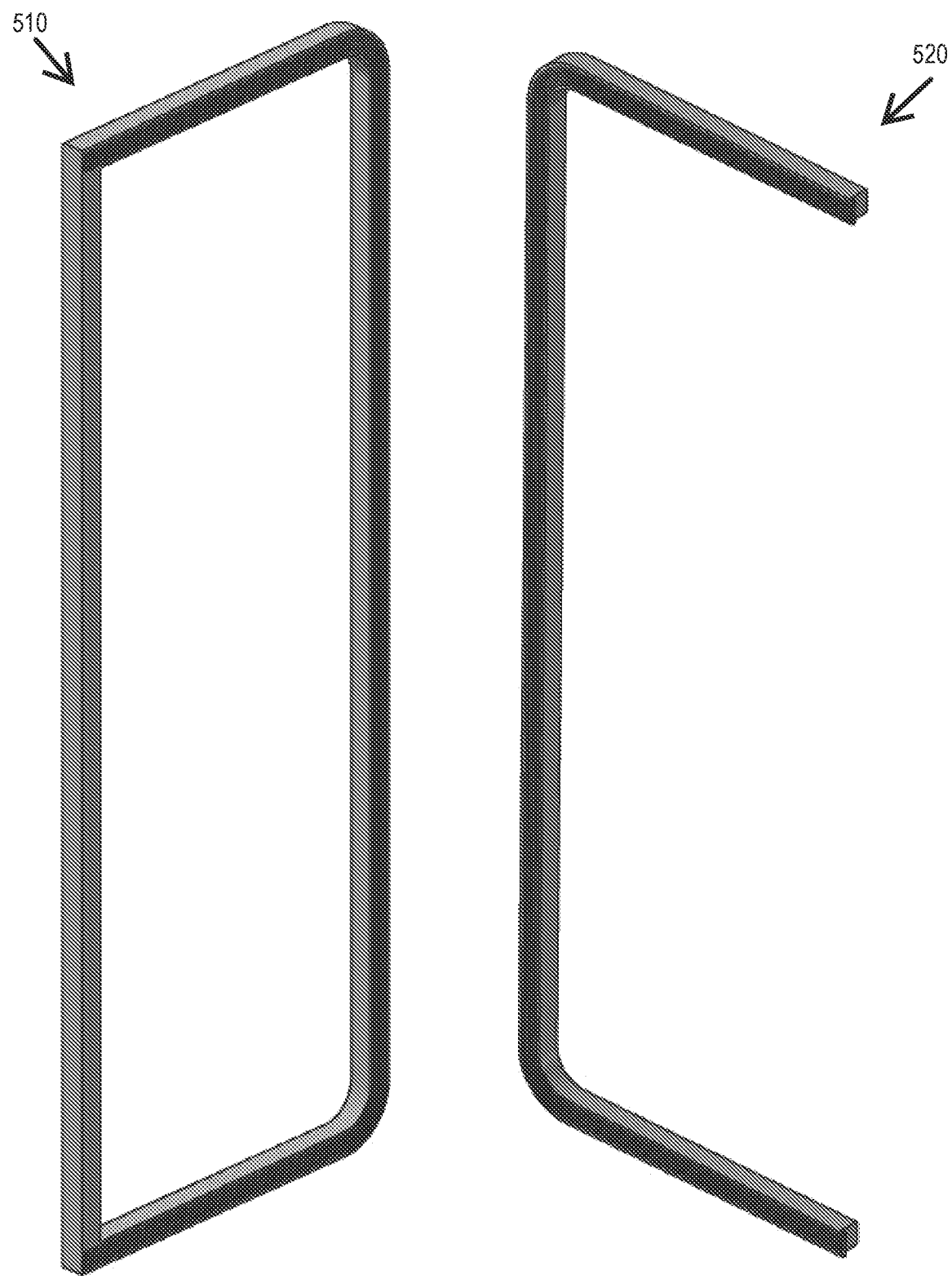
FIG. 25 is a perspective view of the fourth embodiment gasket system, without the doors.
Figure 26:
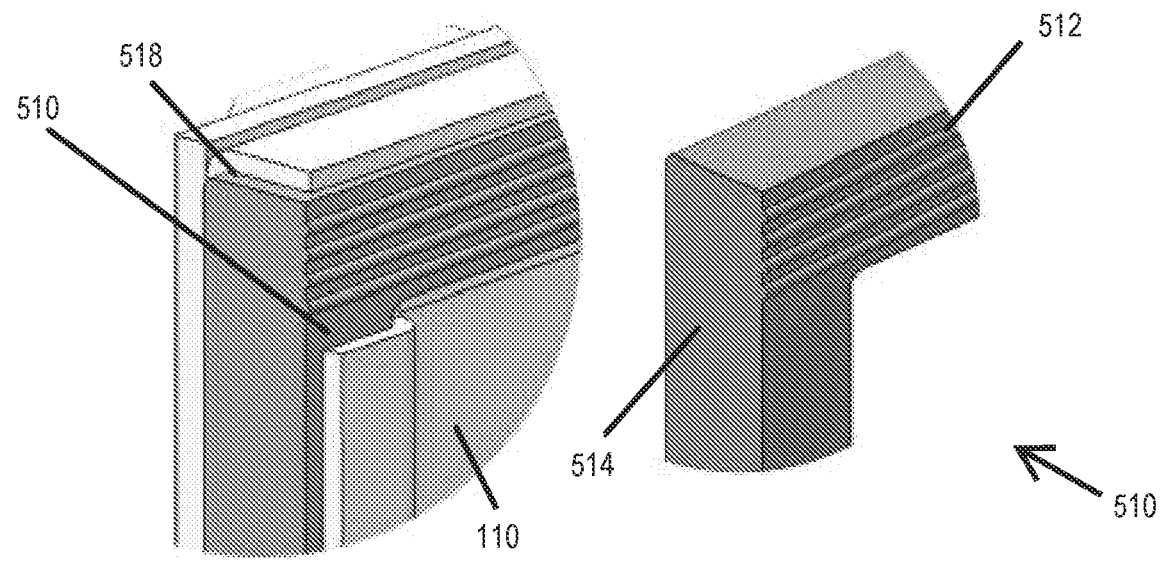
FIG. 26 is a detailed perspective view of the fourth embodiment gasket system with and without the first door, showing the upper corner distal from the hinge.
Figure 27:
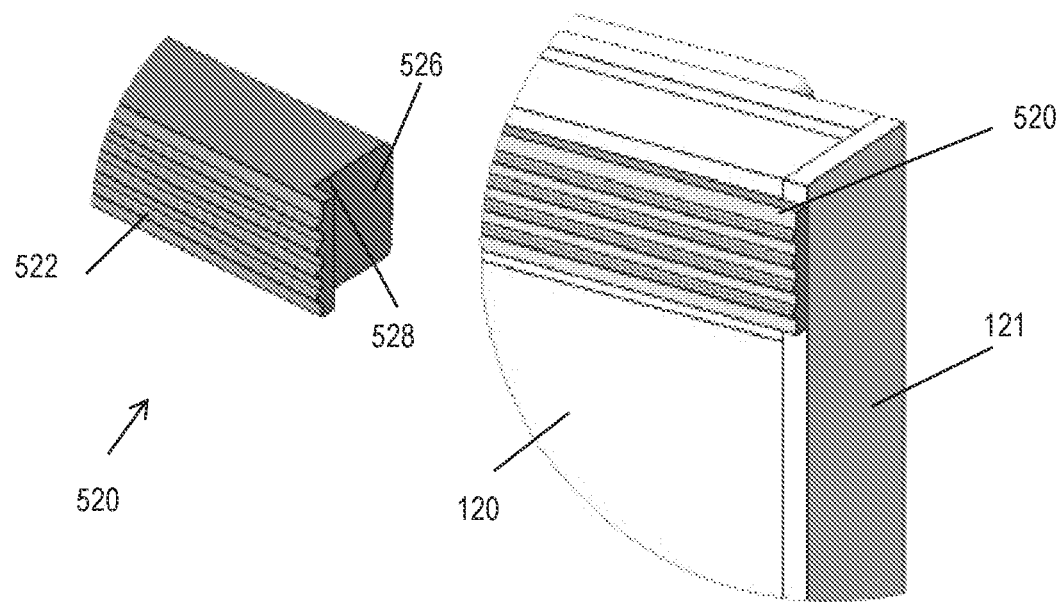
FIG. 27 is a detailed perspective view of the fourth embodiment gasket system with and without the second door, showing the upper corner distal from the hinge.
Figure 28:
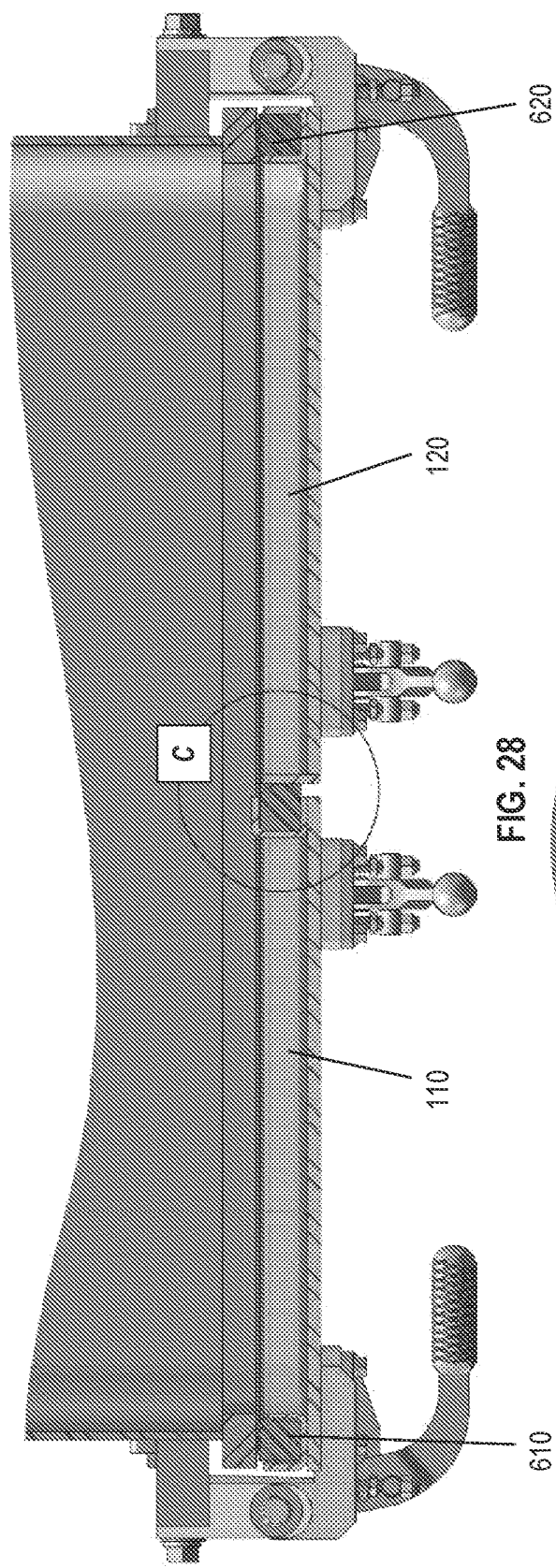
FIG. 28 is a sectional view along A-A of FIG. 3 showing a fifth embodiment gasket system for the housing of FIG. 1.
Figure 29:
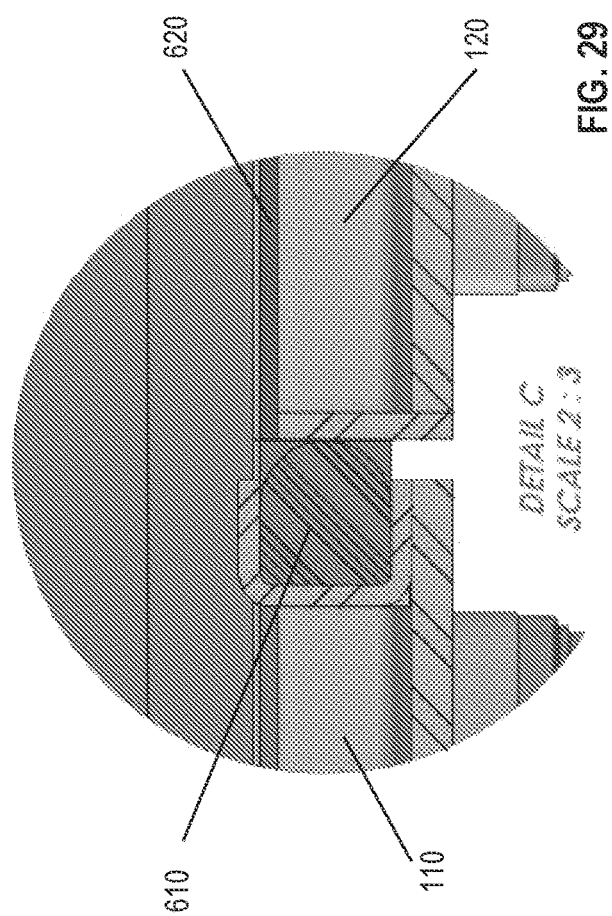
FIG. 29 is a detail view of area C of FIG. 28.
Figure 30:
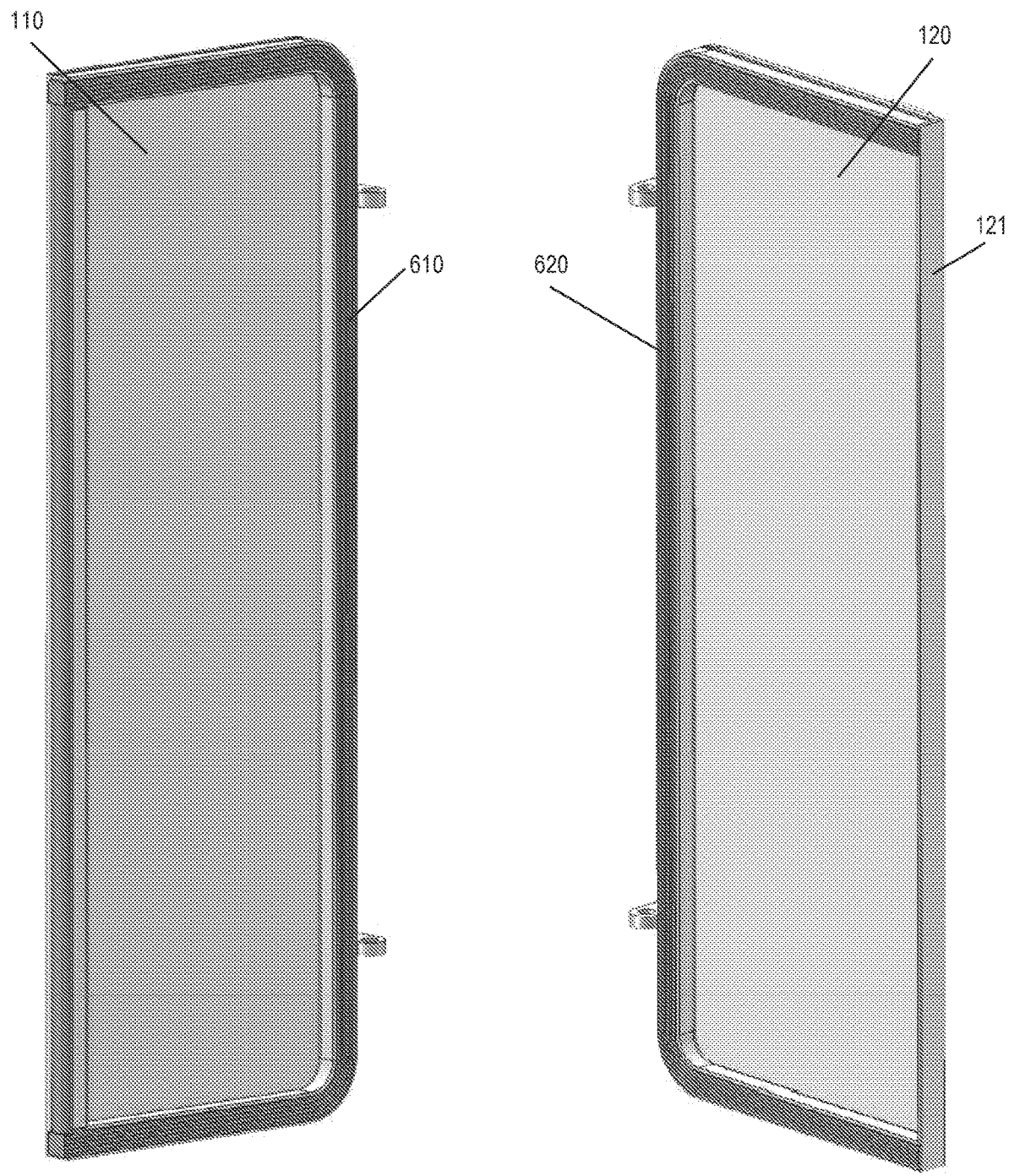
FIG. 30 is a perspective view of the insides of the first and second doors with the fifth embodiment gasket system installed thereon, showing the doors open and detached from the cabinet body.
Figure 31:
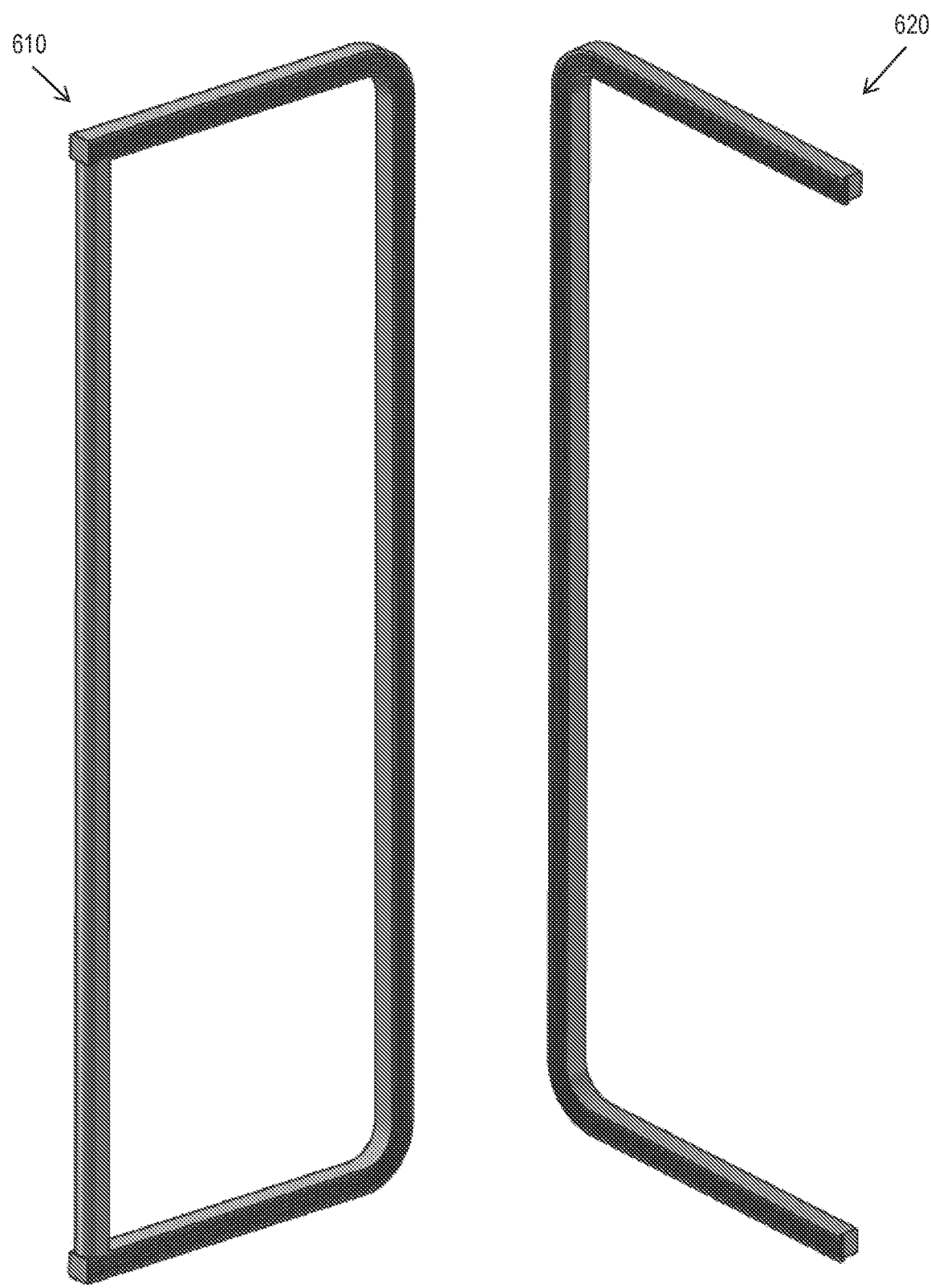
FIG. 31 is a perspective view of the fifth embodiment gasket system, without the doors.
Figure 32:
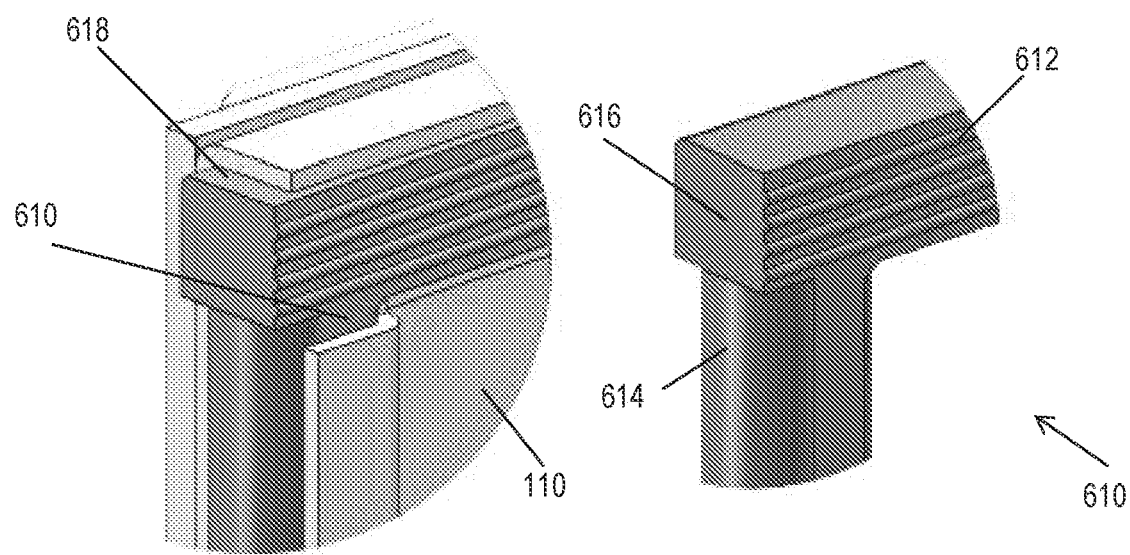
FIG. 32 is a detailed perspective view of the fifth embodiment gasket system with and without the first door, showing the upper corner distal from the hinge.
Figure 33:
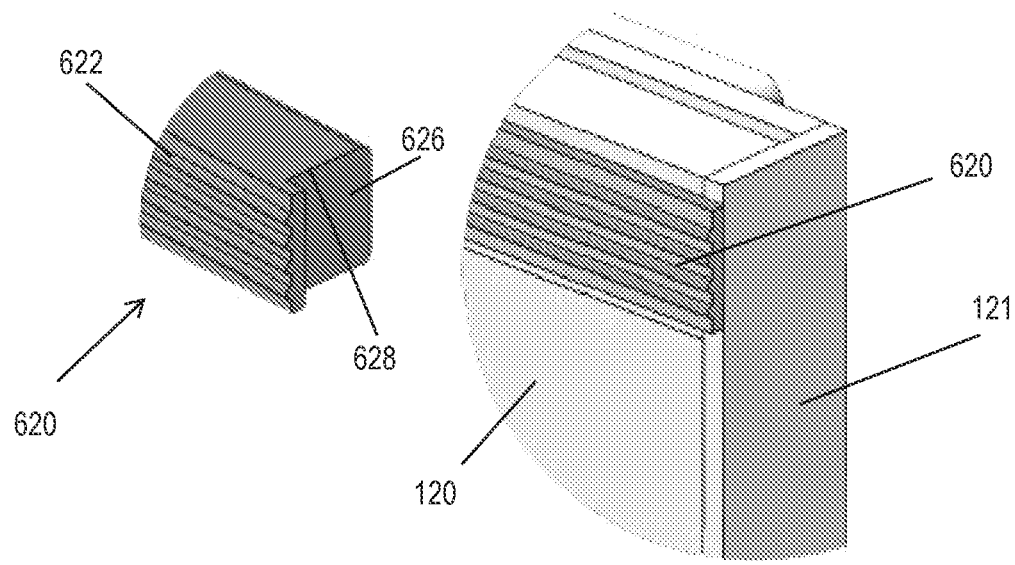
FIG. 33 is a detailed perspective view of the fifth embodiment gasket system with and without the second door, showing the upper corner distal from the hinge.

In certain cases, there are underground structures that are too small or confined to allow for safe installation and operation of submersible network protector housings, which are normally larger than non-submersible housings. In these cases, non-submersible housings have been used. Typically, the underground structures that house the non-submersible network protector housings are equipped with sump pumps to prevent flooding.

However, the sump pumps are subject to malfunction due to a number of reasons. During extreme flooding conditions, particularly tidal flooding conditions, much equipment is subject to destruction. This occurred during Hurricane Sandy in New York City, for example.

A prior enclosure for an electrical distribution system was disclosed in U.S. application Ser. No. 14/667,050, filed Mar. 24, 2015 and assigned to Richards Manufacturing Company, a New Jersey Limited Partnership, which was published as U.S. Publication No. US 2015/0282363 on Oct. 1, 2015, and issued as U.S. Pat. No. 9,379,526 on Jun. 28, 2016, the contents of each of which are incorporated herein by reference in their entirety.

Improved submersible housings for network protectors and/or other components of electrical distribution systems are needed in the art.

A first exemplary split door submersible housing 100 for an electrical distribution system is depicted in FIGS. 1-2 and 58-59. Housing 100 comprises a cabinet body 140, a first door 110, and a second door 120. First door 110 and second door 120 are coupled by way of respective hinges 131, 132 on opposing sides of cabinet body 140. Hinges 131, 132 pivotably and electrically connect first door 110 and second door 120, respectively, to opposite sides of cabinet body 140. Cabinet body 140 comprises a top wall 105, a bottom wall 106, a left side wall 107, a right side wall 108, and a rear wall 109. Cabinet body 140, with doors 110, 120, defines an interior region 101 of housing 100, which is sized to accept a component of the electrical distribution system, such as, but not limited to, a network protector. In contrast to existing single door enclosures, the split door configuration of housing 100 provides increased clearance between the distal edge surfaces of doors 110, 120 and the front wall of the underground structure when doors 110, 120 are opened 90° (e.g., over 19 inches for split doors versus about three inches for a single door). This additional space can greatly facilitate access to interior region 101 of housing 100, and thus to the network protector or other component of the electrical distribution system.

Housing 100 is made of metal, preferably steel, and is configured to withstand submersion in water (e.g., a water depth of 15 feet, or a water depth of 25 feet, as measured from the bottom of housing 100) for an extended period of time (e.g., one week) without water entering into the interior region 101 of housing 100. By way of example, housing 100 can be made from ¼ inch thick steel, and can include a pressure valve 104 used to pressurize the interior region 101, preferably with an inert gas, such as nitrogen, so as to further prevent the ingress of water. The interior and/or exterior surfaces of doors 110, 120 can include steel stiffeners 113 to ensure that doors 110, 120 do not bow when interior 101 of housing 100 is pressurized. Steel stiffeners 113 can also function as radiating fins for cooling the housing 100, and can be, for example, welded to, riveted to, or integrally formed with doors 110, 120. A tab 150 may be provided, for example, with portions on the inside and outside of one of the doors, to guide the doors together. In other embodiments, instead of tab 150, a protective strip, preferably made of steel, may be disposed on the outside of one of the doors along the entire distal edge. A window may be provided via a cutout 170 in first door 110 to provide a view into housing 100 when doors 110, 120 are closed. A transparent material 172, such as polycarbonate, is positioned over cutout 170 on the inside surface of the door and held in place by a frame 174, which can be made of steel, and can be fastened to the door by any suitable means (welding, riveting, etc.) to form a water-tight seal. In other embodiments, the window may be located elsewhere (e.g., on second door 120 or on cabinet body 140) and/or multiple windows may be provided on either/both doors. Two or more rails 180 may be provided, for example, on opposite sides of the interior region 101 of the housing 100 for the network protector to sit on. Extension rails 182 may be provided on rails 180 to bring the network protector out for testing and repairs. A throat plate 190 may be provided on the back of the cabinet body 140 to cover the opening where the network protector bolts onto low voltage throat of the transformer and connects electrically.

Cabinet body 140 is preferably grounded, and includes, for example, three electrode openings 141 on a top surface, which are used to respectively electrically connect to corresponding electrodes on the network protector. Each electrode opening 141 accepts a terminal or bushing 143 that is electrically isolated from cabinet body 140 and extends through cabinet body 140 to connect to the low voltage side of the electrical distribution network. Each terminal or bushing 143 forms a seal within its respective opening 141 that prevents the ingress of water into interior 101. By way of example, the electrode or terminal 143 may be electrically isolated from the cabinet body 140 by an insulating material, such as polyester, fiberglass, porcelain, epoxy, etc. The insulating material can be sealed against the cabinet body 140 using a flat or O-ring type gasket to prevent water ingress. Other examples include an electrode or terminal 143 that is partially encapsulated in a polymeric (e.g., rubber) material that electrically isolates the electrode and forms a seal against the cabinet body 140 to prevent water entry.

Figure 58:
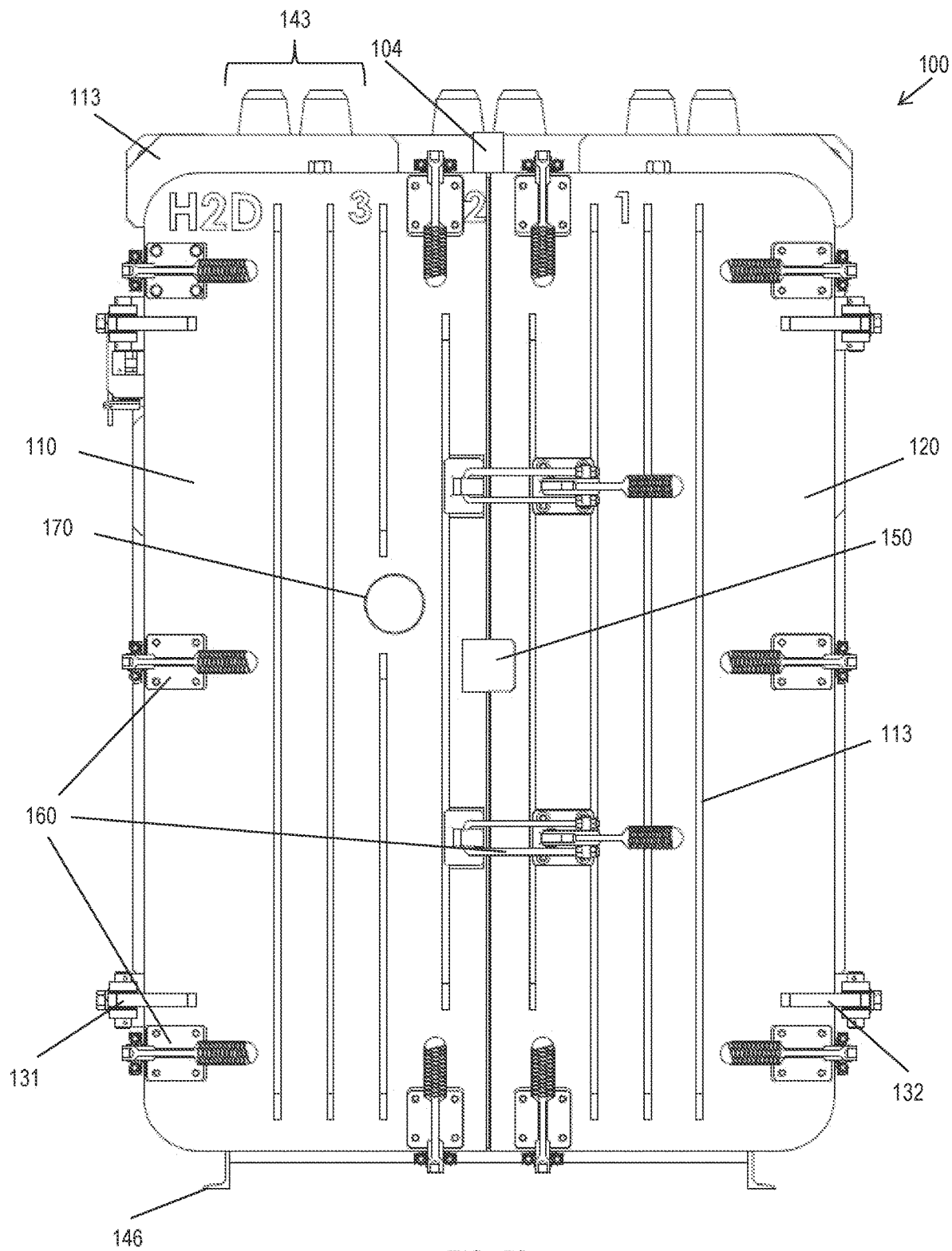
FIG. 58 is front view of the housing of FIG. 1, according to some embodiments of the invention.
Figure 59:
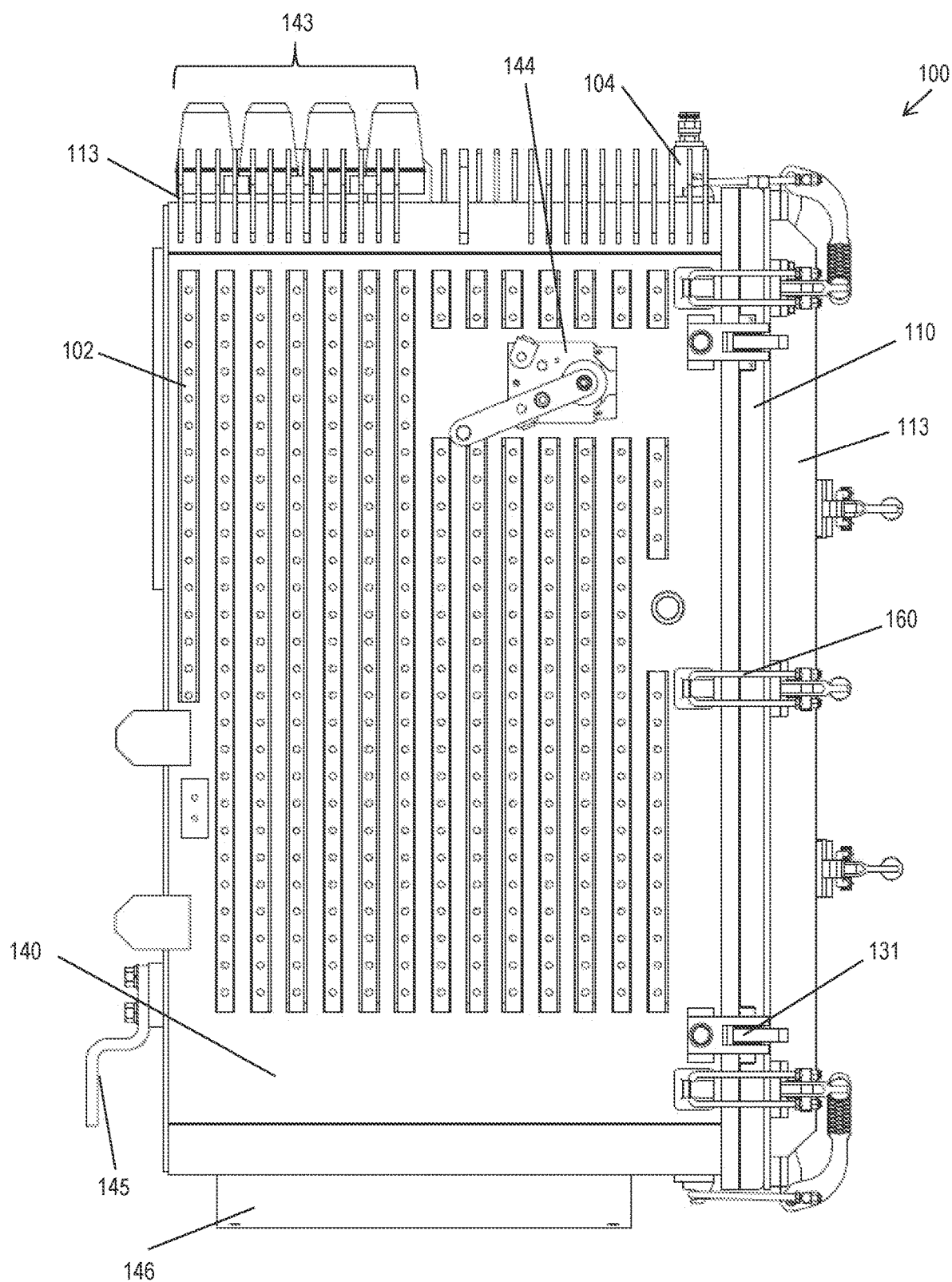
FIG. 59 is a side view of the housing of FIG. 1, according to some embodiments of the invention.

FIGS. 58 and 59 show, for example, three eight-position plug in terminals 143 for connection to cables going to the customer. In various embodiments, different terminal types can be provided, such as, but not limited to, flat spade, threaded stud, plug in, etc. In some embodiments, a plug in type terminal is preferred. An operations handle 144 may be provided on an exterior side surface of the cabinet body 140 for operating the network protector (e.g., locking the protector in an open, automatic, or closed position). A bracket 145 may be provided on the back of the cabinet body 140 to connect housing 100 to the transformer and provide additional physical support. One or more "feet" 146 may be provided on the bottom of the cabinet body 140 for bolting housing 100 to the transformer and for additional physical support.

The exterior side surfaces of cabinet body 140 can include radiating (cooling) fins 102 to radiate heat that the network protector generates within interior region 101 into the underground structure. The interior side surfaces of cabinet body 140 may also include fins 103, which collect heat generated within interior region 101 and conduct this heat to radiating fins 102 on the exterior side surfaces of cabinet body 140. The fins 102, 103 can be, for example, welded to, riveted to, or integrally formed with cabinet body 140. In some embodiments, fins 102, 103 may have an elongated channel shape with a squared "U" cross-section, and may be attached to cabinet body 140, for example, by spot welds along the center of the channel (see FIG. 59). In other embodiments, fins 102, 103 may be single fins in the form of a solid bar, analogous to steel stiffeners 113, which may be welded to cabinet body 140. The fins 102, 103 and the steel stiffeners 113 each provide dual functions of cooling and stiffening.

One or more locking mechanisms 160 are provided on doors 110, 120 and cabinet body 140 to lock and clamp doors 110, 120 into the closed position on the cabinet body 140, thereby providing a water-tight sealing of interior 101. Locking mechanisms 160 may be provided to lock doors 110, 120 to each other and/or to cabinet body 140. The locking mechanisms 160 pull doors 110, 120 towards a jamb surface 142 on the front of cabinet body 140, and also pull the distal edge surfaces of doors 110, 120 towards each other. In some embodiments, each locking mechanism is a quick-release latching mechanism including a hook 162 disposed on a first surface, such as the exterior surface of cabinet body 140, and a handle 164 pivotably connected to a second surface, such as a door 110, 120. A loop 166 is pivotably connected near pivot point 169 of handle 164 and engages with hook 162. The mechanical advantage provided by handle 164 acting as a lever pulling on loop 166 draws the first surface towards the second surface, such as door 110, 120 to jamb surface 142, or first door 110 to second door 120. When in the locked position, the changed position of handle 164 causes pivot point 161 of loop 166 to correspondingly change to a position with respect to pivot point 169 and end of handle 164 that causes tension on loop 166 to generate a torque on handle 164 that urges handle 164 into the locked position, or which aligns the pivot points 169, 161 with loop 166 so that handle 164 is at least not urged out of the locked position.

Doors 110, 120 seal against each other as well as against a corresponding surface on the cabinet body, when they are locked in the closed position. Doors 110, 120 sealingly engage jamb surface 142, which defines the opening for access to cabinet body 140, when doors 110, 120 are swung shut on hinges 131, 132 to provide a water-tight seal between the doors 110, 120 and the cabinet body 140. Doors 110, 120 also sealingly engage with each other along their distal edge surfaces (surfaces most distal from hinges 131, 132, where doors 110, 120 meet) to provide a water-tight seal therebetween. A gasket system seals doors 110, 120 against each other and against the cabinet body 140. The gasket system comprises a first gasket on the first door and a second gasket on the second door. Each gasket is held in place on the respective door, for example, by press-fitting the gasket between an outer rim 115 and an inner rim 117 running in parallel (e.g., about 1¼ inches apart; see FIG. 56) along the top, proximal (hinged) side, and bottom edges of the door. A lip 119 may be provided along the inner distal side of either or both doors to hold a distal side portion of the gasket system in place (if present). The gasket system can be made from an elastomeric rubber material, such as, but not limited to, a nitrite material with some oil resistance such as acrylonitrile-butadiene rubber, or other material known in the art to be suitable for forming a water-tight seal. Preferably, the gaskets are each one piece continuous gaskets, either four-sided gaskets configured to extend around the perimeter of the respective door, or three-sided gaskets, configured to extend around the top, proximal, and bottom sides of the door. In certain preferred embodiments, the one piece continuous gaskets may be molded and may have solid, substantially square cross-sections (see, e.g., FIG. 57). In other embodiments, the one piece continuous gaskets may be produced using another method, such as extrusion, and/or may have a different cross-section profile such as, but not limited to, solid round or hollow round (with different outer and inner diameters). As used herein, "one piece continuous" means forming a continuous whole. A one piece continuous gasket according to the present invention can be cut one or more times, or otherwise comprise separate parts (or loose ends, in the case of a four-sided gasket), but is considered to be a one piece continuous gasket when the parts or ends are secured together (e.g., by press fit, adhesive, bonding, physical spacer, connector, etc.) to form a four-sided or three-sided gasket as shown and described.

As shown in FIGS. 4-9, a first embodiment gasket system comprises a first gasket 210 on the first door and a second gasket 220 on the second door. Gaskets 210, 220 are one piece continuous gaskets extending around the inside perimeters of doors 110, 120. Raised ridges 212, 222 or other textured surface may be provided on the portions of gaskets 210, 220 that interface with jamb surface 142, to facilitate or enhance the sealing engagement between doors 110, 120 and cabinet body 140. The distal edge surfaces of gaskets 210, 220 have conformal shapes to sealingly mate with each other when doors 110, 220 are in a closed position. For example, first gasket 210 may have a rounded depression 214 along its distal edge surface that is complementary with a rounded protrusion 224 on second gasket 220. In alternate embodiments, these positions may be reversed (protrusion on first gasket, depression on second gasket) and/or complementary indentions/protrusions of other shapes and/or numbers may be used.

As shown in FIGS. 10-15, a second embodiment gasket system comprises a first gasket 310 on the first door and a second gasket 320 on the second door. Gaskets 310, 320 are one piece continuous gaskets extending around the inside perimeters of doors 110, 120. Raised ridges 312, 322 or other textured surface may be provided on the portions of gaskets 310, 320 that interface with jamb surface 142, to facilitate or enhance the sealing engagement between doors 110, 120 and cabinet body 140. Gaskets 310, 320 have substantially flat distal edge surfaces 314, 324, which are nearly flush with the door edge, extending only slightly therefrom.

As shown in FIGS. 16-21, a third embodiment gasket system comprises a first gasket 410 on the first door and a second gasket 420 on the second door. Gaskets 410, 420 are one piece continuous gaskets extending around the inside perimeters of doors 110, 120. Raised ridges 412, 422 or other textured surface may be provided on the portions of gaskets 410, 420 that interface with jamb surface 142, to facilitate or enhance the sealing engagement between doors 110, 120 and cabinet body 140. Gaskets 410, 420 have convex rounded distal edge surfaces 414, 424, with upper and lower ends having substantially flat surfaces 416, 416 extending beyond the distal edges of doors 110, 120 as indicated at 418, 428.

As shown in FIGS. 22-27, a fourth embodiment gasket system comprises a first gasket 510 on the first door and a second gasket 520 on the second door. Gaskets 510, 520 are one piece continuous gaskets. First gasket 510 extends around the inside perimeter of first door 110. Second gasket 520 extends around the top, proximal side, and bottom edges of door 120, but not along the distal edge. Raised ridges 512, 522 or other textured surface may be provided on the portions of gaskets 510, 520 that interface with jamb surface 142, to facilitate or enhance the sealing engagement between doors 110, 120 and cabinet body 140. Gasket 510 has a substantially flat distal edge surface 514, which extends beyond the distal edge of door 110 as indicated at 518. Gasket 520 has substantially flat upper and lower distal edges 526, which are recessed from door 120 as indicated at 528 (except for the portion that interfaces with jamb surface 142) to accommodate a substantially flat metal distal edge surface 121 of door 120. In an alternate embodiment, these configurations may be reversed (three-sided gasket 520 and surface 121 on first door, gasket 510 on second door).

As shown in FIGS. 28-33, a fifth embodiment gasket system comprises a first gasket 610 on the first door and a second gasket 620 on the second door. Gaskets 610, 620 are one piece continuous gaskets. First gasket 610 extends around the inside perimeter of first door 110. Second gasket 620 extends around the top, proximal side, and bottom edges of door 120, but not along the distal edge. Raised ridges 612, 622 or other textured surface may be provided on the portions of gaskets 610, 620 that interface with jamb surface 142, to facilitate or enhance the sealing engagement between doors 110, 120 and cabinet body 140. Gasket 610, like gasket 410, has convex rounded distal edge surface 614, with upper and lower ends having a substantially flat surface 616 extending beyond the distal edge of door 110 as indicated at 618. Gasket 620, like gasket 520, has substantially flat upper and lower distal edges 626, which are recessed from door 120 as indicated at 628 (except for the portion that interfaces with jamb surface 142) to accommodate a substantially flat metal distal edge surface 121 of door 120. In an alternate embodiment, these configurations may be reversed (three-sided gasket 620 and surface 121 on first door, gasket 610 on second door).

The gasket systems shown in FIGS. 4-33 and described above are merely exemplary; in other embodiments, the first and second gaskets may be adapted for use with split door submersible housings other than housing 100, and/or may comprise variations in the textures, mating features, dimensions, etc. of the surfaces between the gaskets, between a gasket and the opposite door, and/or between the gaskets and the cabinet body that can also facilitate sealing doors 110, 120 against each other and against the cabinet body 140 in a water-tight manner, without departing from the spirit and scope of the present invention.

A second exemplary split door submersible housing 1000, substantially similar to housing 100 but with a different mechanism for opening the split doors, is depicted in FIGS. 34-39, which show the split doors moving from a closed to an open position. As in housing 100, first door 1110 is coupled by way of hinges 1131 to cabinet body 1140. However, in housing 1000, second door 1120 is coupled to first door 1110 by way of hinges 1133. Hinges 1133 pivotably and electrically connect first door 1110 to second door 1120, and hinges 1131 pivotably and electrically connect first door 1110 to cabinet body 1140. Cabinet body 1140 comprises a top wall 1105, a bottom wall 1106, a left side wall 1107, a right side wall 1108, and a rear wall 1109. Cabinet body 1140, with doors 1110, 1120, defines an interior region 1101 of housing 1000, which is sized to accept a component of the electrical distribution system, such as, but not limited to, a network protector. Locking mechanisms 1160 (with hook 1162, loop 1166, handle 1164, and pivot points 1161, 1169) like locking mechanisms 160 described above for housing 100 are provided on doors 1110, 1120 and cabinet body 1140 to lock and clamp doors 1110, 1120 into the closed position on the cabinet body 1140. In some embodiments, no locking mechanisms are provided between doors 1110, 1120. In various embodiments, housing 1000 may include one or more of the following features described above for housing 100 (not shown): cooling fins 102 and/or 103 (e.g., on the sides of the outside and/or inside of the cabinet body), pressure valve 104, steel stiffeners 113 (e.g., on the insides and/or outsides of the doors and/or the top of the outside of the cabinet body), tab 150, one or more sets of window elements 170, 172, 174, and/or one or more sets of rails 180, 182.

Figure 34:
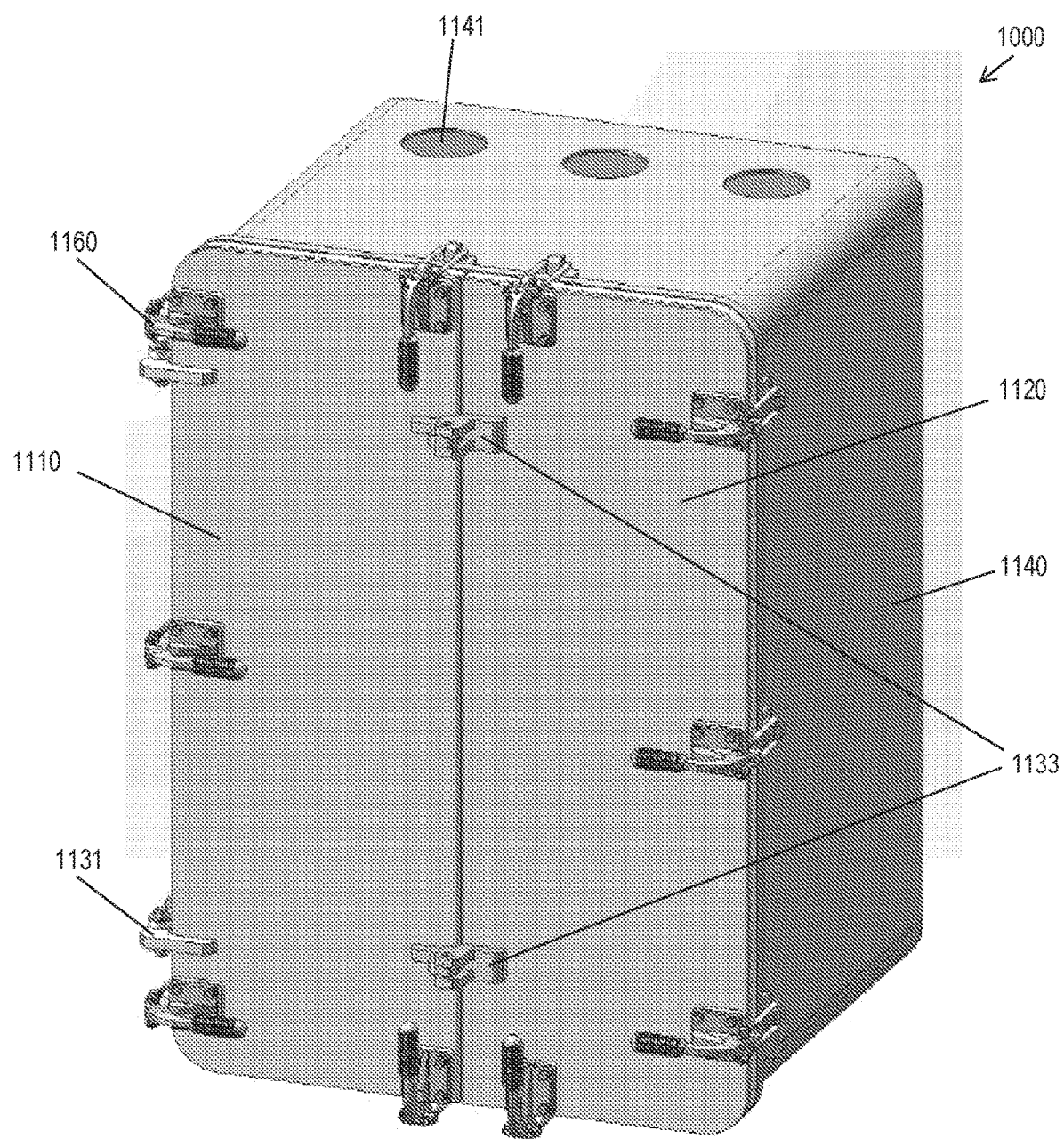
FIGS. 34 to 39 are perspective views of a second exemplary split door submersible housing, having a different mechanism for opening the split doors as compared to the housing of FIG. 1, showing the split doors moving from a closed to an open position.
Figure 35:
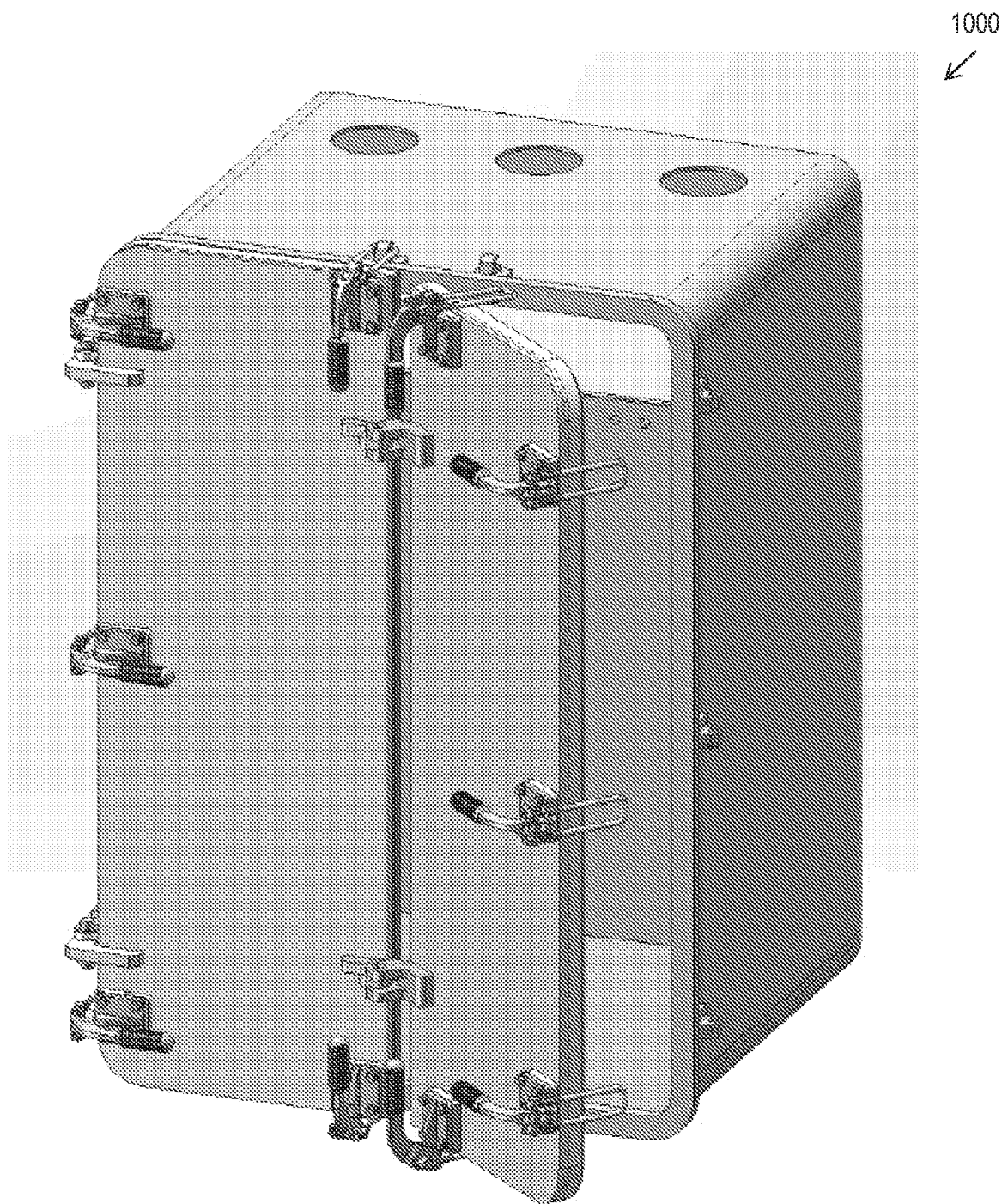
Figure 36:
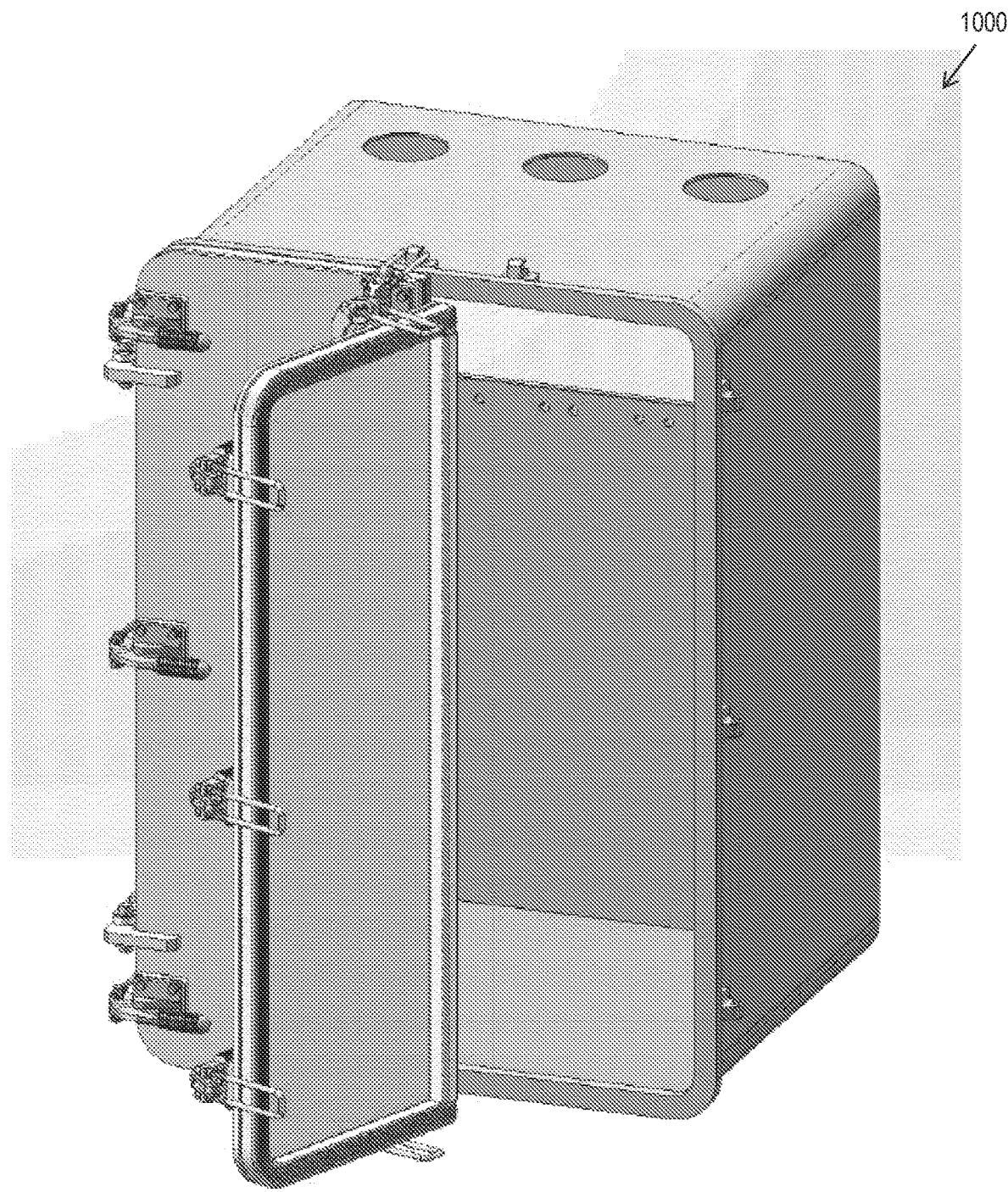
Figure 37:
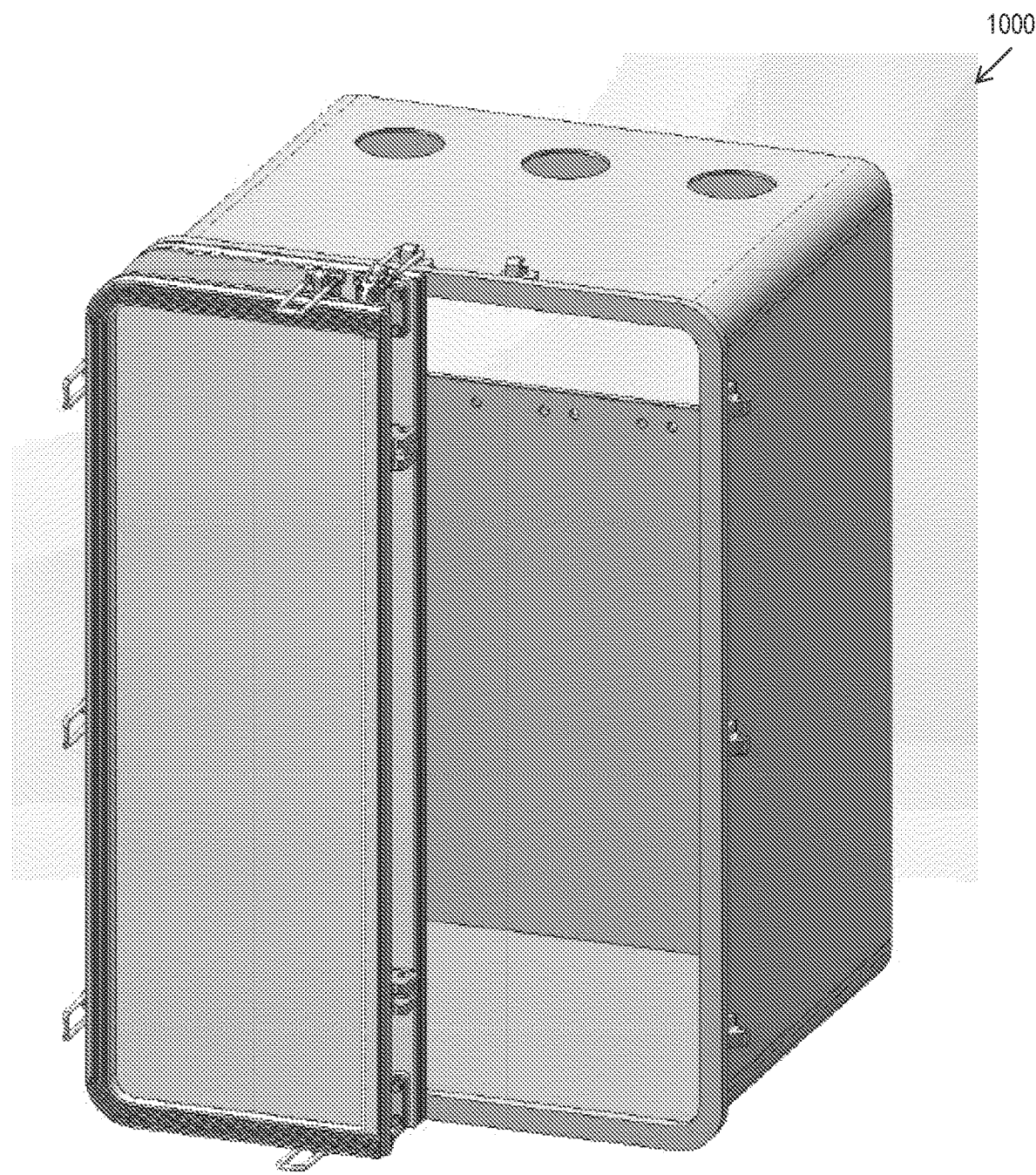
Figure 38:
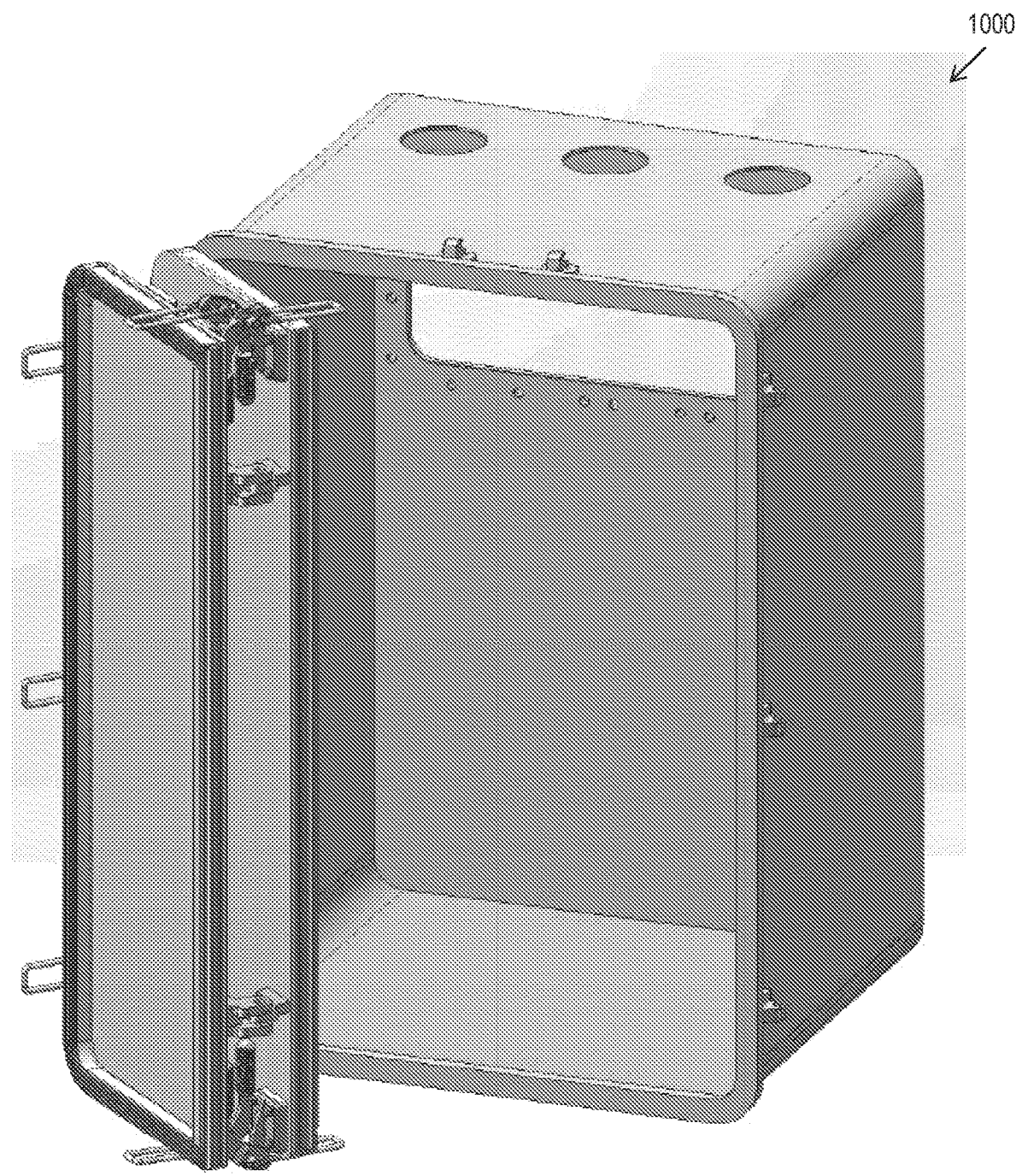
Figure 39:
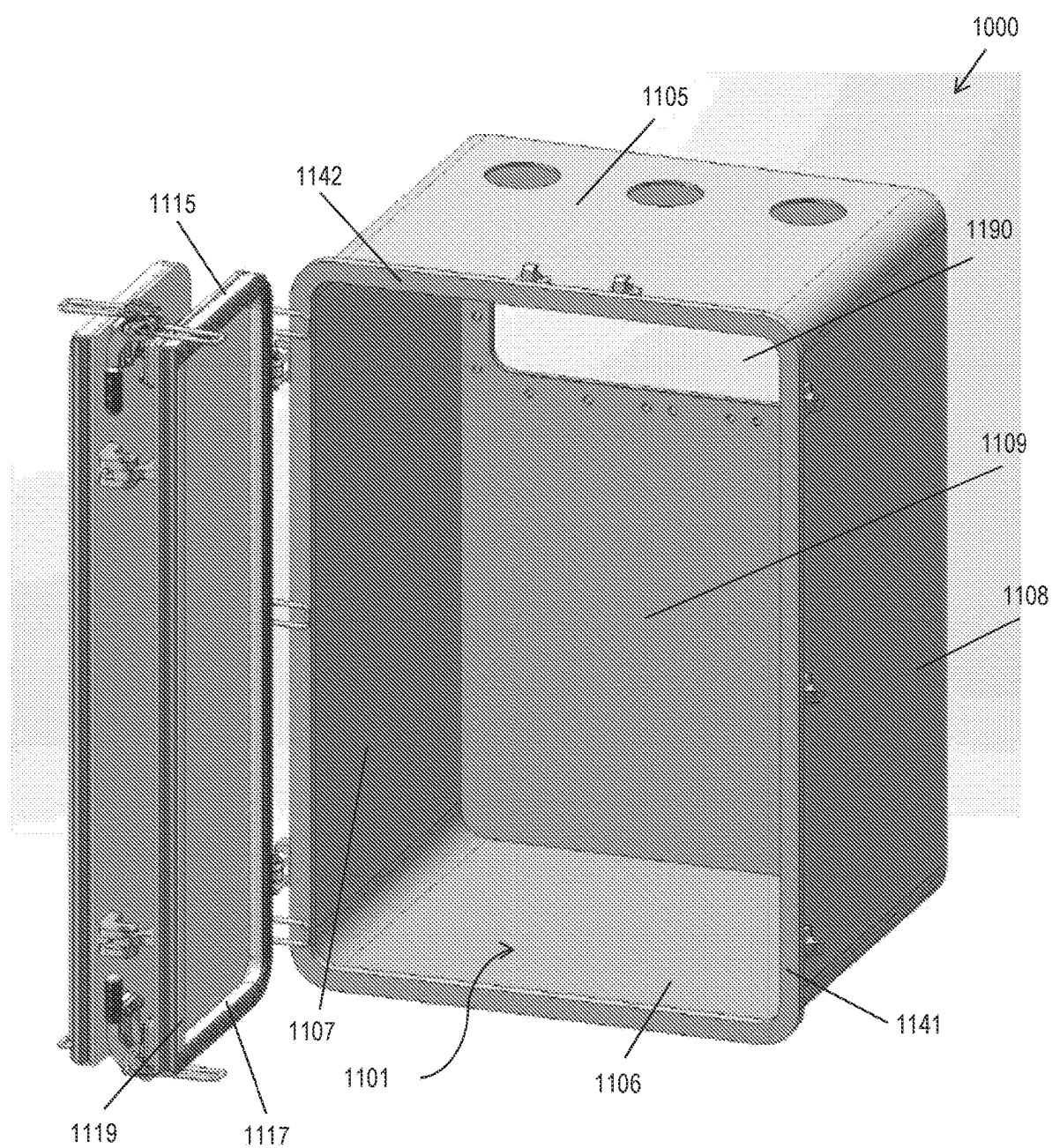
Figure 40:
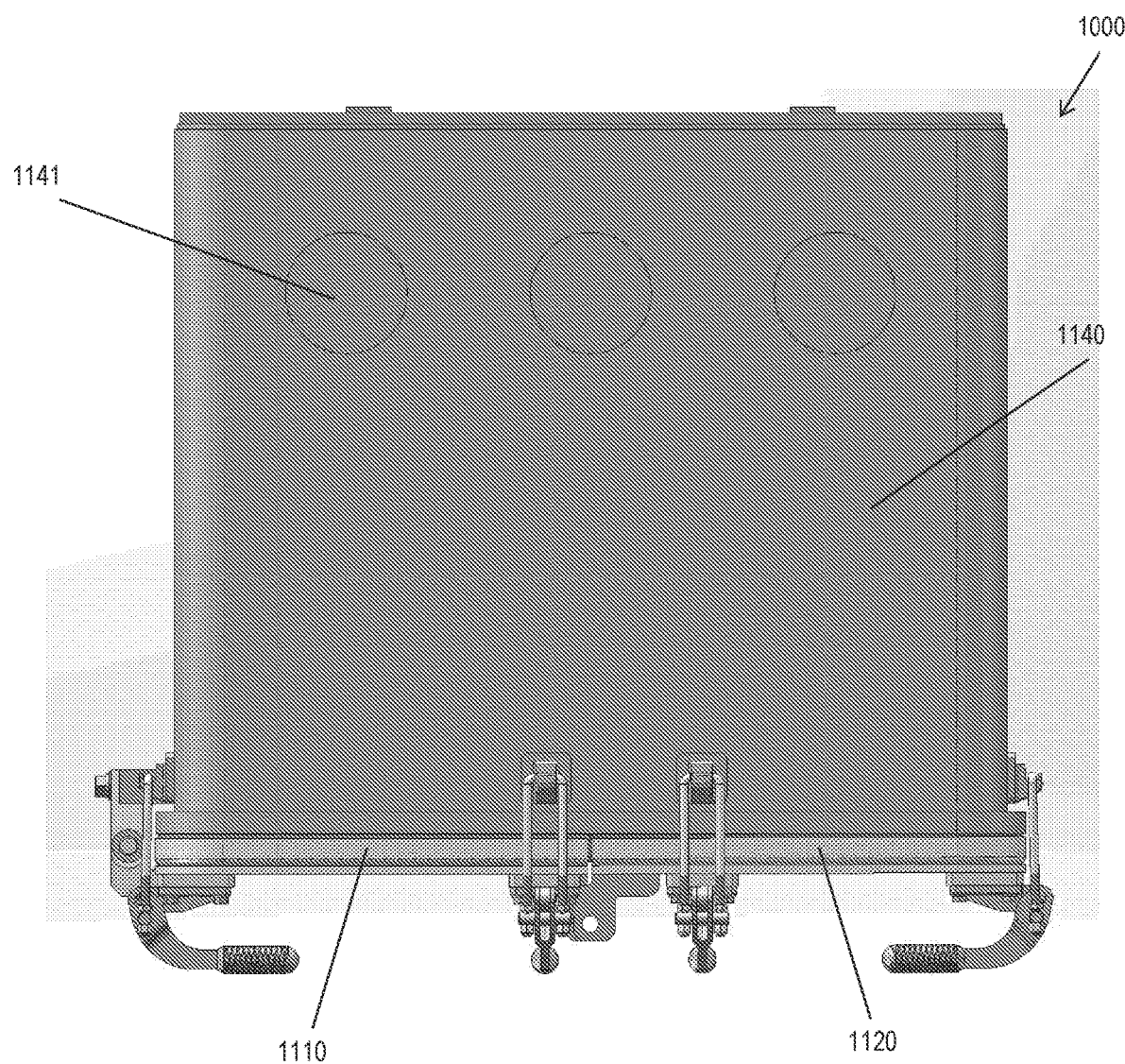
FIGS. 40 to 45 are top views of the housing of FIG. 34 corresponding to FIGS. 34 to 39, respectively, showing the split doors moving from the closed to the open position.
Figure 41:
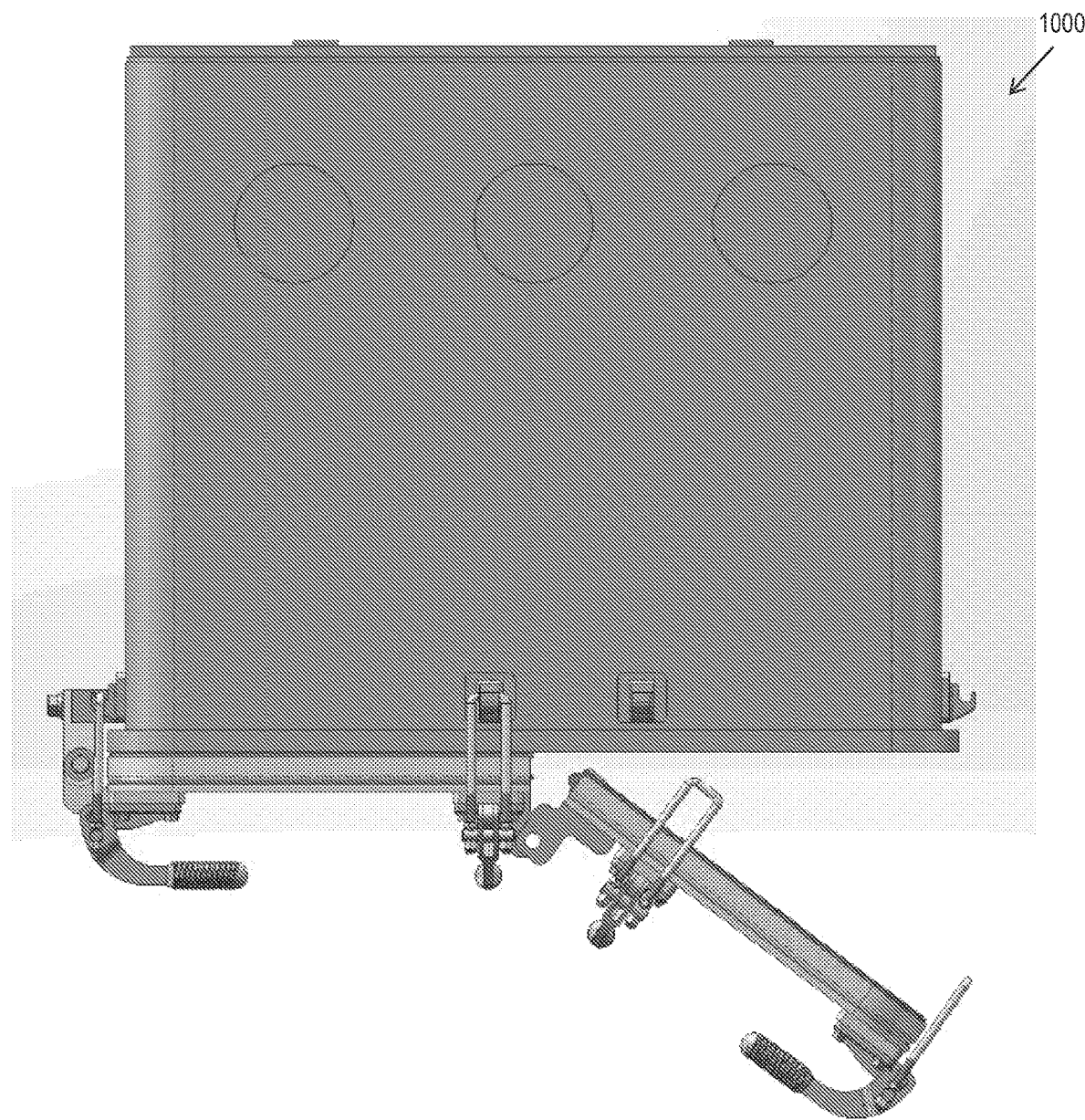
Figure 42:
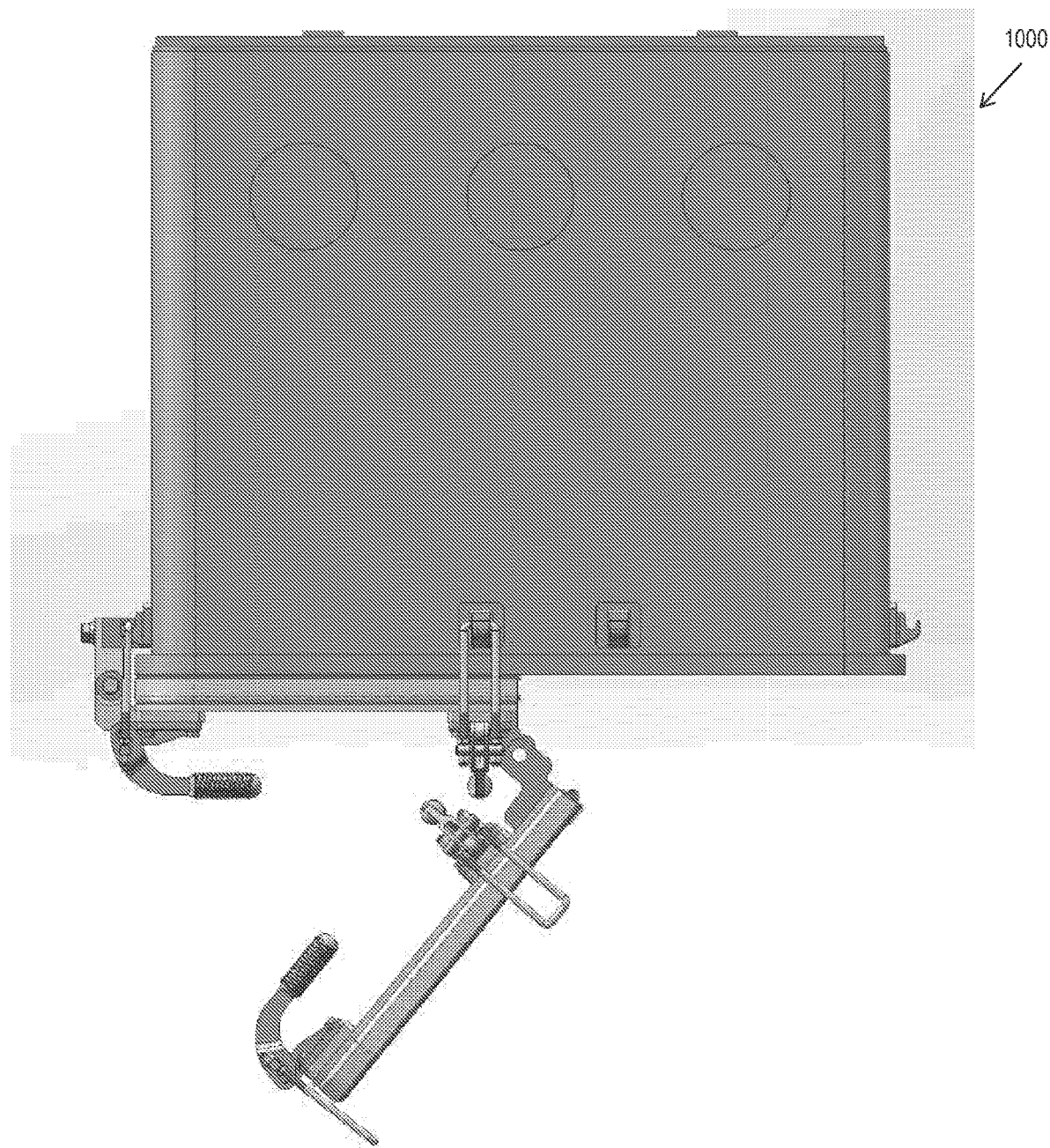
Figure 43:
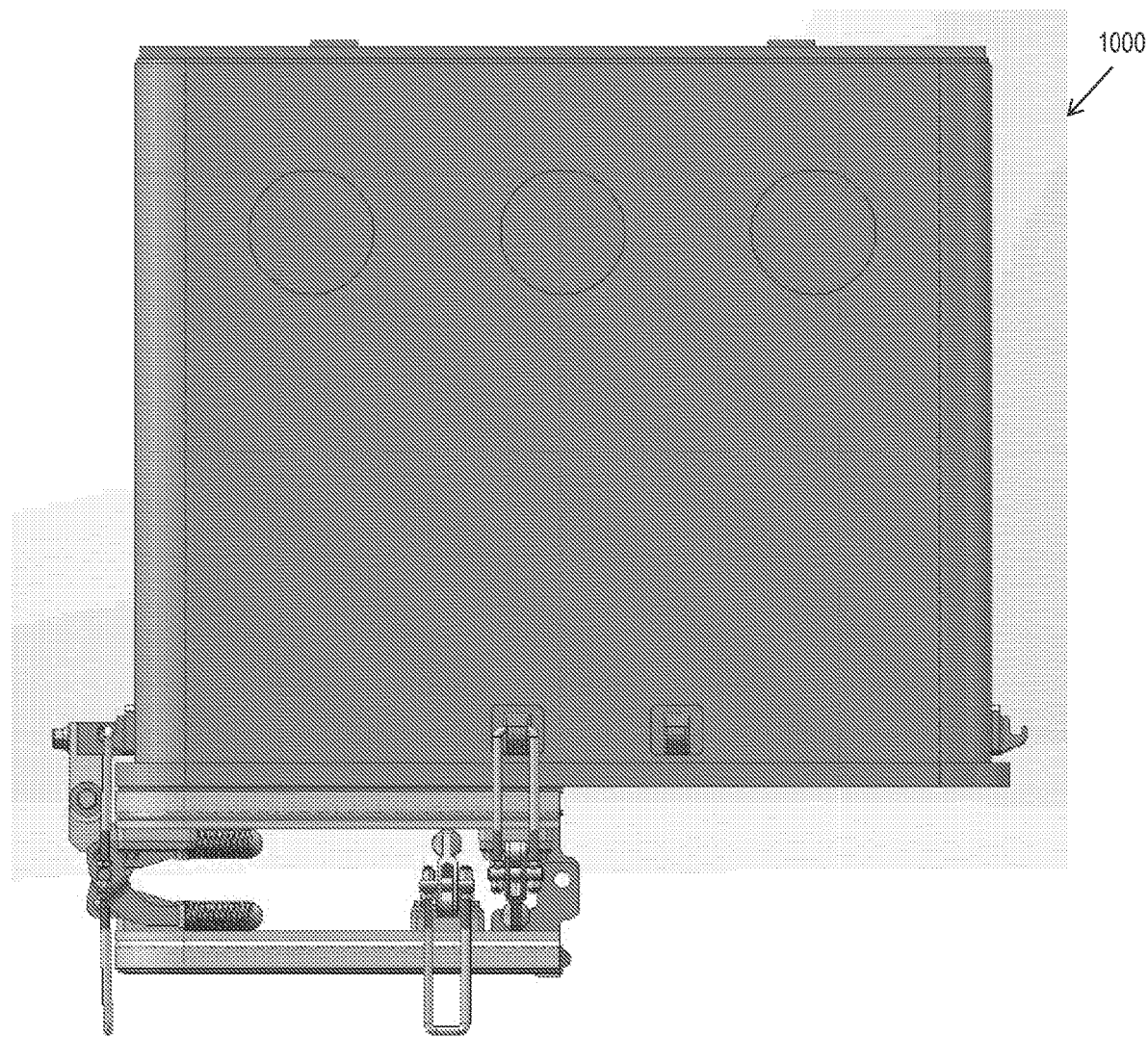
Figure 44:
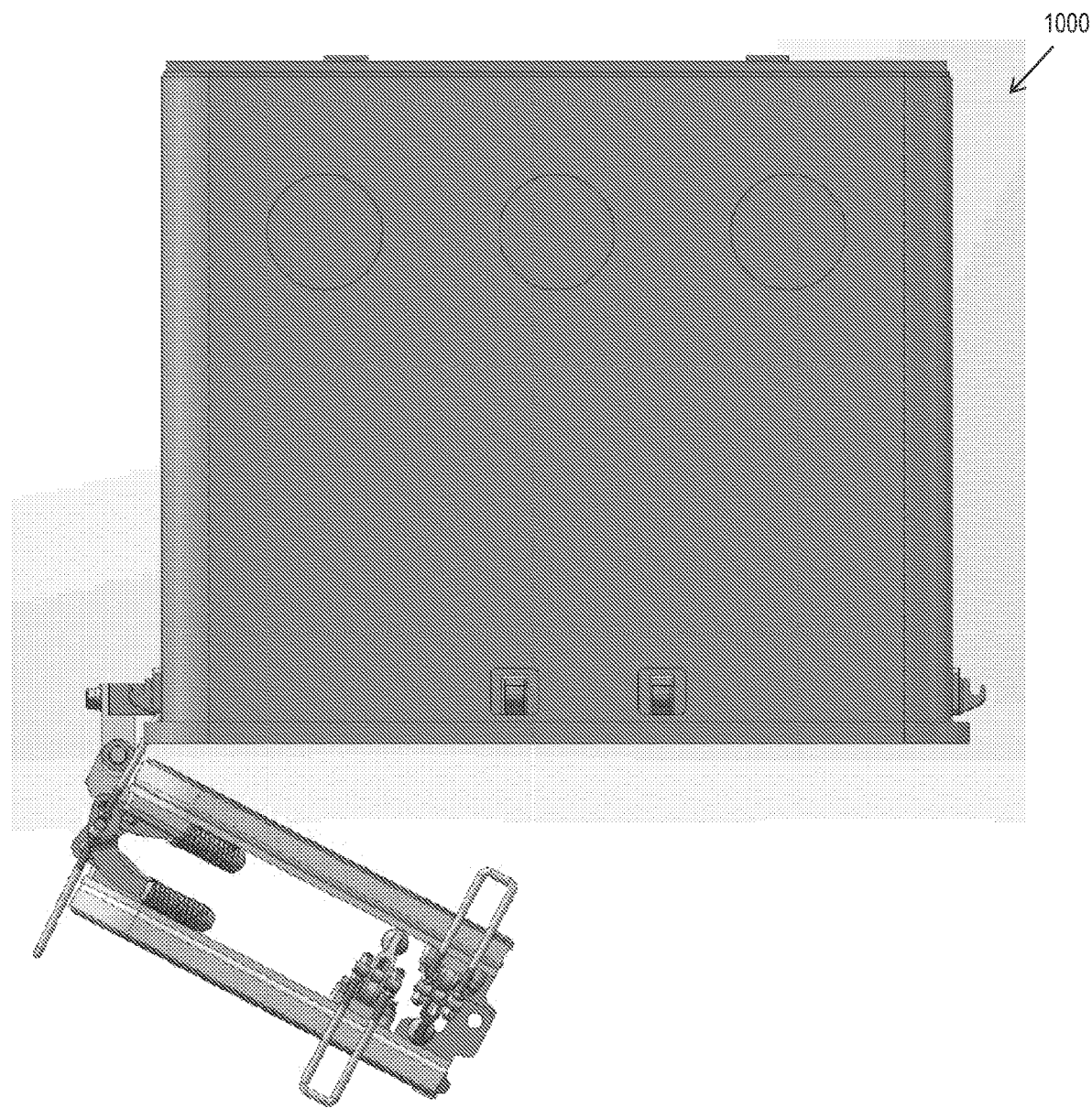
Figure 45:
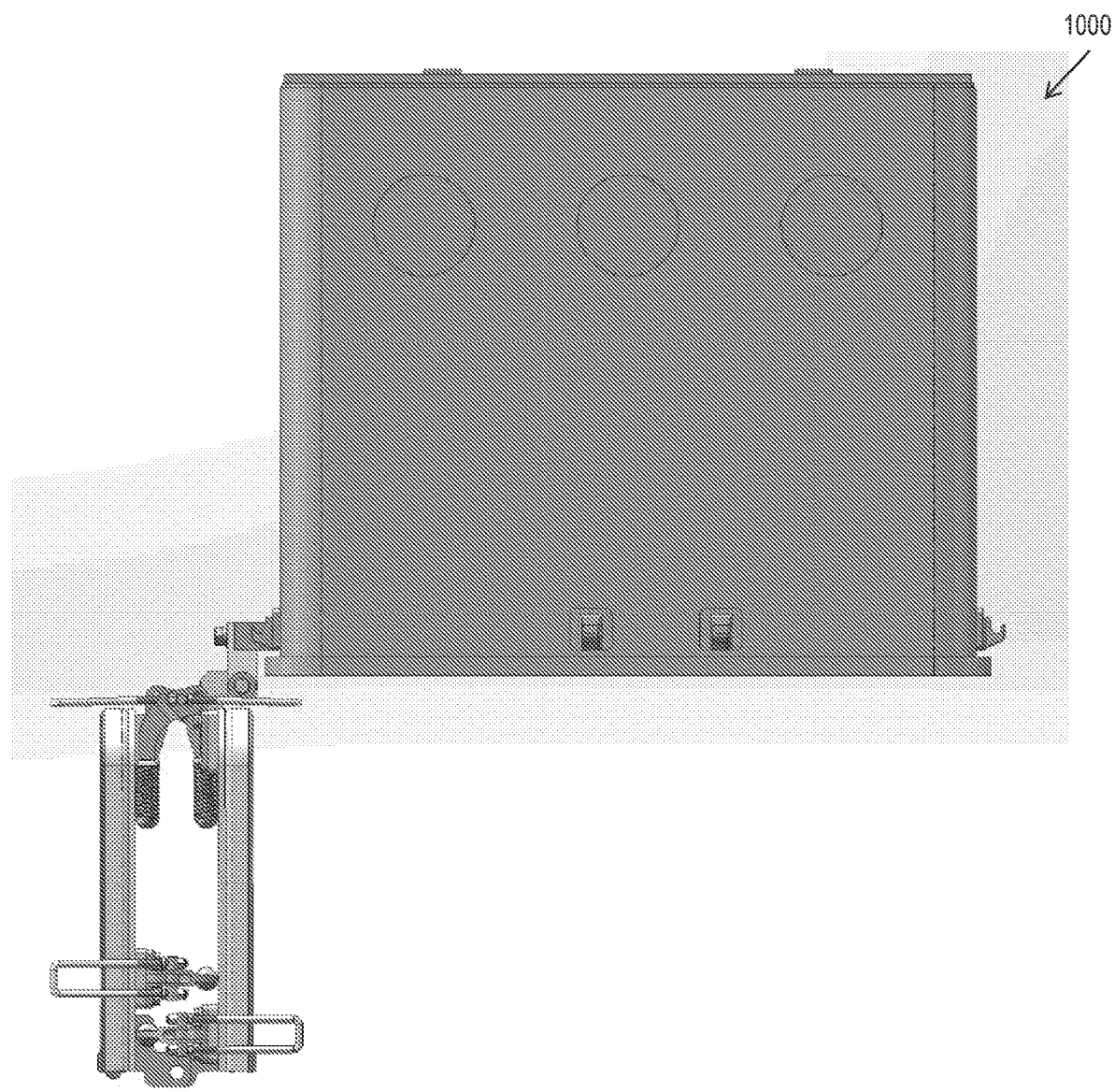
Figure 46:
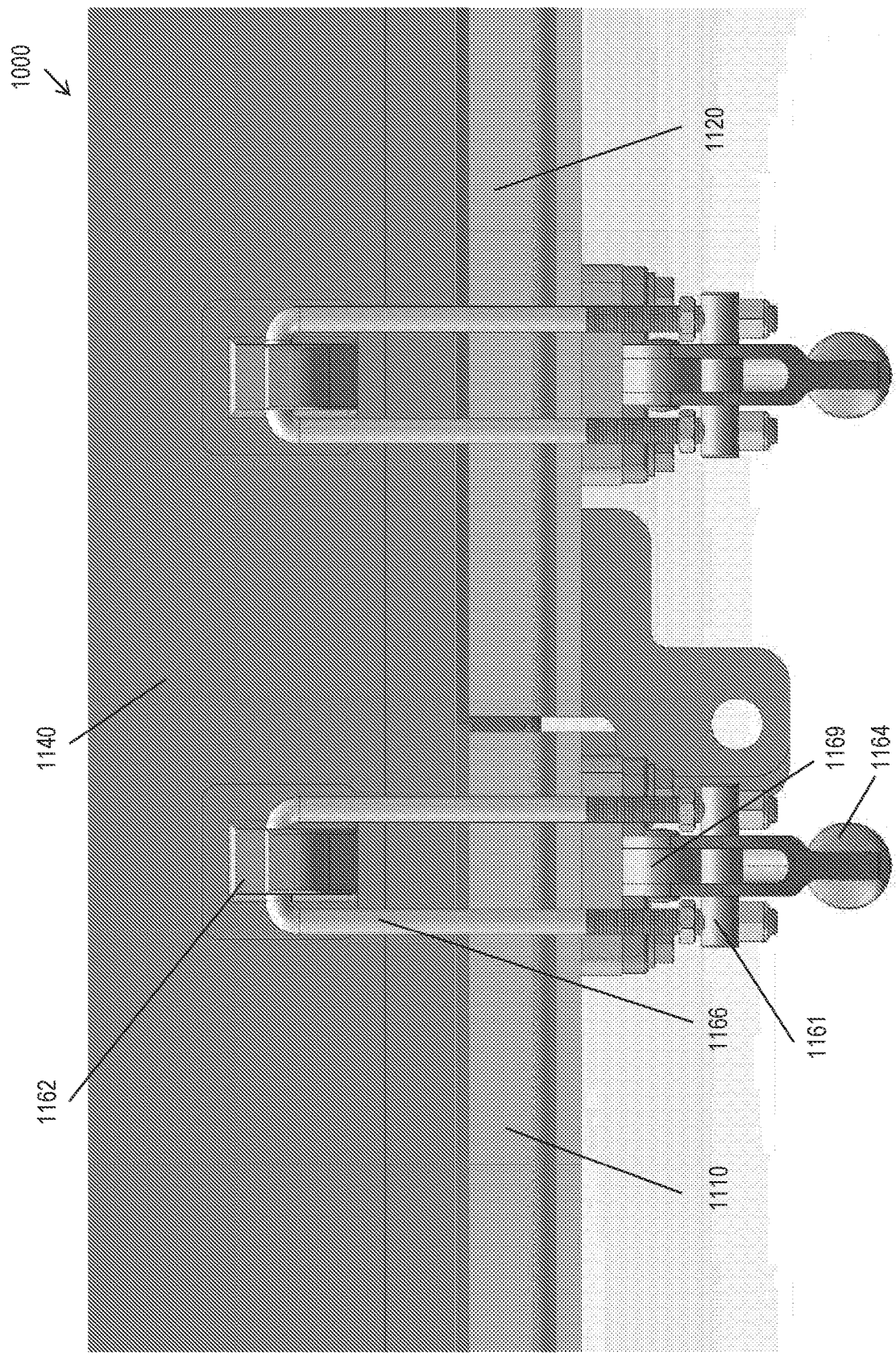
FIGS. 46 to 49 are detailed top views of the housing of FIG. 34, showing the second door moving from the closed position to a partially-open position as shown in FIGS. 35 and 41.
Figure 47:
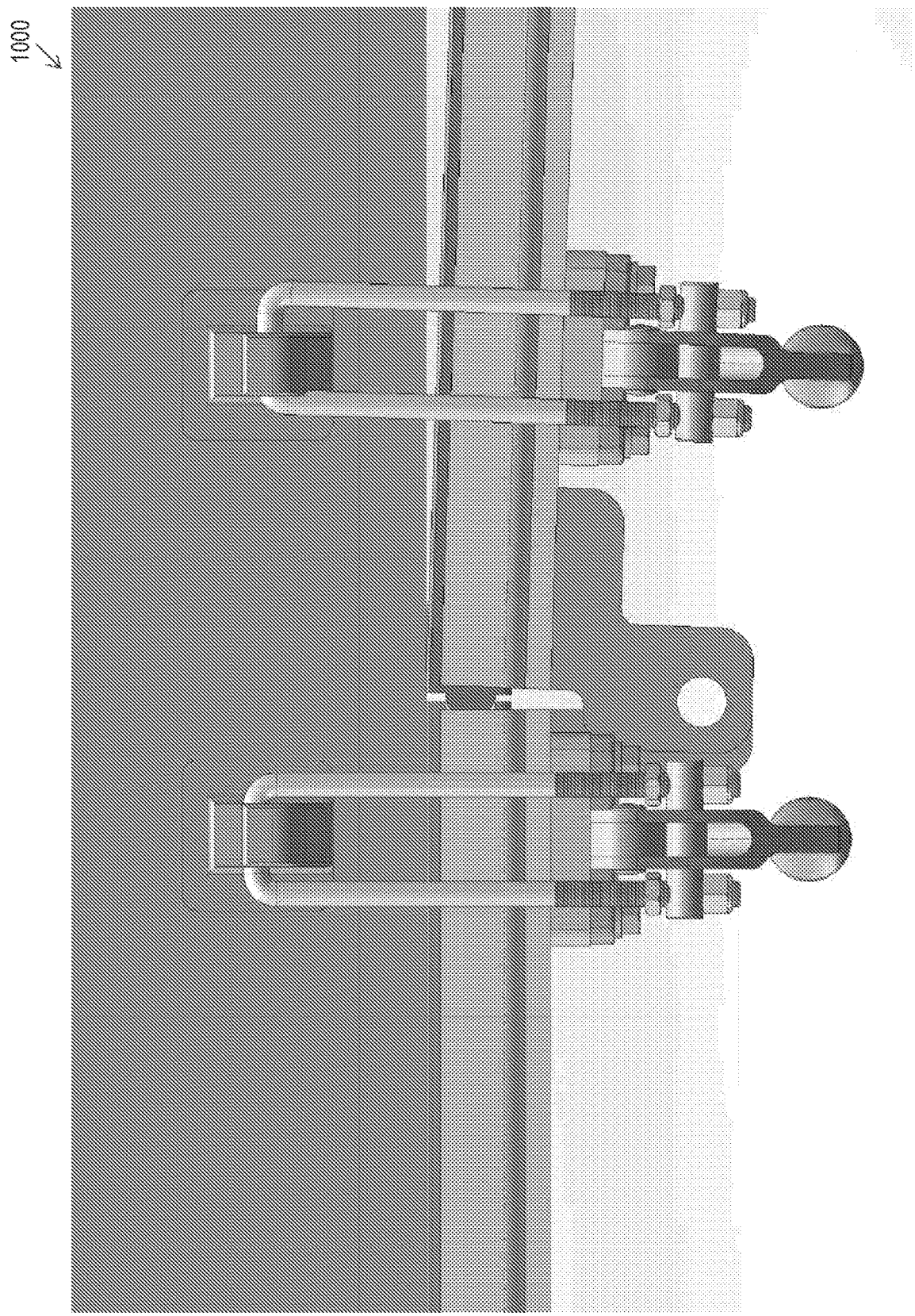
Figure 48:
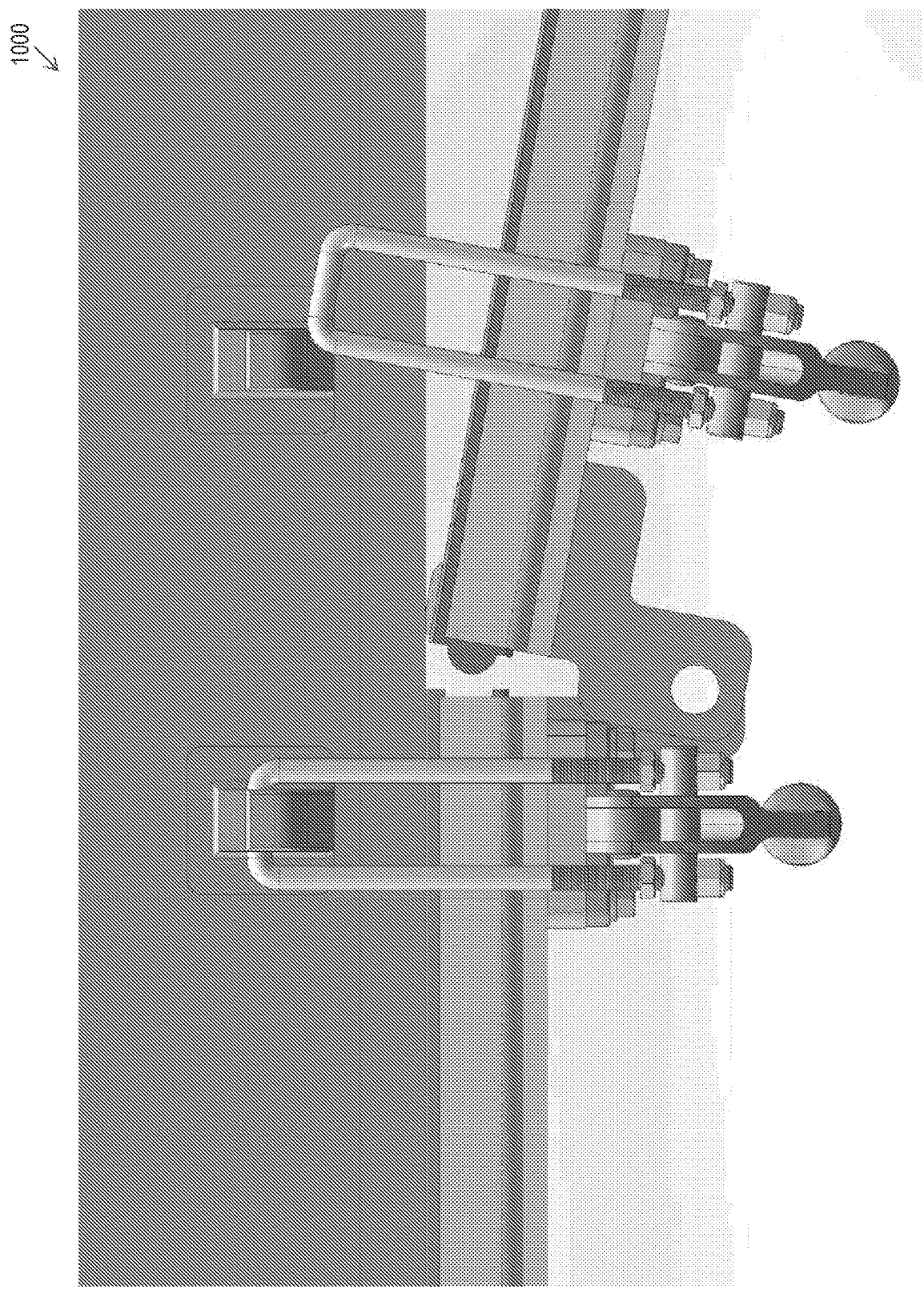
Figure 49:
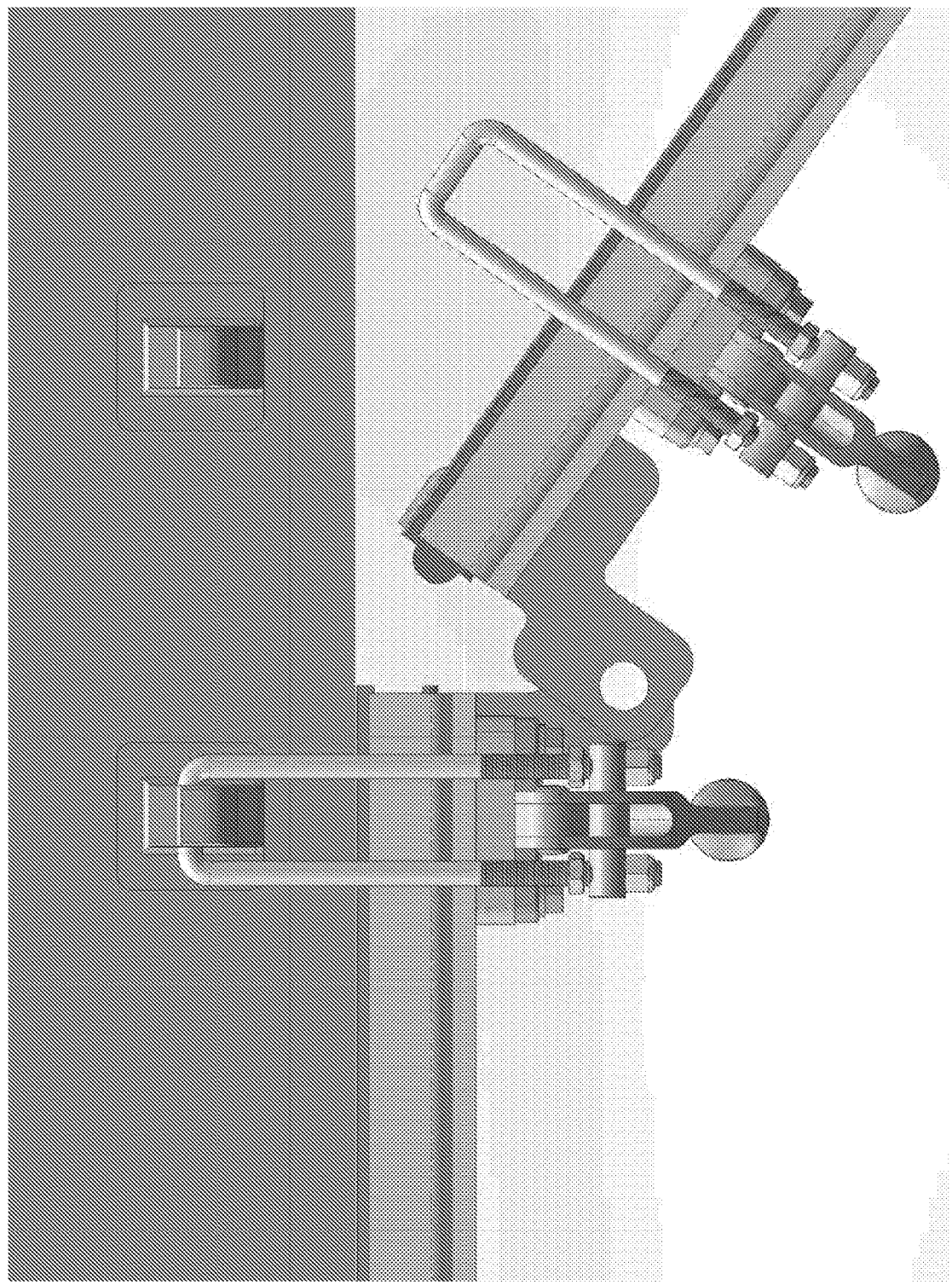
Figure 50:
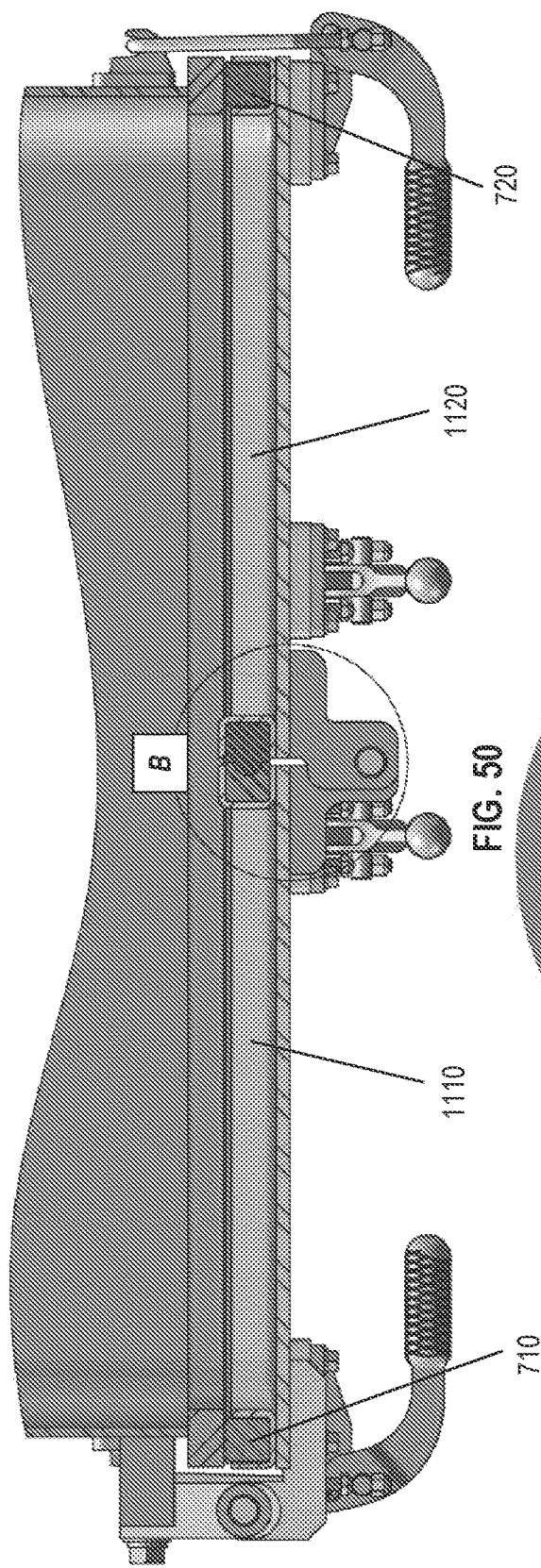
FIG. 50 is a sectional view showing a sixth embodiment gasket system for the housing of FIG. 34.
Figure 51:
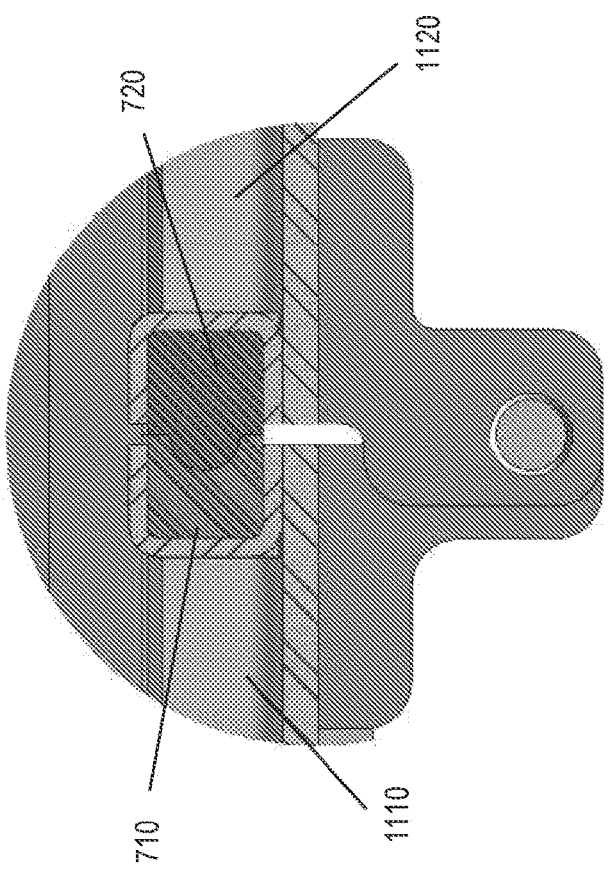
FIG. 51 is a detail view of area B of FIG. 50.
Figure 52:
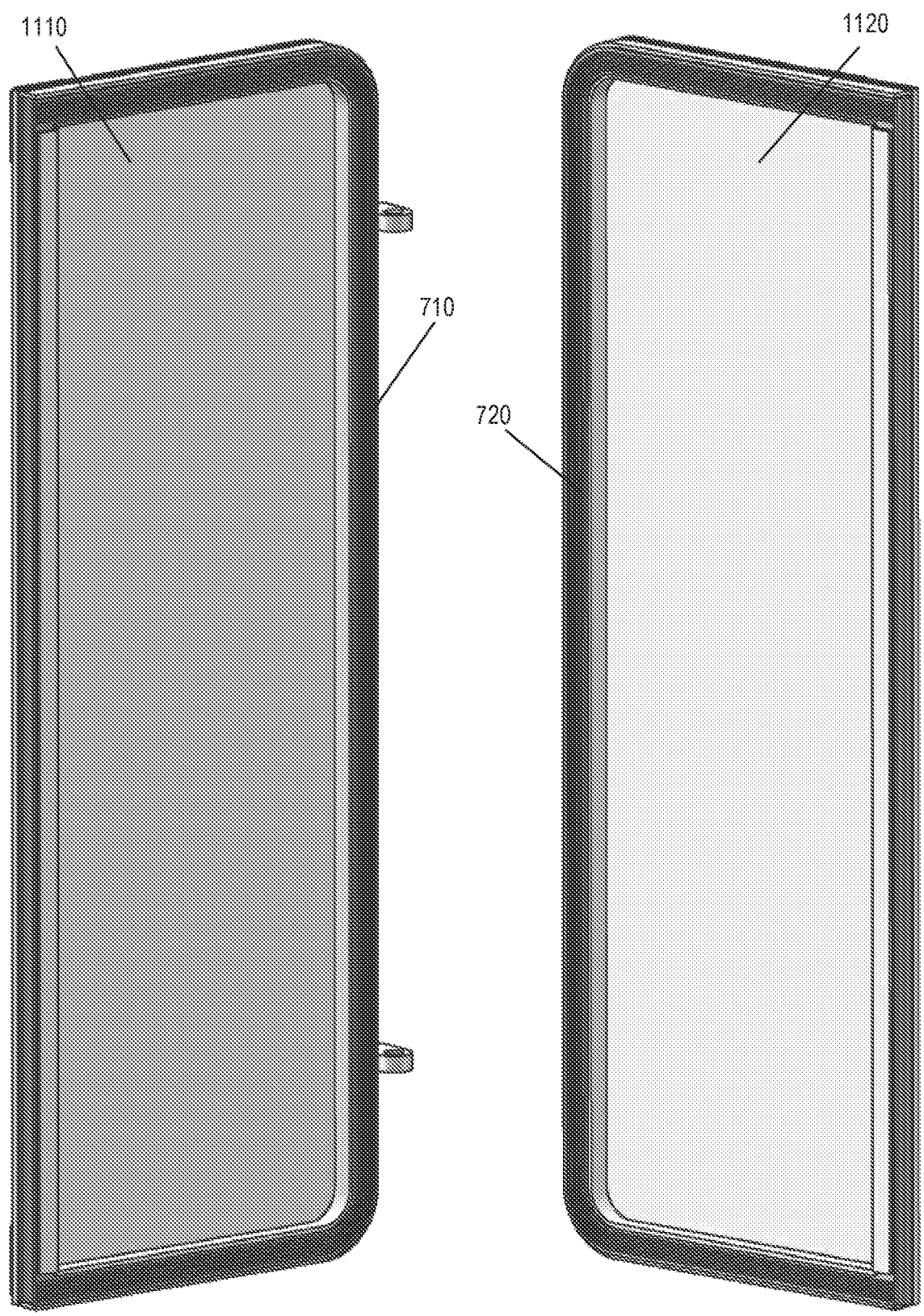
FIG. 52 is a perspective view of the insides of the first and second doors with the sixth embodiment gasket system installed thereon, showing the doors open and detached from the cabinet body.
Figure 53:
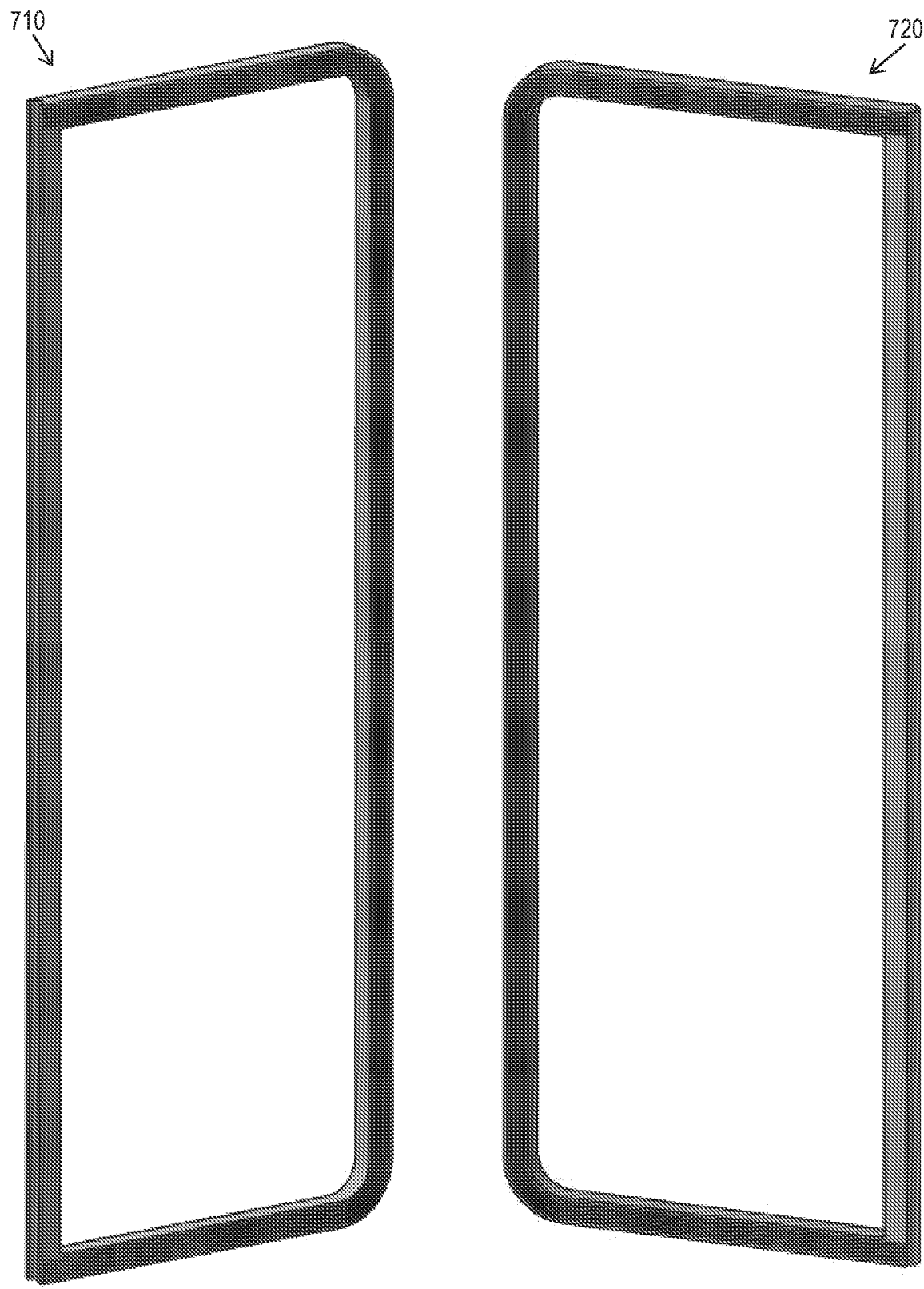
FIG. 53 is a perspective view of the sixth embodiment gasket system, without the doors.
Figure 54:
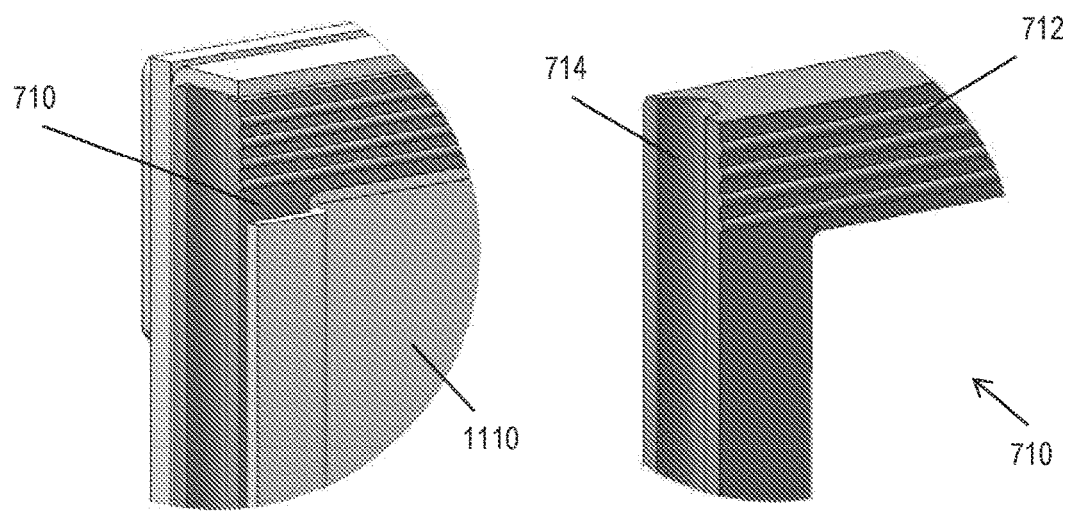
FIG. 54 is a detailed perspective view of the sixth embodiment gasket system with and without the first door, showing the upper corner distal from the hinge.
Figure 55:
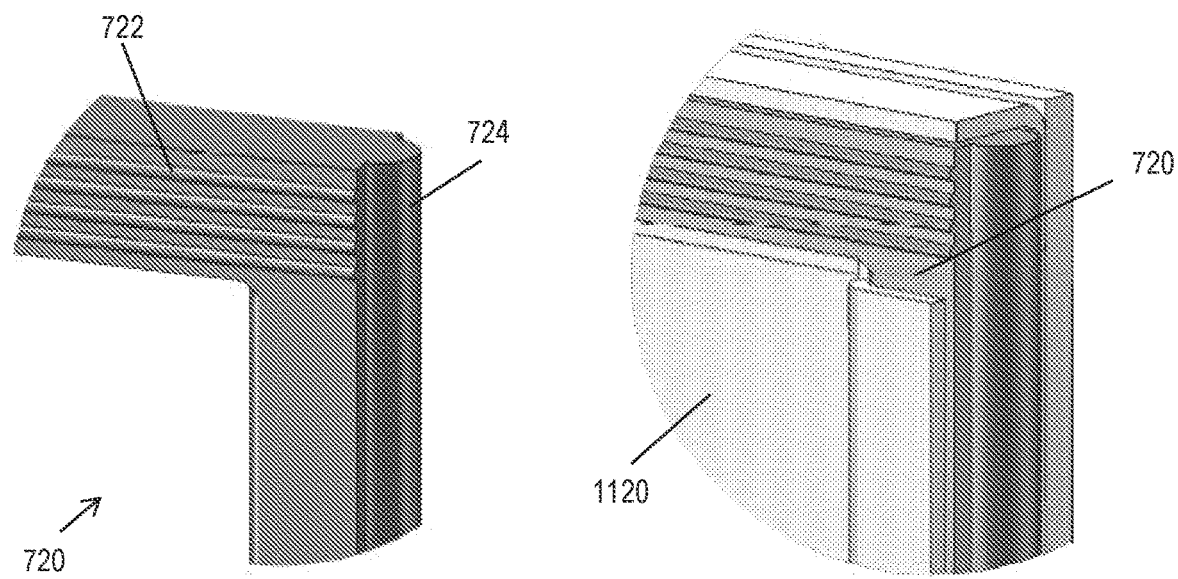
FIG. 55 is a detailed perspective view of the sixth embodiment gasket system with and without the second door, showing the upper corner distal from the hinge.

FIGS. 40-45 are top views corresponding to FIGS. 34-39, showing the split doors moving from the closed to the open position. FIGS. 46-49 are detailed top views of the housing of FIG. 34, showing the second door moving from the closed position to a partially-open position as shown in FIGS. 35 and 41.

Doors 1110, 1120 seal against each other as well as against a corresponding surface on the cabinet body, when they are locked in the closed position. Doors 1110, 1120 sealingly engage jamb surface 1142, which defines the opening for access to cabinet body 1140, when doors 1110, 1120 are swung shut on hinges 1131, 1133 to provide a water-tight seal between the doors 1110, 1120 and the cabinet body 1140. Doors 1110, 1120 also sealingly engage with each other along their distal edge surfaces (where doors 1110, 1120 meet) to provide a water-tight seal therebetween. A gasket system seals doors 1110, 1120 against each other and against the cabinet body 1140. The gasket system comprises a first gasket on the first door and a second gasket on the second door. Each gasket is held in place on the respective door, for example, by press-fitting the gasket between an outer rim 1115 and an inner rim 1117 running in parallel (e.g., about 1¼ inches apart) along the top, proximal (hinged) side, and bottom edges of the door. A lip 1119 may be provided along the inner distal side of either or both doors to hold a distal side portion of the gasket system in place (if present). The gasket system can be made from an elastomeric rubber material, such as, but not limited to, a nitrile material with some oil resistance such as acrylonitrile-butadiene rubber, or other material known in the art to be suitable for forming a water-tight seal.

As shown in FIGS. 50-55, a sixth embodiment gasket system like the first embodiment gasket system comprises a first gasket 710 on the first door and a second gasket 720 on the second door. Gaskets 710, 720 are one piece continuous gaskets extending around the inside perimeters of doors 1110, 1120. Raised ridges 712, 722 or other textured surface may be provided on the portions of gaskets 710, 720 that interface with jamb surface 1142, to facilitate or enhance the sealing engagement between doors 1110, 1120 and cabinet body 1140. First gasket 710, like gasket 210, has a rounded depression 214 along its distal edge surface that is complementary with a corresponding rounded protrusion 724 on second gasket 720, like gasket 220. In alternate embodiments, these positions may be reversed (protrusion on first gasket, depression on second gasket) and/or complementary indentions/protrusions of other shapes and/or numbers may be used.

The gasket system shown in FIGS. 50-55 and described above is merely exemplary; in other embodiments, other first and second gaskets, such as, but not limited to, those in the second through fifth embodiment gasket systems shown with housing 100, may be used with split door submersible housing 1000. Said gaskets may comprise variations in the textures, mating features, dimensions, etc. of the surfaces between the gaskets, between a gasket and the opposite door, and/or between the gaskets and the cabinet body that can also facilitate sealing doors 1110, 1120 against each other and against the cabinet body 1140 in a water-tight manner, without departing from the spirit and scope of the present invention.

Figure 56:
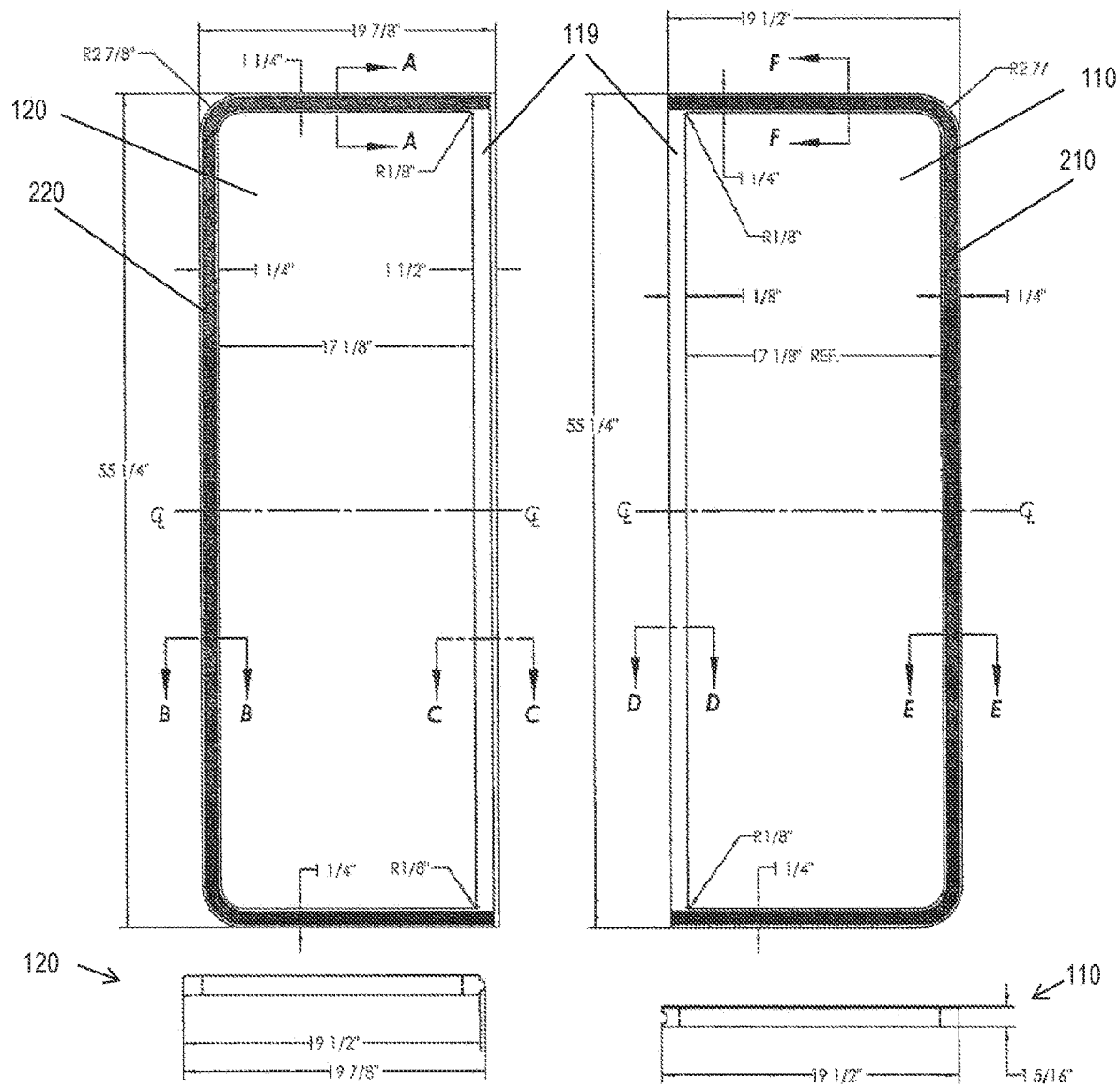
FIG. 56 shows plain views of the insides of the first and second doors with the first embodiment gasket system installed thereon, with the doors detached from the cabinet body and the hinges, and corresponding sectional views below, taken along the broken lines marked CL.

FIG. 56 shows plain views of the interior surfaces of the split doors with the first embodiment gasket system, with the doors detached from the cabinet body. Exemplary dimensions (in inches) are marked thereon. Doors 110, 120 are each about 19½ inches wide and 55¼ inches tall. The distance between outer rim 115 and inner rim 117 (where the gasket is installed) is about 1¼ inches. Lip 119 is about 1⅛ inches wide. The portions of the first gasket 210 and the second gasket 220 that interface with jamb surface 142 are shaded. Sectional views are shown below each door, taken along the broken lines marked CL.

FIG. 57 shows sectional views along A-A through F-F as marked in FIG. 56. Exemplary dimensions (in inches) are marked thereon. Gaskets 210, 220 have substantially square cross-sections (e.g., about 1¼ inches square). In the exemplary embodiments shown, the material may be, for example, peroxide cured nitrile per ASTM D2000, with first gasket 210 weighing about 8.5 pounds, and second gasket 220 weighing about 9.5 pounds.

While there have been shown and described fundamental novel features of the invention as applied to the preferred and exemplary embodiments thereof, it will be understood that omissions and substitutions and changes in the form and details of the disclosed invention may be made by those skilled in the art without departing from the spirit of the invention. Moreover, as is readily apparent, numerous modifications and changes may readily occur to those skilled in the art. For example, any feature(s) in one or more embodiments may be applicable and combined with one or more other embodiments. Hence, it is not desired to limit the invention to the exact construction and operation shown and described and, accordingly, all suitable modification equivalents may be resorted to falling within the scope of the invention as claimed. It is the intention, therefore, to be limited only as indicated by the scope of the claims appended hereto.

What is claimed is:

1. A split door submersible housing for an electrical distribution system, the housing comprising:
   a cabinet body defining an interior region configured to
      accept a component of the electrical distribution system, the cabinet body including at least one opening leading to the interior region, the at least one opening configured to accept an electrode extending through the cabinet body to establish electrical connection to the component;

a first door and a second door positioned side by side and leading to the interior region of the cabinet body, at least one of the first door and the second door being pivotably connected to a side of the cabinet body;

a gasket system comprising a first gasket on the first door and a second gasket on the second door; and wherein, in response to the first and second doors being in a closed position, the gasket system is configured to seal the first door and the second door against each other and against a corresponding surface on the cabinet body such that the housing is capable of preventing ingress of water into the interior region when the housing is submersed.

2. The housing of claim 1, further comprising a locking mechanism to lock the first and second doors in the closed position.

3. The housing of claim 2, wherein the locking mechanism comprises a plurality of quick-release latching mechanisms disposed between the first door and the cabinet body and disposed between the second door and the cabinet body.

4. The housing of claim 2, wherein the locking mechanism comprises at least one quick-release latching mechanism disposed between the first door and the second door.

5. The housing of claim 1, wherein an exterior surface of the cabinet body comprises a plurality of radiating fins.

6. The housing of claim 5, wherein an interior surface of the cabinet body comprises a plurality of fins thermally coupled to the radiating fins.

7. The housing of claim 1, wherein the component is a network protector.

8. The housing of claim 7, wherein the cabinet body includes at least three openings configured to accept at least three electrodes sealed with and electrically isolated from both the cabinet body and each other and extending through the cabinet body to establish electrical connections between corresponding terminals of the network protector and the electrical distribution network.

9. The housing of claim 1, wherein when the first and second doors are in the closed position, the housing is capable of preventing ingress of water into the interior region at a water depth of twenty-five feet.

10. The housing of claim 1, wherein the first door and the second door are pivotably and electrically connected to opposite sides of the cabinet body.

11. The housing of claim 1, wherein the first door is pivotably and electrically connected to a side of the cabinet body and the second door is pivotably and electrically connected to the first door.

12. The housing of claim 1, wherein the first gasket and the second gasket are made from a nitrile rubber.

13. The housing of claim 1, wherein the first gasket and the second gasket include raised ridges on the portions that seal against the cabinet body.

14. The housing of claim 1, wherein the first gasket and the second gasket extend around the perimeter of the first and second doors.

15. The housing of claim 1, wherein the first gasket and the second gasket extend around the perimeter of the first and second doors and have substantially flat distal edge surfaces.

16. The housing of claim 1, wherein the first gasket extends around the perimeter of the first door and has a substantially flat distal edge surface, and the second gasket is a three-sided gasket extending around the top, proximal side, and bottom of the second door and has indented upper and lower distal edges having substantially flat surfaces.

17. A split door submersible housing for an electrical distribution system, the housing comprising:

a cabinet body defining an interior region configured to accept a component of the electrical distribution system;

a first door and a second door positioned side by side and leading to the interior region of the cabinet body, at least one of the first door and the second door being pivotably connected to a side of the cabinet body;

a gasket system comprising a first gasket on the first door and a second gasket on the second door; and wherein, in response to the first and second doors being in a closed position, the gasket system is configured to seal (i) the first door against the second door, (ii) the first door against a first corresponding surface of the cabinet body, and (iii) the second door a second corresponding surface on the cabinet body so as to prevent ingress of water into the interior region when the housing is submersed.

18. The housing of claim 17, wherein the first gasket and the second gasket are made from a nitrile rubber.

19. The housing of claim 17, wherein the first gasket and the second gasket include raised ridges on the portions that seal against the cabinet body.

20. The housing of claim 17, wherein when the first and second doors with the first and second gaskets positioned thereon are in the closed position, the housing is capable of preventing ingress of water into the interior region at a water depth of twenty-five feet.

* * * * *